(12) United States Patent
Kobayashi et al.

(10) Patent No.: US 11,669,039 B2
(45) Date of Patent: Jun. 6, 2023

(54) METHOD FOR MANUFACTURING METAL FRAME OF IMAGE FORMING APPARATUS

(71) Applicant: CANON KABUSHIKI KAISHA, Tokyo (JP)

(72) Inventors: Takahiro Kobayashi, Chiba (JP); Tomoo Akaba, Ibaraki (JP); Satoshi Yamamoto, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/591,971

(22) Filed: Feb. 3, 2022

(65) Prior Publication Data

US 2022/0229392 A1     Jul. 21, 2022

Related U.S. Application Data

(63) Continuation of application No. PCT/JP2020/029116, filed on Jul. 29, 2020.

(30) Foreign Application Priority Data

Aug. 30, 2019     (JP) .............................. JP2019-158416

(51) Int. Cl.
   *G03G 21/16*     (2006.01)
(52) U.S. Cl.
   CPC ..... *G03G 21/1647* (2013.01); *G03G 21/1619* (2013.01)
(58) Field of Classification Search
   CPC ........................ G03G 21/1647; G03G 21/1619
   See application file for complete search history.

(56) References Cited

U.S. PATENT DOCUMENTS

| 10,168,658 B2 | 1/2019 | Takei |
| 10,775,733 B2 | 9/2020 | Kobayashi |

(Continued)

FOREIGN PATENT DOCUMENTS

| JP | 2000061746 A | 2/2000 |
| JP | 2001117305 A | 4/2001 |

(Continued)

OTHER PUBLICATIONS

International Search Report issued in Intl. Appln. No PCT/JP2020/029116 dated Oct. 20, 2020 English translation provided.

(Continued)

*Primary Examiner* — Sandra Brase
(74) *Attorney, Agent, or Firm* — Rossi, Kimms & McDowell LLP

(57) ABSTRACT

A method for manufacturing a metal frame of an image forming apparatus that is provided with a first support, a second support that is spaced apart from the first support and that supports an image forming unit together with the first support, and a connecting member that connects the first support and the second support, the method including: a first step of erecting the first support on a base portion, which is a first step of provisionally assembling the first support on a jig that has a base portion and a support portion erected on the base portion; a second step of achieving provisional assembly by placing the connecting member on the support portion of the jig and, through engagement between the first support and the connecting member, causing the connecting member to be supported by the first support and the support portion; a third step of engaging the connecting member and the second support; and a fixing step of fixing the first support and the connecting member and fixing the second support and the connecting member.

7 Claims, 40 Drawing Sheets

(56) References Cited

U.S. PATENT DOCUMENTS

| | | | |
|---|---|---|---|
| 10,996,614 B2 | 5/2021 | Nishiyama | |
| 2009/0218472 A1* | 9/2009 | Takemoto | G03G 21/1619 248/542 |

FOREIGN PATENT DOCUMENTS

| | | |
|---|---|---|
| JP | 2004122444 A | 4/2004 |
| JP | 2005111940 A | 4/2005 |
| JP | 2008116619 A | 5/2008 |
| JP | 2016124237 A | 7/2016 |
| WO | 2018221380 A1 | 12/2018 |
| WO | 2019009367 A1 | 1/2019 |

OTHER PUBLICATIONS

Written Opinion issued in Intl. Appln. No. PCT/JP2020/029116 dated Oct. 20, 2020.

* cited by examiner

FIG 2
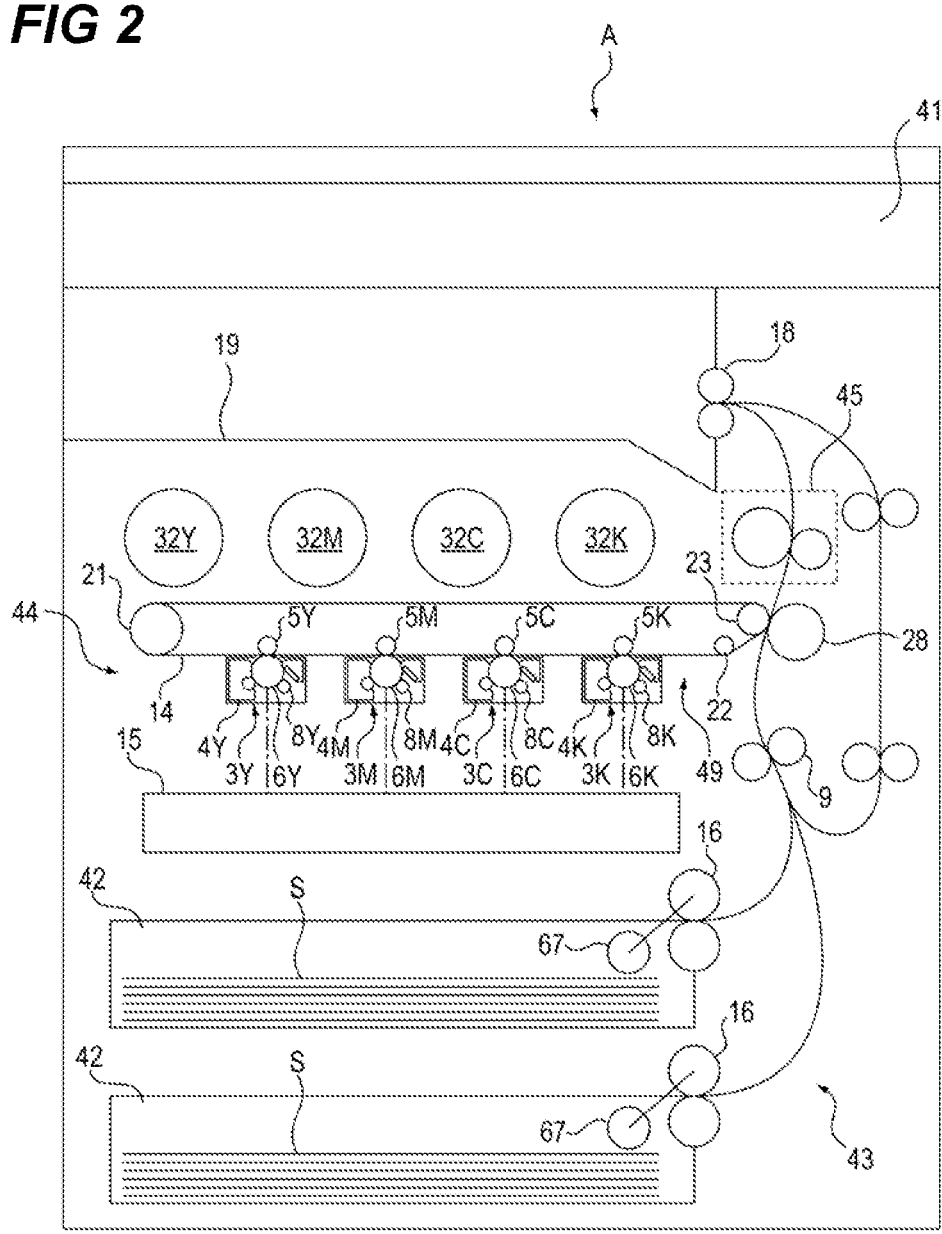
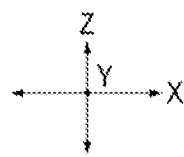

FIG 17A
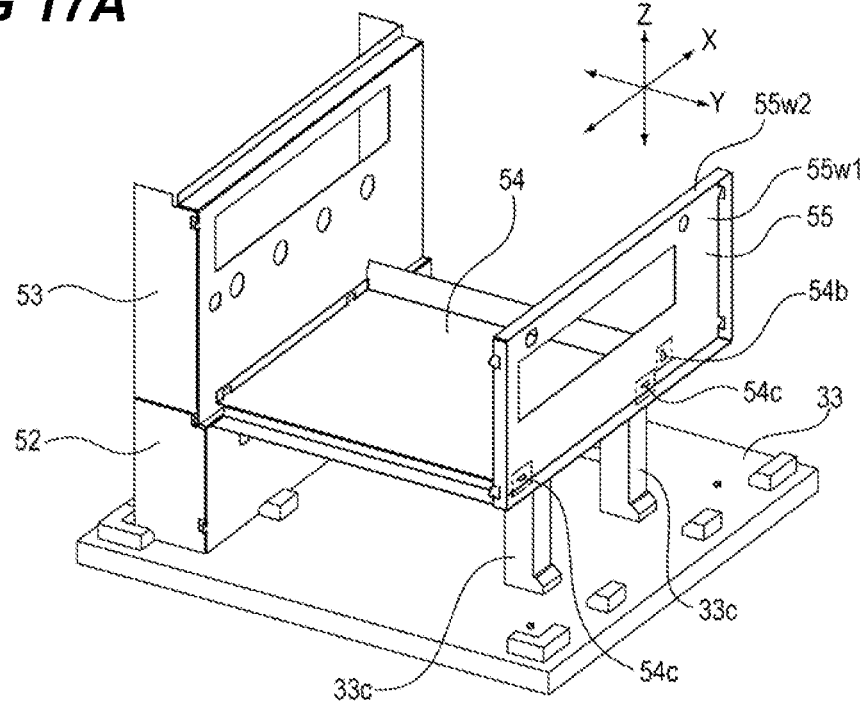
FIG 17B  FIG 17C
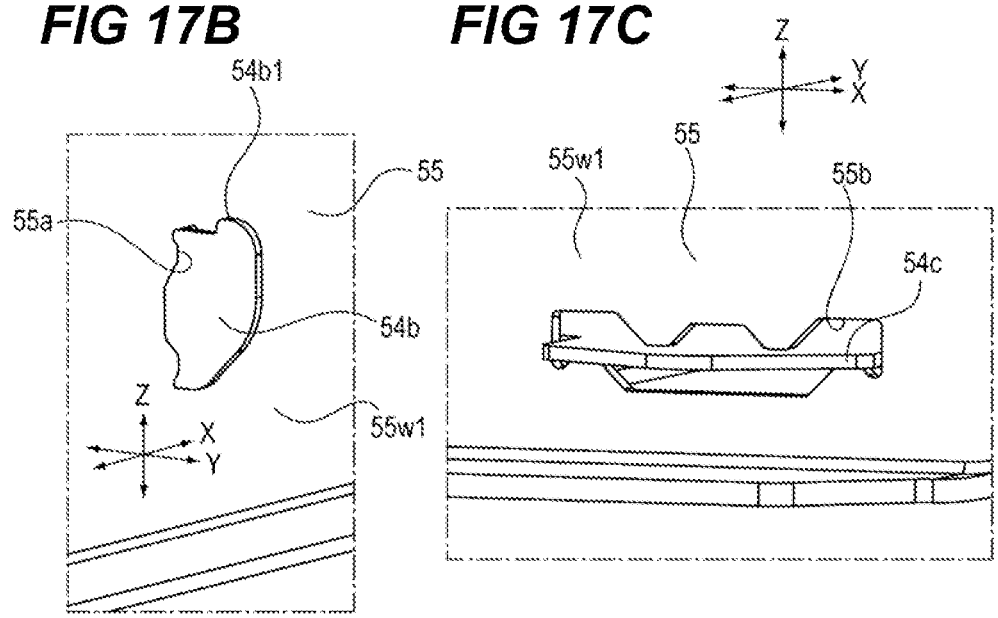

FIG 27
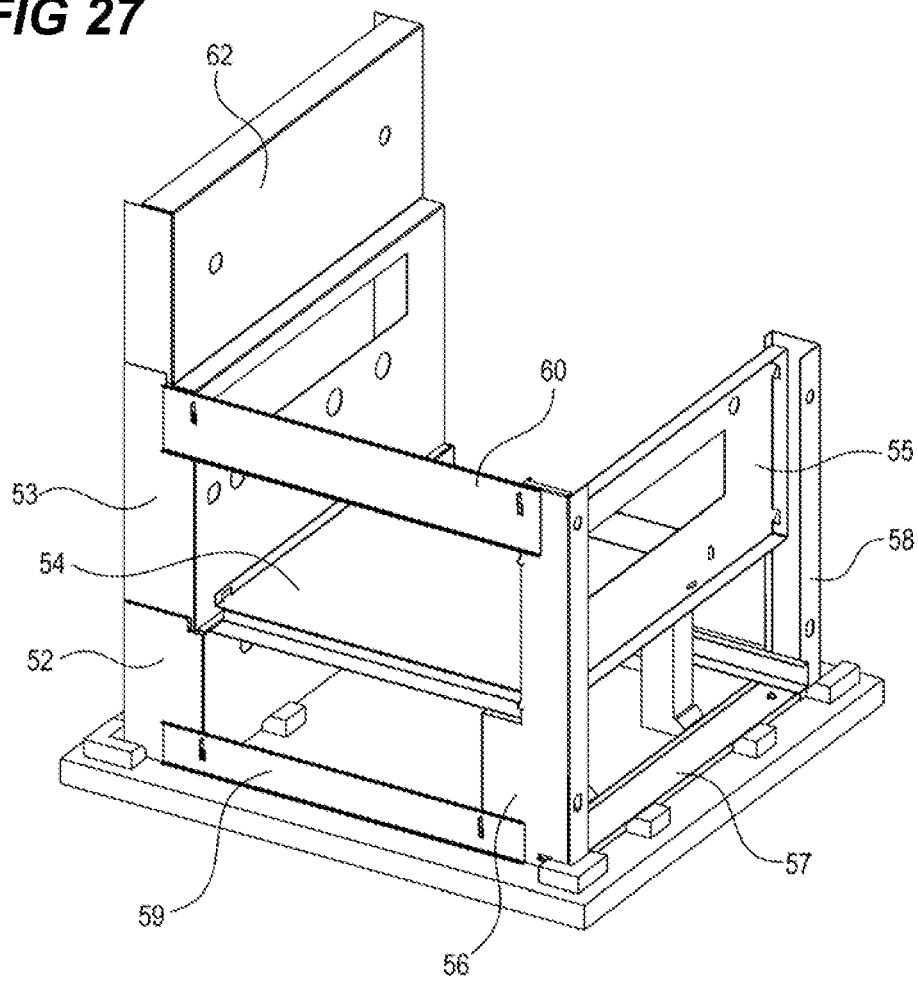
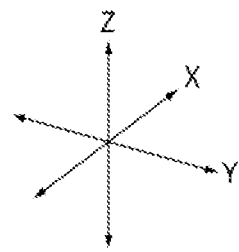

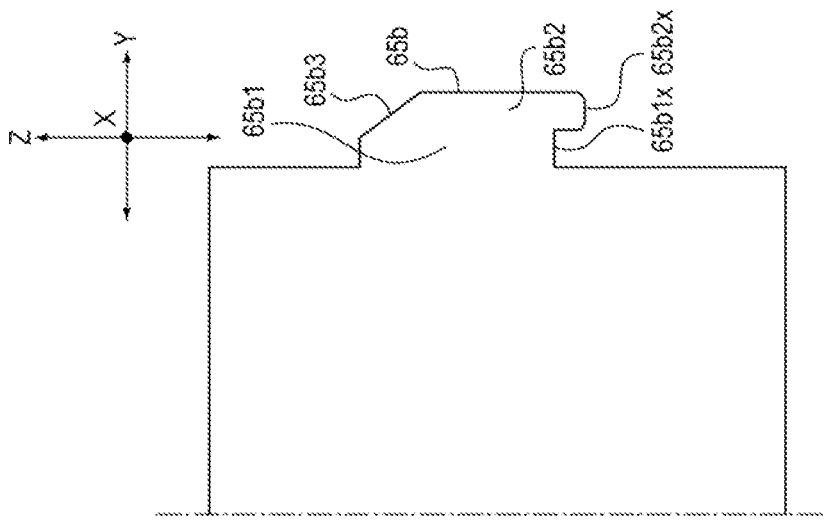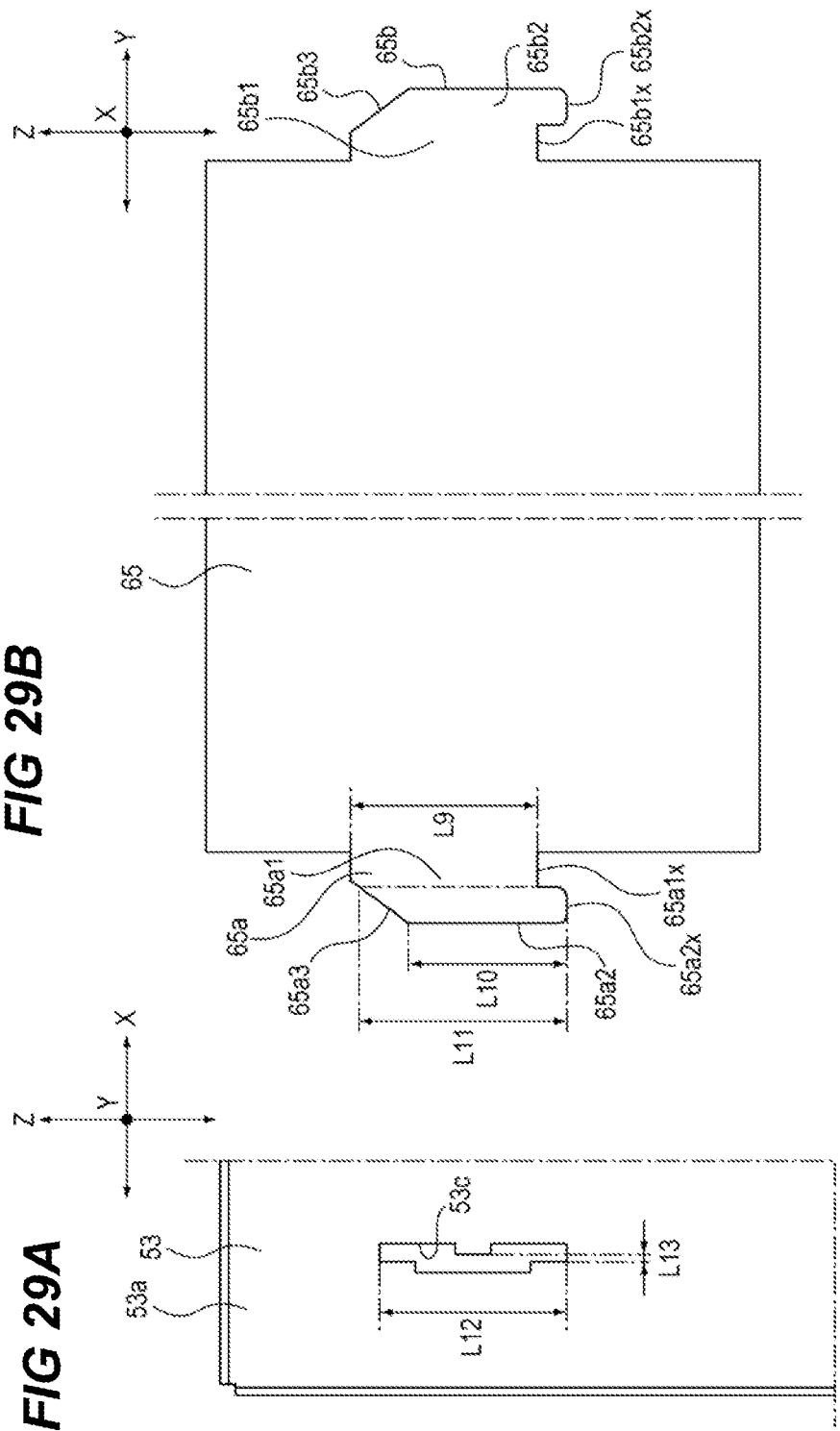

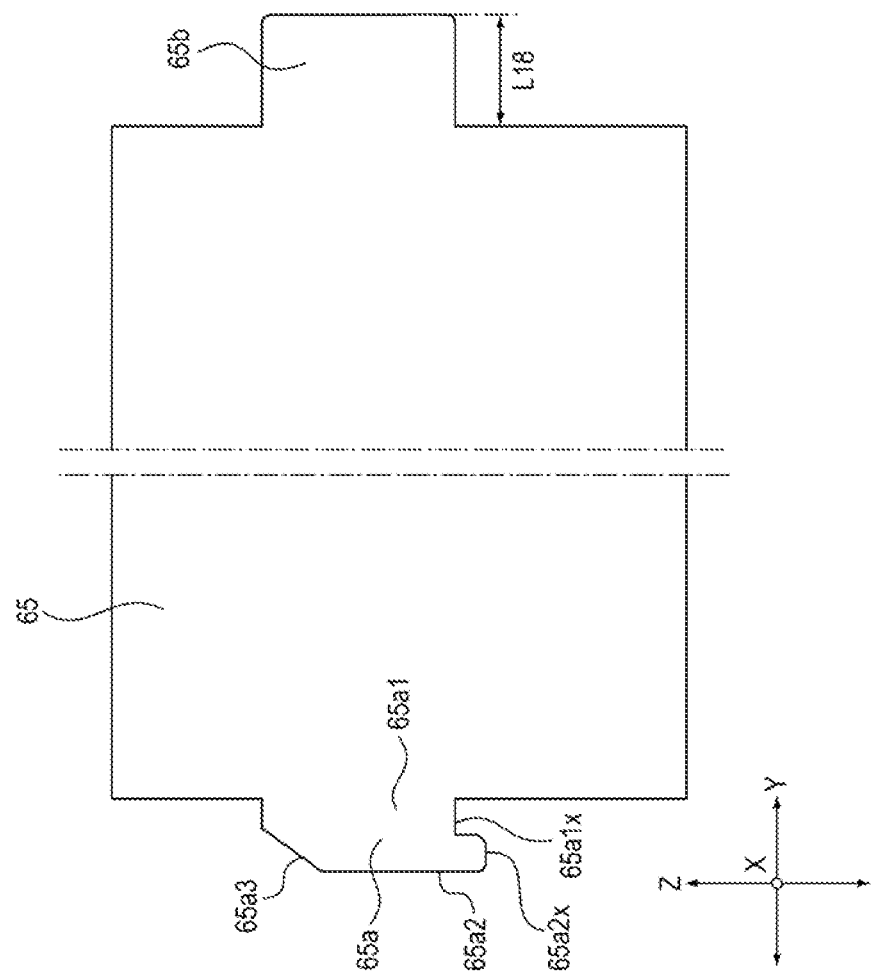

FIG 32
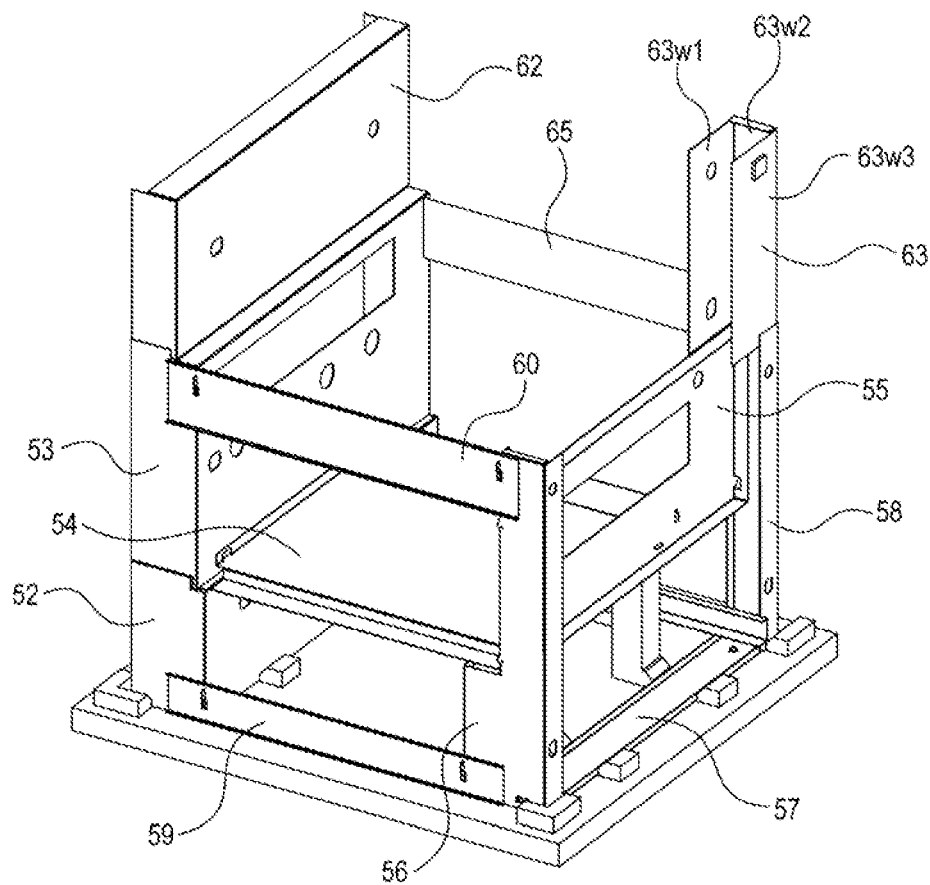
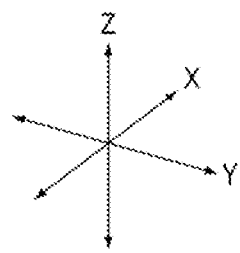

FIG 40
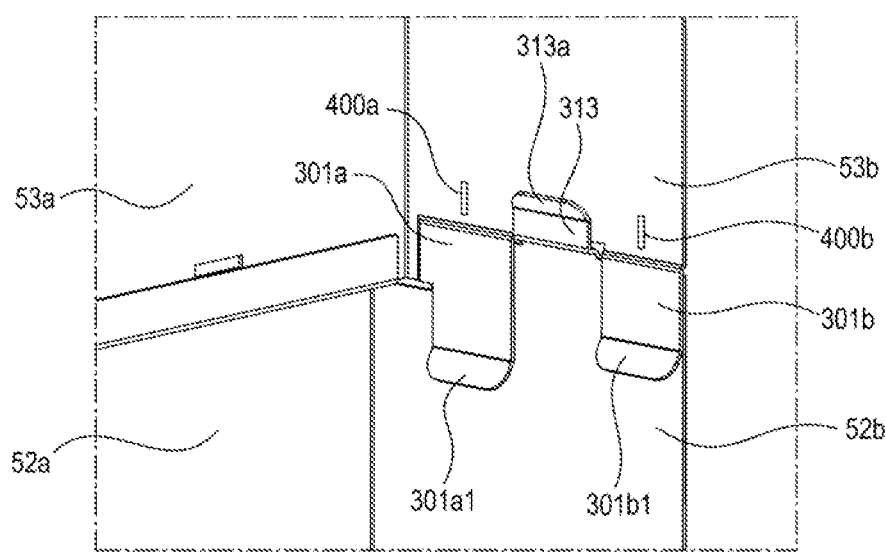
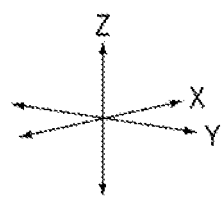

METHOD FOR MANUFACTURING METAL FRAME OF IMAGE FORMING APPARATUS

CROSS-REFERENCE TO RELATED APPLICATIONS

This application is a Continuation of International Patent Application No. PCT/JP2020/029116, filed Jul. 29, 2020, which claims the benefit of Japanese Patent Application No. 2019-158416, filed Aug. 30, 2019, both of which are hereby incorporated by reference herein in their entirety.

BACKGROUND OF THE INVENTION

Field of the Invention

The present invention relates to a method for manufacturing a metal frame of an image forming apparatus such as an electrophotographic copying machine or an electrophotographic printer (for example, a laser beam printer or an LED printer, or the like).

Description of the Related Art

The frame of an image forming apparatus is generally formed by welding or screwing together a plurality of metal plates such as a front side plate, a rear side plate, and stays connecting the front side plate and rear side plates, as disclosed in Japanese Patent Laid-Open No. 2008-116619. When joining the frame of an image forming apparatus, in order to guarantee the positional accuracy of each metal plate, a method in which each metal plate is held one at a time by a jig, and each metal plate is positioned before joining, is known.

However, the method of joining the metal plates while using a jig to hold each metal plate one at a time has not proved to be efficient in terms of both cost and workability due to the increase in the number of jigs used.

SUMMARY OF THE INVENTION

An object of the present invention is to provide a method for manufacturing a metal frame of an image forming apparatus that enables a reduction in the jigs used when forming a frame.

A representative configuration of a method for manufacturing a metal frame of an image forming apparatus according to the present invention, which was conceived to achieve the foregoing object, is a method for manufacturing a metal frame of an image forming apparatus that is provided with a first support, a second support that is spaced apart from the first support and that supports an image forming unit together with the first support, and a connecting member that connects the first support and the second support, the method including: a first step of erecting the first support on a base portion, which is a first step of provisionally assembling the first support on a jig that has the base portion and a support portion erected on the base portion; a second step of achieving provisional assembly by placing the connecting member on the support portion of the jig and, through engagement between the first support and the connecting member, causing the connecting member to be supported by the first support and the support portion; a third step of engaging the connecting member and the second support; and a fixing step of fixing the first support and the connecting member and fixing the second support and the connecting member.

Further features of the present invention will become apparent from the following description of exemplary embodiments with reference to the attached drawings.

BRIEF DESCRIPTION OF THE DRAWINGS

FIG. 2 is a cross-sectional schematic diagram of the image forming apparatus.

FIG. 17A, FIG. 17B and FIG. 17C are perspective views of when a front side plate is assembled.

FIG. 27 is a perspective view of when the rear side plate is assembled.

FIG. 29A is an enlarged view of the engagement of the center right stay and FIG. 29B is an enlarged view of the engagement thereof from the center right stay.

FIG. 31A and FIG. 31B are diagrams illustrating another configuration of the center right stay.

FIG. 32 is a perspective view of when the right column is assembled.

FIG. 40 is a perspective view of another configuration of the bends of the rear side plate.

DESCRIPTION OF THE EMBODIMENTS

First Embodiment

<Image Forming Apparatus>

The overall configuration of an image forming apparatus according to a first embodiment of the present invention will first be described hereinbelow with reference to the drawings, together with the operation during image formation. Note that the dimensions, material properties, shapes, and relative arrangement, and the like, of the constituent components described hereinbelow do not, unless otherwise specified, limit the scope of the invention thereto.

An image forming apparatus A according to the present embodiment is an intermediate tandem-type image forming apparatus that forms an image by transferring toner in four colors, namely, yellow (Y), magenta (M), cyan (C), and black (K) to an intermediate transfer belt and then transferring an image to a sheet. Note that, in the following description, although Y, M, C, and K are assigned as subscripts to members using the toners of each of the foregoing colors, the configurations and operations of each member are substantially the same except for the fact that the colors of the toners being used are different, and hence the subscripts are suitably omitted except in cases where differentiation is required.

Figure 1:
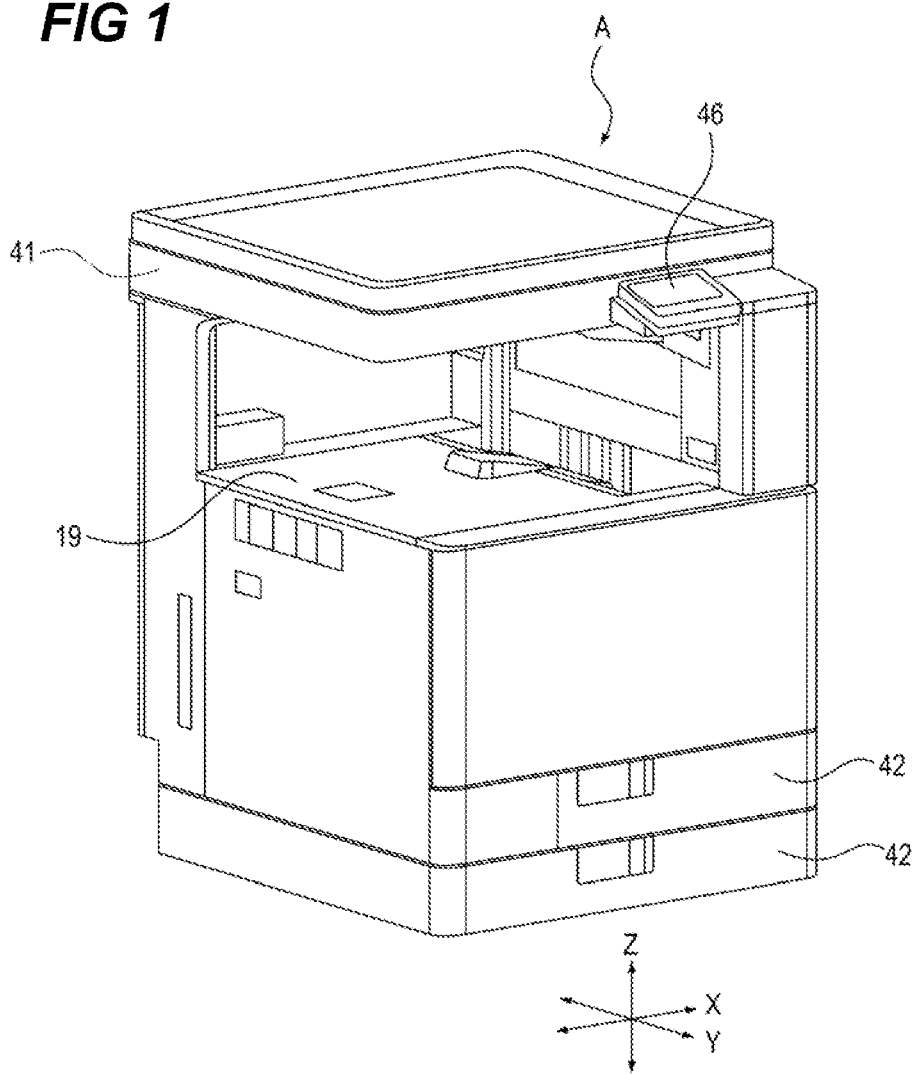
FIG. 1 is a perspective schematic diagram of an image forming apparatus.

FIG. 1 is a perspective schematic diagram of the image forming apparatus A. FIG. 2 is a cross-sectional schematic diagram of the image forming apparatus A. As illustrated in FIG. 1 and FIG. 2, the image forming apparatus A is provided with an image forming portion 44 that forms a toner image and transfers the image to a sheet, a sheet feeding portion 43 that supplies the sheet to the image forming portion 44, and a fixing portion 45 that fixes the toner image to the sheet. An image reading portion 41 that reads manuscript images is also provided at the top of the image forming apparatus A.

The image forming portion 44 is provided with process cartridges 3 (3Y, 3M, 3C, and 3K), a laser scanner unit 15, and an intermediate transfer unit 49. The process cartridges 3, which are an example of image forming units, are configured to be detachably attachable to the image forming apparatus A. The process cartridges 3 are provided with photosensitive drums 6 (6Y, 6M, 6C, and 6K) constituting photoreceptors that support toner images, charging rollers 8 (8Y, 8M, 8C, and 8K), and development devices 4 (4Y, 4M, 4C, 4K).

The intermediate transfer unit 49 is provided with primary transfer rollers 5 (5Y, 5M, 5C, and 5K), an intermediate transfer belt 14, a secondary transfer roller 28, a secondary transfer counter roller 23, a drive roller 21, and a tension roller 22. The intermediate transfer belt 14 is supported by the secondary transfer counter roller 23, the drive roller 21, and the tension roller 22, and the drive roller 21 rotates under the driving force of a motor (not illustrated), moving circumferentially according to its rotation.

Next, image forming operations by the image forming apparatus A will be described. First, upon receiving an image formation job signal, a controller (not illustrated) transports a sheet S, which is loaded and stored in a sheet cassette 42, to a registration roller 9 by means of a feed roller 16. Next, the sheet S is fed, with predetermined timing by the registration roller 9, into a secondary transfer portion that is formed from the secondary transfer roller 28 and the secondary transfer counter roller 23.

Meanwhile, the surface of the photosensitive drum 6Y is first charged in the image forming portion by the charging roller 8Y. Thereafter, the laser scanner unit 15 (the exposure portion) irradiates the surface of the photosensitive drum 6Y with laser light according to an image signal which is transmitted from an external device (not illustrated) or the like, and forms an electrostatic latent image on the surface of the photosensitive drum 6Y.

Subsequently, the yellow toner is made by the development device 4Y to adhere to the electrostatic latent image formed on the surface of the photosensitive drum 6Y, thereby forming a yellow toner image on the surface of the photosensitive drum 6Y. Due to a bias being applied to the primary transfer roller 5Y, the toner image formed on the surface of the photosensitive drum 6Y undergoes primary transfer to the intermediate transfer belt 14.

Through a similar process, magenta, cyan, and black toner images are also formed on the photosensitive drums 6M, 6C, and 6K. Further, due to a primary transfer bias being applied to the primary transfer rollers 5M, 5C, and 5K, toner images thereof are transferred in a superposed manner to the yellow toner image on the intermediate transfer belt 14. A full-color toner image is thus formed on the surface of the intermediate transfer belt 14.

Note that the toner inside the development devices 4 is used by the foregoing development process, and when the amount of toner inside the development devices 4 runs low, the toner in each color is replenished, in the respective development devices 4, by means of toner bottles 32 (32Y, 32M, 32C, 32K). The toner bottles 32 are configured to be detachably attachable to the image forming apparatus A.

Thereafter, the intermediate transfer belt 14 moves circumferentially, thereby feeding a full-color toner image to the secondary transfer portion. Further, in the secondary transfer portion, the full-color toner image on the intermediate transfer belt 14 is transferred to the sheet S by applying a bias to the secondary transfer roller 28.

Next, the sheet S to which the toner image has been transferred undergoes heating and pressurization in the fixing portion 45, thereby fixing the toner image on the sheet S to the sheet S. Subsequently, the sheet S to which the toner image has been fixed is discharged by a discharge roller 18 to a discharge portion 19.

<Frame for Image Forming Apparatus>

Next, a frame 31 for the image forming apparatus A will be described.

Figure 3:
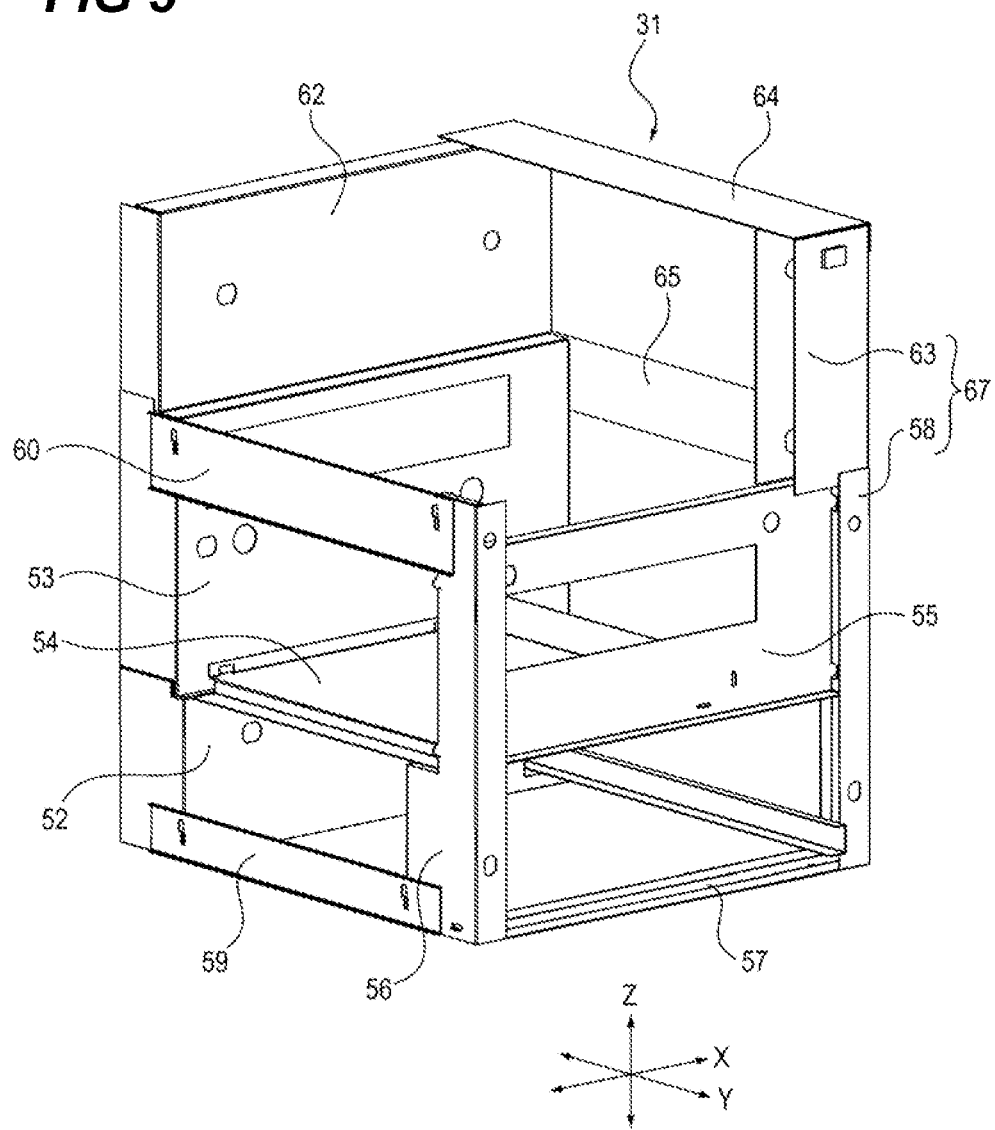
FIG. 3 is a perspective view of a frame of the image forming apparatus.
Figure 4:
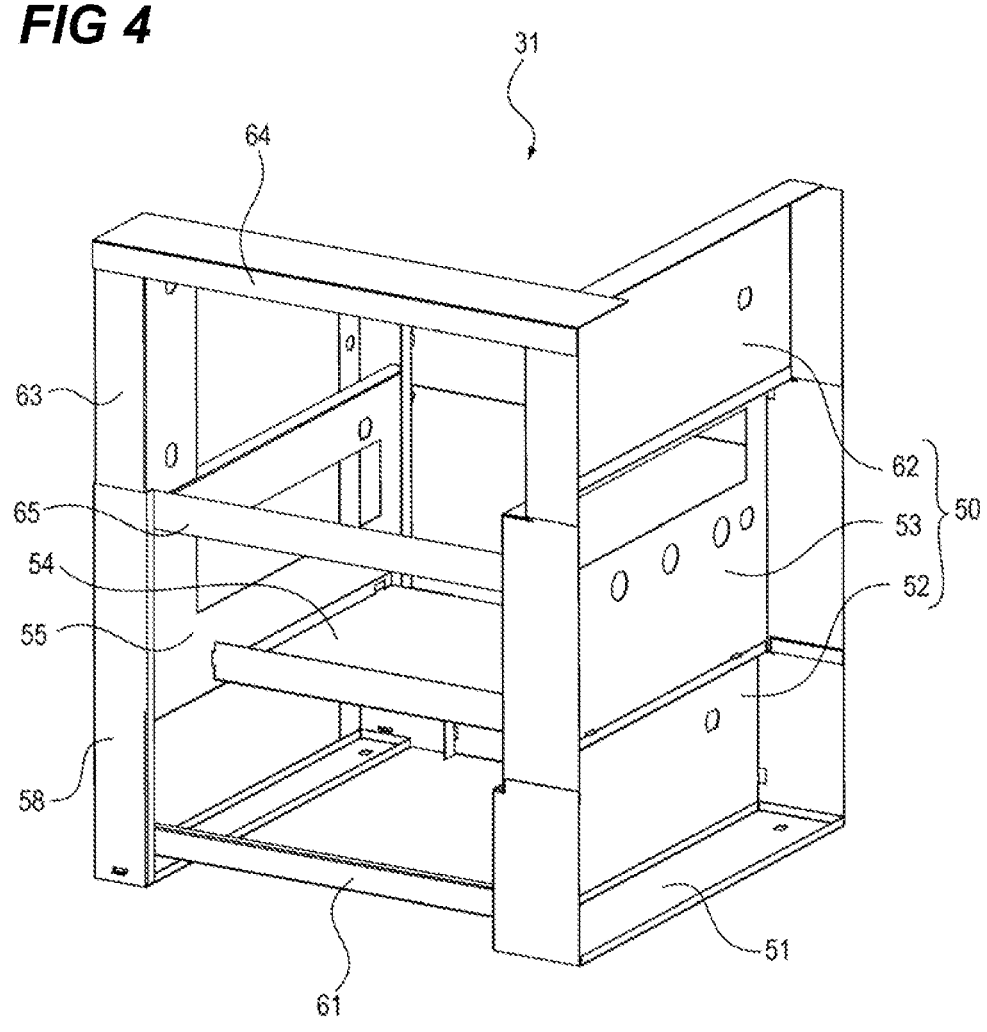
FIG. 4 is a perspective view of the frame of the image forming apparatus.

FIG. 3 is a perspective view in which the frame 31 of the image forming apparatus A is seen from the front side of the image forming apparatus A, and is a perspective view of a state where internal units and the outer cover of the image forming unit or the like have been removed. FIG. 4 is a perspective view of the frame 31 of the image forming apparatus A as seen from the back side of the image forming apparatus A. Note that the arrow X direction illustrated in the drawing is a horizontal direction indicating the left-right direction of the image forming apparatus A. In addition, the arrow Y direction is a horizontal direction indicating the front-back direction of the image forming apparatus A. In addition, the arrow Z direction is a vertical direction indicating the up-down direction of the image forming apparatus A. Furthermore, the front side of the image forming apparatus A is the side on which the user normally stands to operate the operation portion 46 that makes settings related to image formation, and the rear side is the side opposite the front side with the frame 31 interposed therebetween. Further, the left side of the image forming apparatus A is the left side as seen from the front side, and the right side is the right side as seen from the front side. The front side of the image forming apparatus A is the direction in which the sheet cassette 42 is pulled out from the image forming apparatus A when refilling the sheet cassette 42 with sheets, and is the direction in which the toner bottle 32 is pulled out when the toner bottle 32 is replaced.

As illustrated in FIG. 3 and FIG. 4, the image forming apparatus A is provided with a front side plate 55, a left column 56, and a right column 67, which are formed of metal plates, as the frame 31 at the front side of the image forming apparatus. The left column 56 is connected to one end of the front side plate 55 in the arrow X direction. The right column 67 is connected to the other end of the front side plate 55 in the arrow X direction. Further, the right column 67 is configured from a right column 58 and a right column 63 (upper right column) connected above the right column 58 (lower right column) in the vertical direction. The left column 56 and the right column 58 are connected by a lower front stay 57.

The image forming apparatus A is also provided with a rear side plate 50 formed of metal plates as the frame 31 on the back side of the image forming apparatus. The rear side plate 50 is disposed opposite the front side plate 55 and supports the process cartridges 3 together with the front side plate 55. The rear side plate 50 is divided into three parts in the vertical direction as rear side plates 52, 53, and 62, and the rear side plate 53 (second rear side plate) is connected above the rear side plate 52 (first rear side plate) in the vertical direction, and the rear side plate 62 is connected above the rear side plate 53 in the vertical direction. Further, the thickness of the metal plates constituting the rear side plates 52, 53, and 62, respectively, is on the order of 0.6 mm to 2 mm. A rear bottom plate 51 is also provided at the bottom of the rear side plate 52.

The image forming apparatus A is also equipped with a lower left stay 59, an upper left stay 60, a lower right stay 61, a center right stay 65, an upper right stay 64, and a center stay 54, as the frame 31 that connects the frame 31 on the front side of the image forming apparatus to the frame 31 on the back side thereof. The lower left stay 59, upper left stay 60, lower right stay 61, center right stay 65, upper right stay 64, and center stay 54 are examples of connecting members for connecting the rear side plate 50, which is the frame 31 on the back side, and the front side plate 55, left column 56, and right column 67, which are the frame 31 on the front side. The lower left stay 59 connects the left column 56 to the rear side plate 52. The upper left stay 60 connects the left column 56 to the rear side plate 53. The lower right stay 61 connects the right column 58 to the rear side plate 52. The center right stay 65 connects the rear side plate 53 to the right column 58. The upper right stay 64 connects the right column 63 to the rear side plate 62. The center stay 54 connects the front side plate 55 to the rear side plate 53.

Note that each of the foregoing members constituting the frame 31 is formed of one metal plate. These metal plates are processed into a predetermined shape by a drawing process, or the like, and then undergo assembly and joining processes, which will be described subsequently, thus forming the frame 31.

<Assembly Process of the Frame>

Next, the process for assembling the plurality of metal plates constituting the frame 31 will be described. FIG. 5 to FIG. 36B are diagrams illustrating aspects in which the metal plates constituting the frame 31 are each assembled.

Figure 5:
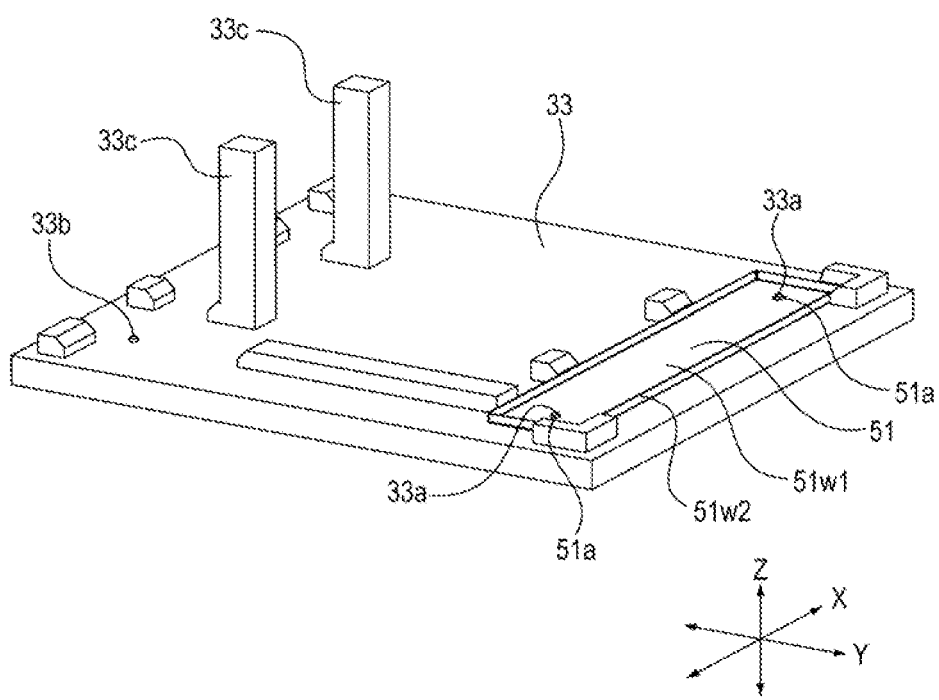
FIG. 5 is a perspective view of when a rear bottom plate is assembled.

As illustrated in FIG. 5, when each metal plate constituting the frame 31 is assembled, a stand 33 is used as a jig. Positioning pins 33$a$ and 33$b$ and a column 33$c$ are provided on the stand 33. First, the rear bottom plate 51 is placed on top of the stand 33. The rear bottom plate 51 is provided with a flat portion 51$w1$ facing the stand 33 and a bent-up portion 51$w2$ bent up from the flat portion 51$w1$. The bent-up portion 51$w2$ is formed on at least the side that engages with the rear side plate 52. When the rear bottom plate 51 is placed on the stand 33, a positioning pin 33$a$ of the stand 33 is inserted into a positioning hole 51$a$ formed in the flat portion 51$w1$ of the rear bottom plate 51, thereby determining the position of the rear bottom plate 51 relative to the stand 33.

Figure 6A:
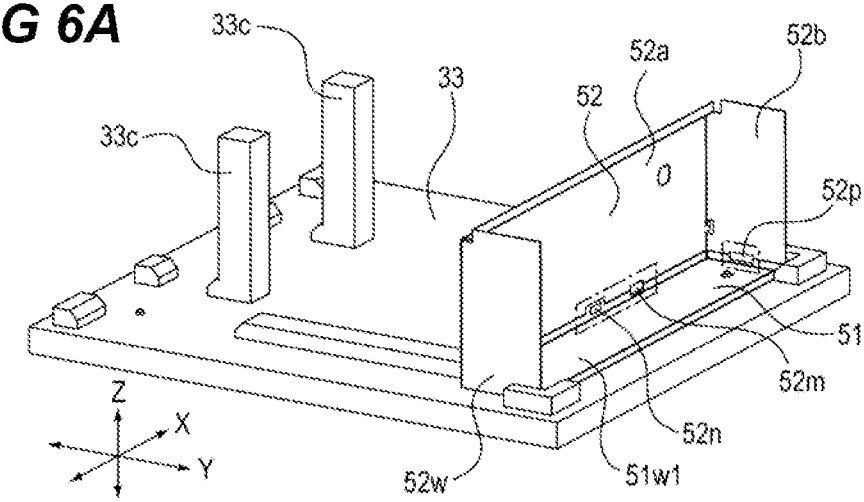
FIG. 6A is a perspective view of when a rear side plate is assembled and FIG. 6B and FIG. 6C are partial enlarged perspective views thereof.
Figure 6B:
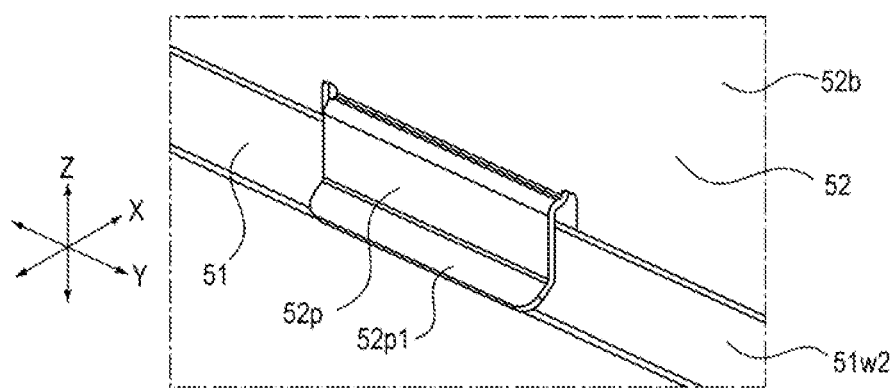
Figure 6C:
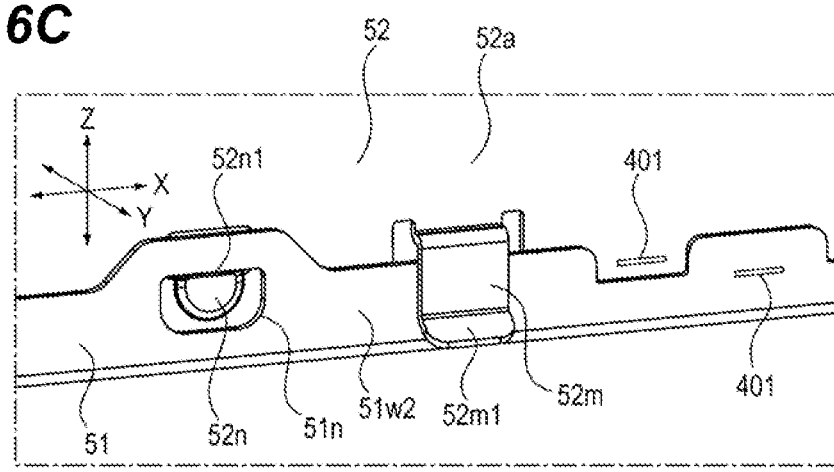

Next, the rear side plate 52 is assembled as illustrated in FIG. 6A, FIG. 6B and FIG. 6C. The rear side plate 52 is assembled by being inserted into the rear bottom plate 51. The rear side plate 52 is bent to form a U-shape with three flat surfaces. The rear side plate 52 is provided with a flat portion 52$a$ located at the rear of the image forming apparatus A, a bend 52$b$ that is bent relative to the flat portion 52$a$ and extends to the rear of the image forming apparatus A, and a bend 52$w$ that is bent relative to the flat portion 52$a$ so as to face the bend 52$b$. At the bottom of the flat portion 52$a$ of the rear side plate 52, a projection 52$n$, which is formed so as to protrude by means of a drawing process in the plate thickness direction, and a stepped bend 52$m$, are provided. A stepped bend 52$p$ is provided at the bottom of the bend 52$b$ of the rear side plate 52. The stepped bend 52$m$ has a part that is bent in the plate thickness direction (arrow Y direction) of the flat portion 52$a$, and a part that is bent and extends from that part in the direction of insertion (arrow Z direction) into the rear bottom plate 51. The stepped bend 52$p$ has a part that is bent in the plate thickness direction (arrow X direction) of the bend 52$b$, and a part that is bent so as to extend from that part in the direction of insertion into the rear bottom plate 51. The distal end of the stepped bend 52m is an inclined portion 52m1 that slopes away from the flat portion 52a of the rear side plate 52 in the direction of insertion of the rear side plate 52 into the rear bottom plate 51. The distal end of the stepped bend 52p is an inclined portion 52p1 that slopes away from the bend 52b of the rear side plate 52 in the direction of insertion of the rear side plate 52 into the rear bottom plate 51. Furthermore, a through-hole 51n that penetrates in the plate thickness direction (arrow Y direction) is formed in the bent-up portion 51w2 of the rear bottom plate 51.

When the rear side plate 52 is assembled, the stepped bends 52m and 52p of the rear side plate 52 are inserted into and engages with the bent-up portion 51w2 of the rear bottom plate 51. At such time, the inclined portions 52m1 and 52p1 of the rear side plate 52 abut against the bent-up portion 51w2 of the rear bottom plate 51, thereby guiding the movement of the rear side plate 52 in the arrow Z direction. As a result, the bent-up portion 51w2 of the rear bottom plate 51 is sandwiched, from the plate thickness direction, between the stepped bends 52m and 52p of the rear side plate 52 and the flat portions 52a and 52b, thus determining the position of the rear side plate 52 relative to the rear bottom plate 51 in the arrow X direction and arrow Y direction. The projection 52n of the rear side plate 52 also engages with the through-hole 51n in the rear bottom plate 51. Thus, an edge 52n1 of the projection 52n abuts against the inner wall of the through-hole 51n, restricting the movement of the rear side plate 52 in the direction opposite to the direction of insertion into the rear bottom plate 51. Also, when the rear side plate 52 is inserted into the rear bottom plate 51 in the position where the lower end of the rear side plate 52 abuts against the surface on which the rear bottom plate 51 is placed on the stand 33, or in the position where the part of the stepped bends 52m and 52p that is bent up from the flat portions 52a and 52b abuts against the upper end of the bent-up portion 51w2 of the rear bottom plate 51, the positions of the rear side plate 52 and the rear bottom plate 51 in the arrow Z direction are determined, and the final relative positions of the rear bottom plate 51 and the rear side plate 52 are determined.

Figure 7:
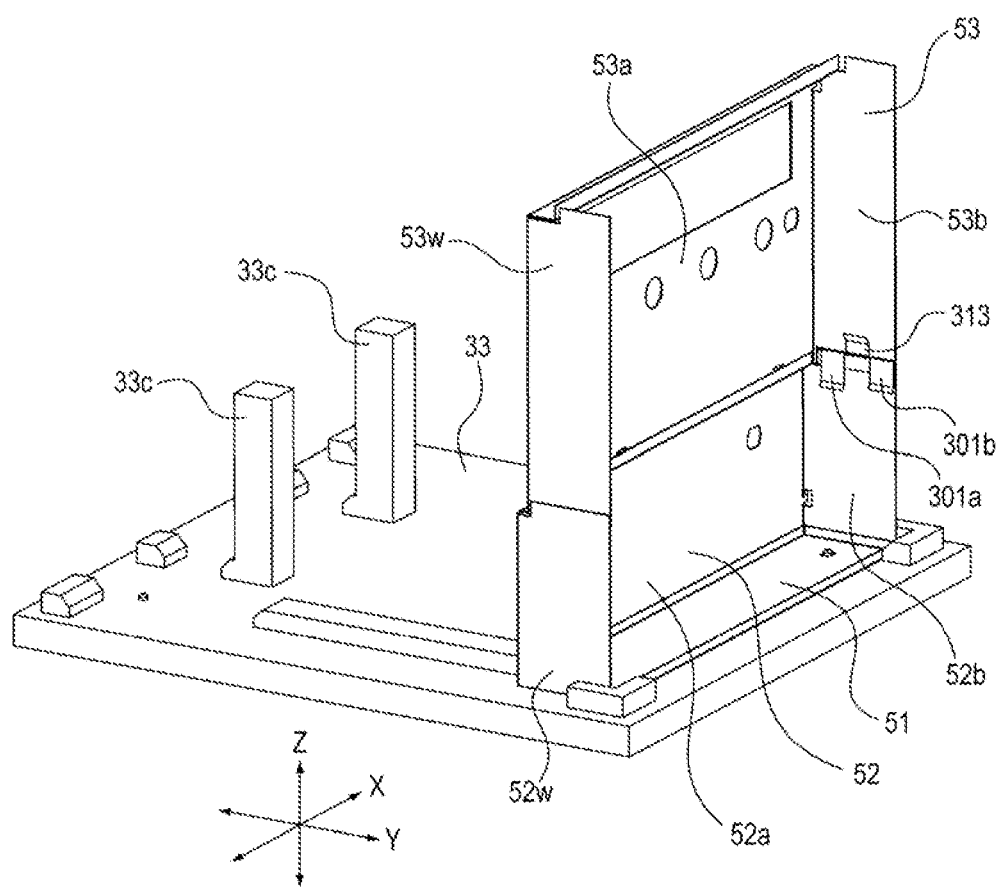
FIG. 7 is a perspective view of when the rear side plate is assembled.

Next, a rear side plate 53 is assembled as illustrated in FIG. 7. The rear side plate 53 supports the process cartridges 3, which greatly affect image quality during image formation. Therefore, it is especially desirable that the rear side plate 53 be assembled with high positional accuracy. The assembly configuration of the rear side plate 53 will be described in detail hereinbelow.

As illustrated in FIG. 7, the rear side plate 53 undergoes bending processing to have three flat surfaces. The rear side plate 53 is provided with a support portion 53a that is located at the rear of the image forming apparatus A and that supports the process cartridges 3; and a bend 53b that is bent with a bending angle which is substantially a right angle (89 to 90 degrees) relative to the support portion 53a so as to extend to the rear of the image forming apparatus A. The rear side plate 53 is also equipped with a bend 53w that is bent relative to the support portion 53a so as to face the bend 53b.

The support portion 53a of the rear side plate 53 is disposed adjacent to the flat portion 52a of the rear side plate 52 in the vertical direction, and is assembled through mutual insertion into the flat portion 52a of the rear side plate 52. The bend 53b of the rear side plate 53 is disposed adjacent to the bend 52b of the rear side plate 52 in the vertical direction, and is assembled by being mutually inserted into the bend 52b of the rear side plate 52. The bend 53w of the rear side plate 53 is disposed adjacent to the bend 52w of the rear side plate 52 in the vertical direction, and is assembled by being mutually inserted into the bend 52w of the rear side plate 52.

First, the assembly configuration of the flat portion 52a of the rear side plate 52 and the support portion 53a of the rear side plate 53 will be described. FIG. 8A to FIG. 9B are perspective views of the flat portion 52a of the rear side plate 52 and the support portion 53a of the rear side plate 53. FIG. 10A to FIG. 11B are enlarged perspective views of the engagement between the flat portion 52a of the rear side plate 52 and the support portion 53a of the rear side plate 53. Here, FIG. 8A, FIG. 9A, FIG. 10A, and FIG. 11A illustrate a state before the rear side plates 52 and 53 are assembled, and FIG. 8B, FIG. 9B, FIG. 10B and FIG. 11B illustrate a state where the rear side plates 52 and 53 are assembled. FIG. 8A to FIG. 10B are diagrams in which the flat portions 52a and 53a are viewed from inside the image forming apparatus A, and FIG. 9A to FIG. 11B are diagrams in which the flat portions 52a and 53a are viewed from outside the image forming apparatus A.

As illustrated in FIG. 8A to FIG. 11B, the support portion 53a of the rear side plate 53 is provided with two projections 103 that protrude in the plate thickness direction of the rear side plate 53, and two stepped bends 104 that protrude in the direction of insertion (the arrow Z direction) of the rear side plate 53 into the rear side plate 52. At the bottom of each of the two stepped bends 104, two protrusions 105 that protrude in the direction of insertion into the rear side plate 52 are provided.

The projection 103 is formed by a drawing process and the amount of protrusion from the surface of the support portion 53a is about 0.3 mm to 2 mm. Further, the projection 103 is disposed in a position adjacent to the stepped bend 104 in the plate thickness direction of the rear side plate 53 and in a direction (arrow X direction) perpendicular to the direction of insertion of the rear side plate 53 into the rear side plate 52. The protrusion 105 is disposed downstream of the stepped bend 104 in the direction for inserting the rear side plate 53 into the rear side plate 52. The distal end of the protrusion 105 is an inclined portion 105a that slopes away from the support portion 53a in the direction of insertion the rear side plate 53 into the rear side plate 52.

The stepped bend 104 has a part that is bent in the plate thickness direction of the rear side plate 53, and a part that is bent and extends, from that part, in the direction of insertion into the rear side plate 52. Further, the distal end of the stepped bend 104 is an inclined portion 104a that slopes away from the support portion 53a in the direction for inserting the rear side plate 53 into the rear side plate 52. Note that the interval between the two stepped bends 104 of the rear side plate 53 in the arrow X direction is equal to or less than 100 mm.

At the top of the flat portion 52a of the rear side plate 52, a bend 52a1 bent in the arrow Y direction and a bent-up portion 52a2 bent up in the arrow Z direction from the bend 52a1 are formed. Two through-holes 107 are formed in the bent-up portion 52a2, the holes penetrating in the plate thickness direction (arrow Y direction) thereof. At the boundary between the bend 52a1 and the bent-up portion 52a2, a through-hole 108 that penetrates in the plate thickness direction thereof is formed.

When the rear side plate 53 is assembled on the rear side plate 52, the inclined portion 104a of the stepped bend 104 and the inclined portion 105a of the protrusion 105 of the rear side plate 53 abuts against the bent-up portion 52a2 of the rear side plate 52, guiding the movement of the rear side plate 53 in the arrow Z direction. Furthermore, a stopper portion 106 of the rear side plate 53 strikes an abutment portion 109, which is the upper end of the bent-up portion 52a2 of the rear side plate 52, restricting the movement of the rear side plate 53 in the direction of insertion into the rear side plate 52.

When the rear side plate 53 is assembled on the rear side plate 52, the stepped bend 104 of the rear side plate 53 is inserted into the bent-up portion 52a2 of the rear side plate 52 and engages so as to hook onto the bent-up portion 52a2 of the rear side plate 52. As a result, the stepped bend 104 and the support portion 53a of the rear side plate 53 sandwich the bent-up portion 52a2 of the rear side plate 52 from the plate thickness direction, thereby determining the position of the rear side plate 53 relative to the rear side plate 52 in the arrow Y direction.

The projection 103 of the rear side plate 53 also engages with the through-hole 107 of the rear side plate 52. Thus, an edge 103a of the projection 103 abuts against the inner wall of the through-hole 107, restricting the movement of the rear side plate 53 in the direction opposite to the direction of insertion into the rear side plate 52. Note that, in the process of the rear side plate 53 being inserted into the rear side plate 52, the projection 103 presses the bent-up portion 52a2 of the rear side plate 52 in the plate thickness direction, whereby the bent-up portion 52a2 deforms elastically. However, because the projection 103 fits into the through-hole 107, the bent-up portion 52a2 is no longer pressed in the plate thickness direction, and the bent-up portion 52a2 deforms elastically and returns to its original shape.

The protrusion 105 of the rear side plate 53 also engages with the through-hole 108 of the rear side plate 52. Thus, the protrusion 105 abuts against the inner wall of the through-hole 108, restricting the movement of the rear side plate 53 in the arrow X direction relative to the rear side plate 52.

In the vicinity of the stepped bend 104 that causes the rear side plate 52 to engage with the rear side plate 53, a projection 52n is provided to regulate the movement of the rear side plate 53 in the direction opposite to the direction of insertion into the rear side plate 52. As a result, the rear side plate 53 moves in the direction opposite to the direction of insertion into the rear side plate 52, thereby preventing separation of the rear side plate 53 and the rear side plate 52, and deterioration of the positional accuracy. Therefore, the rear side plate 53 and the rear side plate 52, which constitute the frame 31, can be assembled with high positional accuracy.

Note that, in this embodiment, the projection 103 is disposed in a position adjacent to the stepped bend 104 in the plate thickness direction (arrow Y direction) of the support portion 53a and in a direction (arrow X direction) perpendicular to the direction of insertion (arrow Z direction) of the rear side plate 53 into the rear side plate 52. However, the present invention is not limited to this configuration. That is, the same advantageous effects as above can be obtained even when the projection 103 is configured to be disposed in a position adjacent to the stepped bend 104 in the direction for inserting the rear side plate 53 into the rear side plate 52. In this case, because, in this embodiment, the protrusion 105 is downstream of the stepped bend 104 in the direction of insertion, the projection 103 is preferably provided upstream of the stepped bend 104.

Figure 12A:
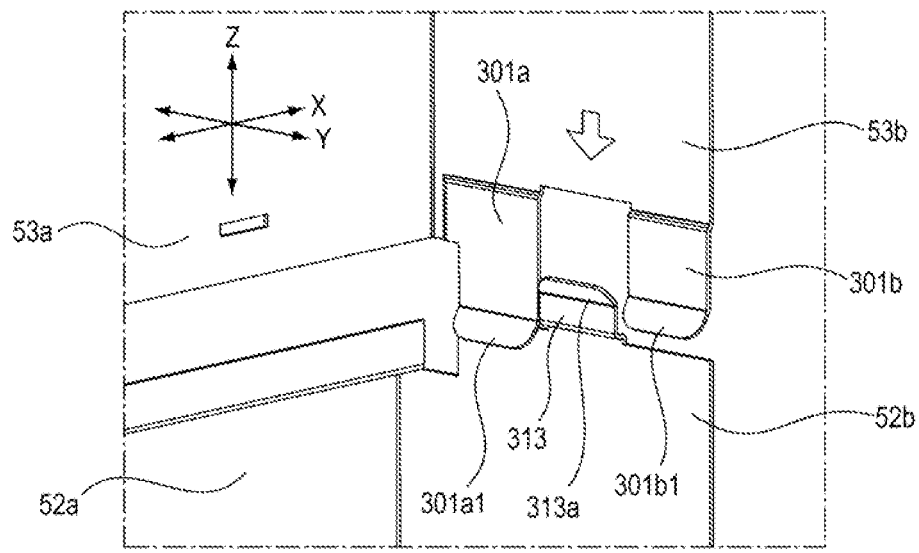
FIG. 12A and FIG. 12B are perspective views of bends of the rear side plate.
Figure 12B:
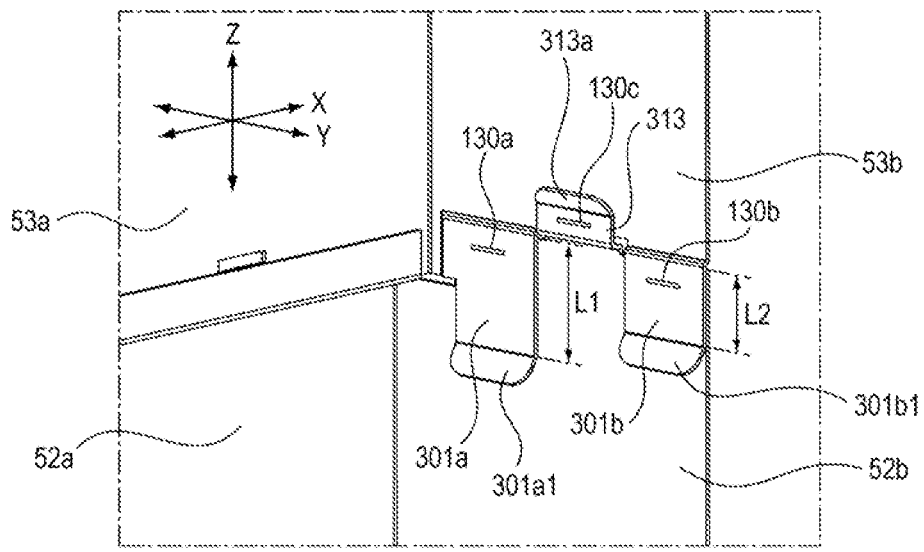

Next, the assembly configuration of the bend 52b of the rear side plate 52 and the bend 53b of the rear side plate 53 will be described. FIG. 12A and FIG. 12B are enlarged perspective views of the engagement between the bend 52b of the rear side plate 52 and the bend 53b of the rear side plate 53. Here, FIG. 12A illustrates a state before the rear side plates 52 and 53 engage with each other, and FIG. 12B illustrates a state where the rear side plates 52 and 53 engage with each other.

As illustrated in FIG. 12A, FIG. 12B and FIG. 12C, the bend 53b of the rear side plate 53 is assembled by being mutually inserted into the bend 52b of the rear side plate 52. At the top of the bend 52b of the rear side plate 52, a stepped bend 313 is provided that protrudes in the direction (arrow Z direction) of insertion of the bend 53b of the rear side plate 53, and is inserted into and engages with the bend 53b so as to overlap the bend 53b of the rear side plate 53 in the plate thickness direction of the rear side plate 52. The stepped bend 313 engages with the rear side plate 53 so as to hook onto the lower end of the bend 53b of the rear side plate 53.

The stepped bend 313 has a part that is bent in the plate thickness direction (arrow X direction) of the bend 52b of the rear side plate 52, and a part that is bent and extends from that part in the direction of insertion into the bend 53b of the rear side plate 53. The distal end of the stepped bend 313 is formed by being bent from the part of the stepped bend 313 that is bent in the direction of insertion into the bend 53b of the rear side plate 53, and is an inclined portion 313a that slopes away from the bend 52b in the direction of insertion into the bend 53b.

At the bottom of the bend 53b of the rear side plate 53, two protrusions 301a and 301b, which project in the direction of insertion (vertical direction and arrow Z direction) into the bend 52b of the rear side plate 52, are provided. The protrusions 301a and 301b are inserted into and engage with the bend 52b so as to overlap the bend 52b of the rear side plate 52 in the plate thickness direction (arrow X direction) of the bend 53b of the rear side plate 53. The protrusions 301a and 301b also engage with the bend 52b so as to hook onto the upper end of the bend 52b of the rear side plate 52. The protrusion 301b also engages with the bend 52b so as to hook onto the upper end of the bend 52b of the rear side plate 52. Furthermore, the distal ends of the protrusions 301a and 301b constitute inclined portions 301a1 and 301b1 that slope away from the bend 53b in the direction of insertion into the bend 52b of the rear side plate 52.

When the stepped bend 313 engages with the bend 53b and the protrusions 301a and 301b engage with the bend 52b, the stepped bend 313 and the protrusions 301a and 301b engage with each other in the direction of insertion of the bends 52b and 53b and in a direction (arrow Y direction) perpendicular to the plate thickness direction. Specifically, the protrusion 301a is inserted into and engages with the bend 52b, in the above perpendicular direction, in a position close to the support portion 53a of the rear side plate 53 relative to the stepped bend 313, and adjacent to the stepped bend 313. In other words, the protrusion 301a, the stepped bend 313, and the protrusion 301b are located adjacent to each other in the vertical direction and in a direction (arrow Y direction) perpendicular to the plate thickness direction. The protrusion 301b is inserted into and engages with the bend 52b in the above perpendicular direction, in a position far from the support portion 53a of the rear side plate 53 relative to the stepped bend 313, and adjacent to the stepped bend 313. With this configuration, assembly is achieved due to the bend 52b of the rear side plate 52 and the bend 53b of the rear side plate 53 tightly engaging with each other. In addition, because the bend 52b of the rear side plate 52 and the bend 53b of the rear side plate 53 are assembled through engagement by the bend and the plate portion instead of engagement by the through-hole and the protrusion, there is no need to provide an extra mating gap, and the positional accuracy between the metal plates can be improved. It is thus possible to achieve both ease of assembly and improved positional accuracy of the two metal plates constituting the frame.

The amount of protrusion of the protrusion 301a in the direction of insertion into the bend 52b is larger than the amount of protrusion of the protrusion 301b in the direction of insertion into the bend 52b. As a result, when the length of engagement of the protrusion 301a with the bend 52b is L1 and the length of engagement of the protrusion 301b with the bend 52b is L2, the relationship L1>L2 holds true.

Figure 13A:
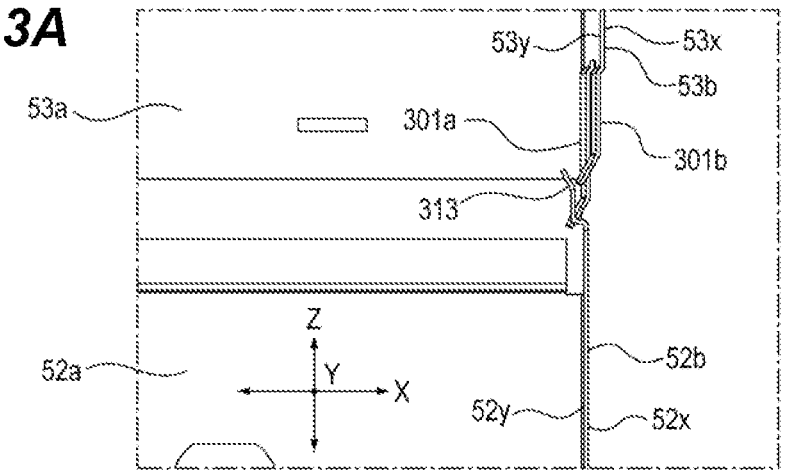
FIG. 13A, FIG. 13B and FIG. 13C are diagrams illustrating an aspect in which the bends of the rear side plate have been assembled.
Figure 13B:
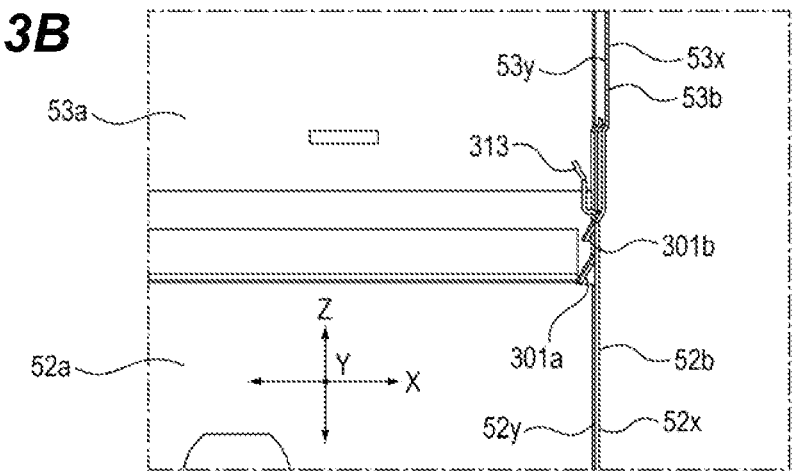
Figure 13C:
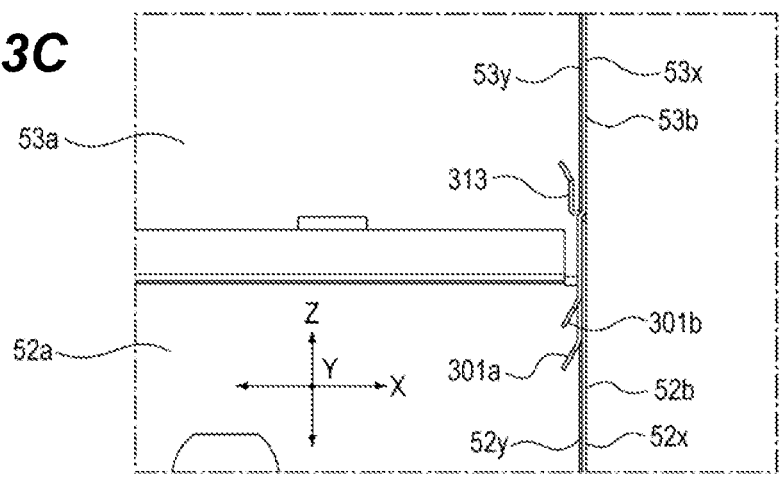

FIG. 13A to FIG. 13C are diagrams illustrating that the bend 53b of the rear side plate 53 is mounted on the bend 52b of the rear side plate 52, as viewed from the arrow Y direction. Here, FIG. 13A to FIG. 13C illustrate in sequence how the bend 53b of the rear side plate 53 is mounted on the bend 52b of the rear side plate 52.

As illustrated in FIG. 13A, when the rear side plate 53 is assembled, when an unintended directional force is applied to the rear side plate 53, the rear side plate 53 may be elastically deformed and the bending angle from the support portion 53a to the bend 53b may become larger than 90 degrees. At such time, the protrusion 301a is located on the root side of the bend, that is, closer to the support portion 53a than the protrusion 301b, and therefore the amount of deviation of the protrusion 301a from the ideal position is smaller than the amount of deviation of the protrusion 301b from the ideal position.

Next, as illustrated in FIG. 13B, due to the foregoing relationship L1>L2, the protrusion 301a, which has a relatively small amount of deviation from the ideal position, engages first with the bend 52b before the relatively large protrusion 301b. At such time, the inclined portion 301a1 of the protrusion 301a makes contact with the rear side plate 52 and guides the rear side plate 53 to a position where a second surface 52y of the rear side plate 52 and a first surface 53x of the rear side plate 53 in the protrusion 301a are facing each other. Thus, the elastic deformation of the bend 53b is slightly corrected, and the bending angle from the support portion 53a to the bend 53b substantially approaches a right angle.

Thereafter, as illustrated in FIG. 13C, the stepped bend 313 engages with the bend 53b, and the protrusion 301b engages with the bend 52b. At such time, the inclined portion 313a of the stepped bend 313 makes contact with the rear side plate 53 and guides the rear side plate 52 to a position where a second surface 53y of the rear side plate 53 and a first surface 52x of the rear side plate 52 of the stepped bend 313 face each other. The inclined portion 301b1 of the protrusion 301b makes contact with the rear side plate 52 and guides the rear side plate 53 to a position where the second surface 52y of the rear side plate 52 and the first surface 53x of the rear side plate 53 of the protrusion 301b are facing each other. As a result, the rear side plate 53 is assembled on the rear side plate 52, the elastic deformation of the bend 53b is generally corrected, and the bending angle from the support portion 53a to the bend 53b is generally the ideal angle.

When the rear side plate 53 is assembled in this way, the rear side plates 52 and 53 are guided by the inclined portion 313a of the stepped bend 313 and the inclined portions 301a1 and 301b1 of the protrusions 301a and 301b. It is thus easier to assemble the rear side plate 53 so that the positional relationships between the first surface 52x and second surface 52y of the rear side plate 52 and the first surface 53x and second surface 53y of the rear side plate 53 are accurate, thereby preventing the rear side plates 52 and 53 from being assembled with the wrong positional relationship. Note that, in the rear side plate 53, the above advantageous effects can be obtained when the inclined portion 301a1 of the protrusion 301a and/or the inclined portion 301b1 of the protrusion 301b is provided.

Furthermore, when the bend 53b is elastically deformed, there is a concern that the rear side plate 53 may be assembled incorrectly so that the first surface 52x of the rear side plate 52 and the second surface 53y of the rear side plate 53 of the protrusion 301b are facing each other in the configuration where the protrusion 301b engages first with the bend 52b. As described above, although the inclined portion 301b1 of the protrusion 301b prevents the rear side plates 52 and 53 from being assembled with the wrong positional relationship, when the elastic deformation is large, the inclined portion 301b1 may not be able to make contact with the rear side plate 52, and may not be able to control same. In contrast, by causing the protrusion 301a, which has a relatively small amount of misalignment relative to the ideal position, to first engage with the bend 52b, it becomes easier to implement assembly so that the first surface 53x of the rear side plate 53 and the second surface 52y of the rear side plate 52 are facing each other. It is thus possible to prevent the rear side plate 52 and the rear side plate 53 from being assembled with the wrong positional relationship.

Figure 14A:
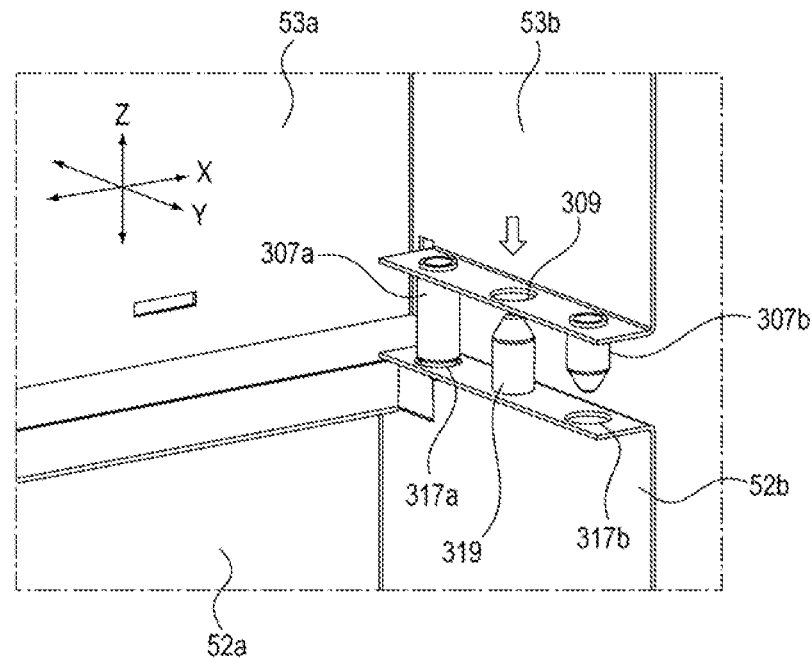
FIG. 14A and FIG. 14B are perspective views of another configuration of the bends of the rear side plate.
Figure 14B:
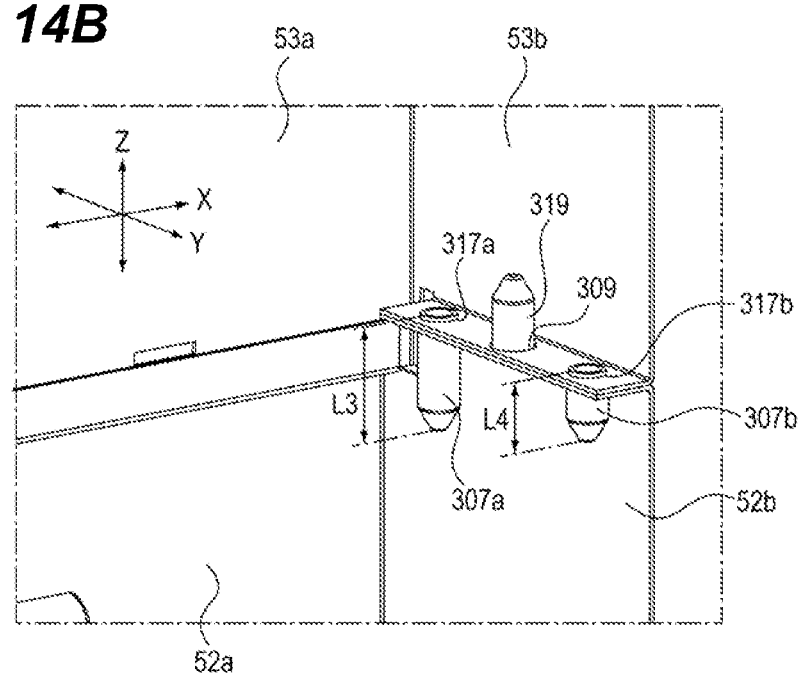

Note that the shape of the engagement between the bend 52b of the rear side plate 52 and the bend 53b of the rear side plate 53 is not limited to the configuration of this embodiment. That is, as illustrated in FIG. 14A and FIG. 14B, the rear side plate 53 can be provided with engagement shafts 307a and 307b that are inserted into and engage with through-holes 317a and 317b in the bend 52b, and the rear side plate 52 can be provided with an engagement shaft 319 that is inserted into and engages with a through-hole 309. The through-hole 317a and through-hole 317b are holes that are formed in the area where the upper end of the bend 52b of the rear side plate 52 is bent upward in the arrow X direction and that penetrate in the arrow Z direction. The through-hole 309 is a hole that is formed in the area where the lower end of the bend 53b of the rear side plate 53 is bent upward in the arrow X direction and that penetrates the plate thickness direction in the arrow Z direction.

Figure 15:
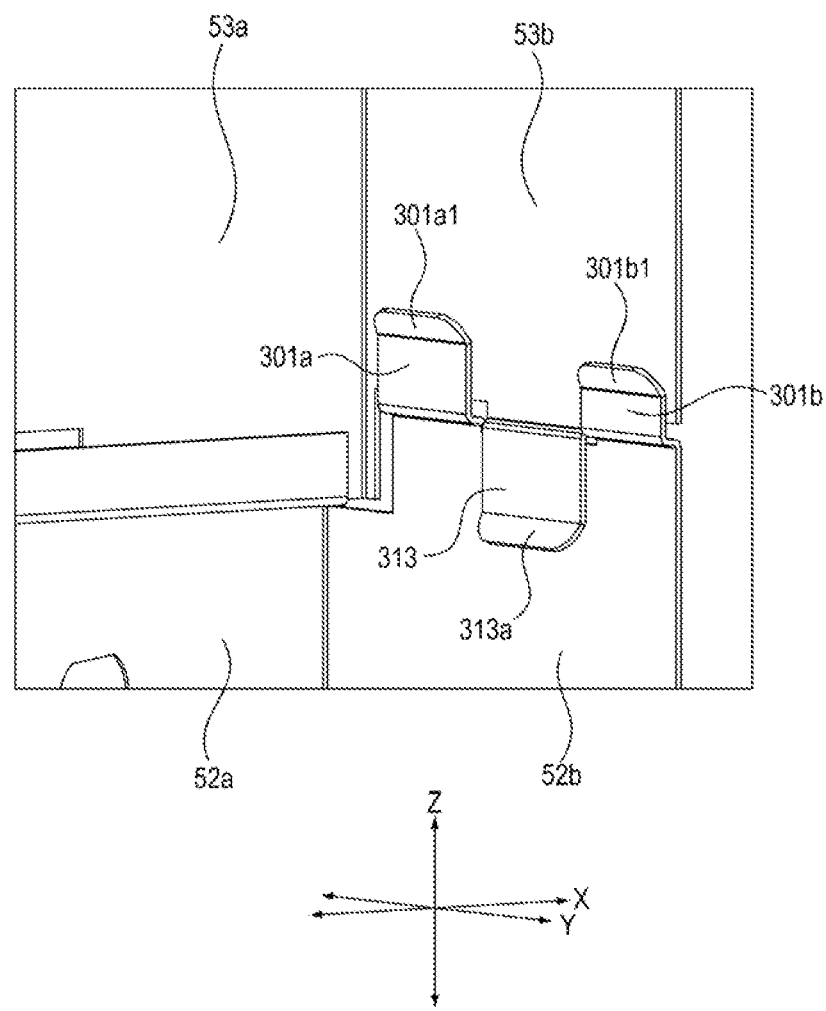
FIG. 15 is a perspective view of another configuration of the bends of the rear side plate.

Here, the length of engagement in the direction of insertion of the engagement shaft 307a, which is disposed in a position close to the support portion 53a, into the bend 52b is L3, and the length of engagement in the direction of insertion of the engagement shaft 307b, which is disposed in a position far from the support portion 53a, is L4. At such time, by establishing the relationship L3>L4, it is possible to prevent the rear side plate 53 from being assembled incorrectly, as described above. Moreover, as illustrated in FIG. 15, the same advantageous effects as those above can also be obtained in a configuration in which the protrusions 301b and 301b are provided on the bend 52b of the rear side plate 52 and the stepped bend 313 is provided on the bend 53b of the rear side plate 53.

Figure 16A:
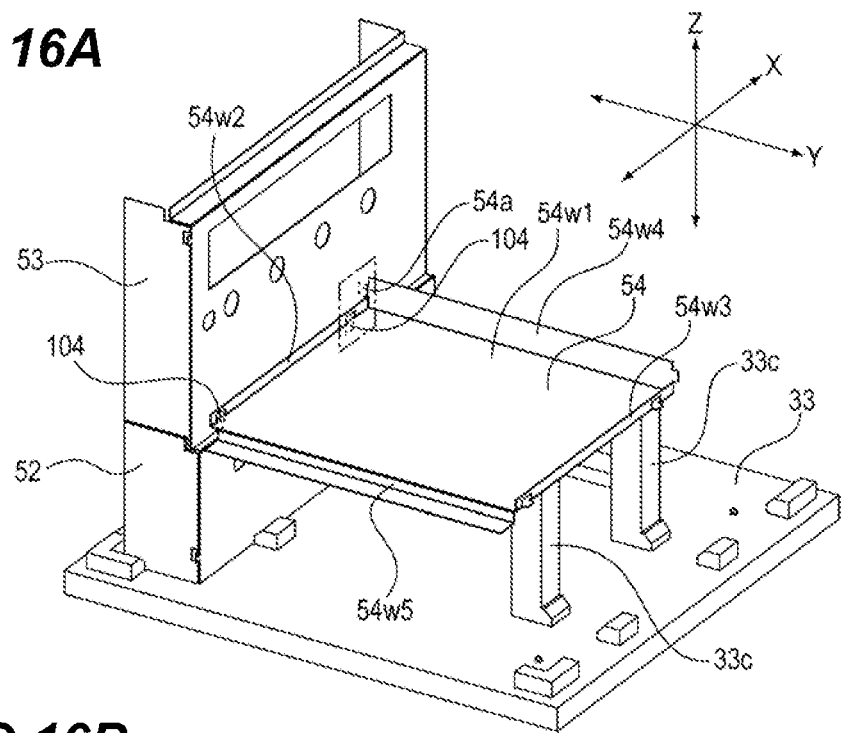
FIG. 16A and FIG. 16B are perspective views of when a center stay is assembled.
Figure 16B:
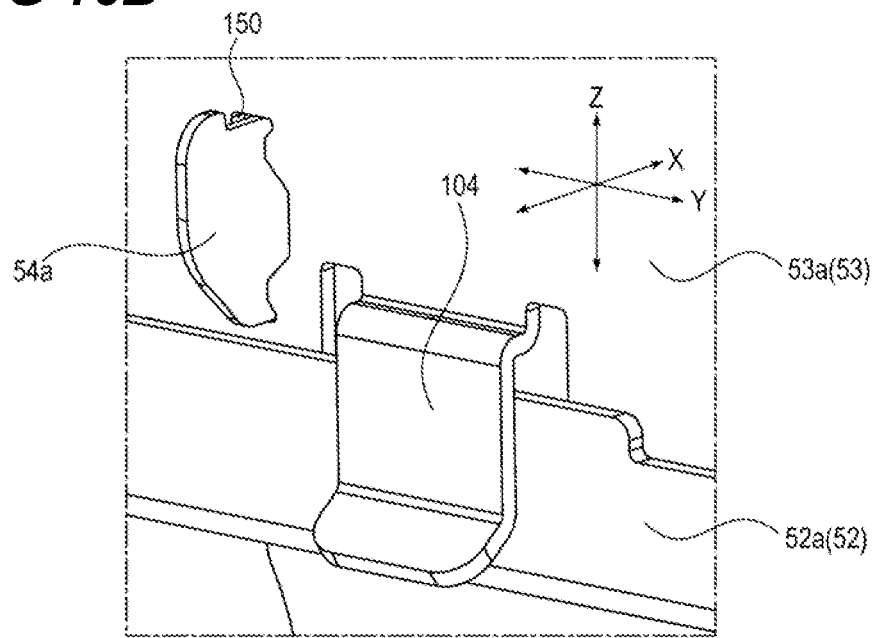

Next, a center stay 54 is assembled as illustrated in FIG. 16A and FIG. 16B. The center stay 54 is an optical stand on which the laser scanner unit 15 is placed and which supports the laser scanner unit 15, and is an example of a connecting member. The center stay 54 is placed on the two columns 33c provided on the stand 33 and is inserted into the support portion 53a of the rear side plate 53. Note that, in this embodiment, the center stay 54 is the member that supports the laser scanner unit 15, but same may be any member that connects the front side plate 55 to the rear side plate 50 while maintaining a predetermined interval therebetween, in a position between the laser scanner unit 15 and the sheet cassette 42 in a vertical direction. Furthermore, if, instead of a laser scanner unit 15, an exposure unit that exposes the photosensitive drums using LEDs is used, the configuration may be such that the foregoing connecting member is provided between the exposure unit and the sheet cassette in the vertical direction.

The center stay 54 has a flat portion 54$w$1 that extends in the horizontal direction and a bent-up portion 54$w$2 that is bent vertically and upward from the flat portion 54$w$1 at one end of the flat portion 54$w$1 in the arrow Y direction. The center stay 54 also has a bent-up portion 54$w$3 that is bent vertically from the flat portion 54$w$1 so as to face the bent-up portion 54$w$2, and a bent-up portion 54$w$4 that is bent vertically and upward from the flat portion 54$w$1 at one end of the flat portion 54$w$1 in the arrow X direction. The center stay 54 also has a bend 54$w$5 that is bent vertically and downward from the flat portion 54$w$1 at the other end of the flat portion 54$w$1 in the arrow X direction, and that extends horizontally from that position. The bent-up portion 54$w$4 of the center stay 54 is provided with a protrusion 54$a$ that protrudes in the direction of insertion (arrow Y direction) into the rear side plate 53. The protrusion 54$a$ of the center stay 54 is inserted into the through-hole 150 that is formed in the support portion 53$a$ of the rear side plate 53 and that penetrates in the plate thickness direction (arrow Y direction) of the support portion 53$a$. The position of the center stay 54 relative to the rear side plate 53 in the arrow X and arrow Y directions is accordingly determined.

Next, a front side plate 55 is assembled as illustrated in FIG. 17A to FIG. 17C. The center stay 54 is inserted into the front side plate 55. The front side plate 55 has a flat portion 55$w$1 that extends in the vertical direction and a bent-up portion 55$w$2 obtained by bending, in front of the image forming apparatus A, each of the two ends of the flat portion 55$w$1 in the arrow X direction and arrow Y direction. The flat portion 55$w$1 of the front side plate 55 has through-holes 55$a$ and 55$b$ that penetrate in the plate thickness direction thereof (arrow Y direction). The bent-up portion 54$w$3 of the center stay 54 is also provided with protrusions 54$b$ and 54$c$ that protrude in the direction of insertion (arrow Y direction) into the front side plate 55. The distal end of the protrusion 54$b$ has a hooking portion 54$b$1 that protrudes upward from the proximal end.

The protrusion 54$b$ of the center stay 54 is inserted into the through-hole 55$a$ formed in the flat portion 55$w$1 of the front side plate 55, and the protrusion 54$c$ is inserted into the through-hole 55$b$ formed in the flat portion 55$w$1 of the front side plate 55. The position of the front side plate 55 relative to the center stay 54 is accordingly determined. The hooking portion 54$b$1 of the protrusion 54$b$ faces the upper part of the through-hole 55$a$ in the front side plate 55. As a result, the hooking portion 54$b$1 of the center stay 54 abuts against the flat portion 55$w$1 of the front side plate 55, restricting the movement of the center stay 54 in the direction opposite to the direction of insertion into the front side plate 55, and preventing the center stay 54 from being released.

Figure 18A:
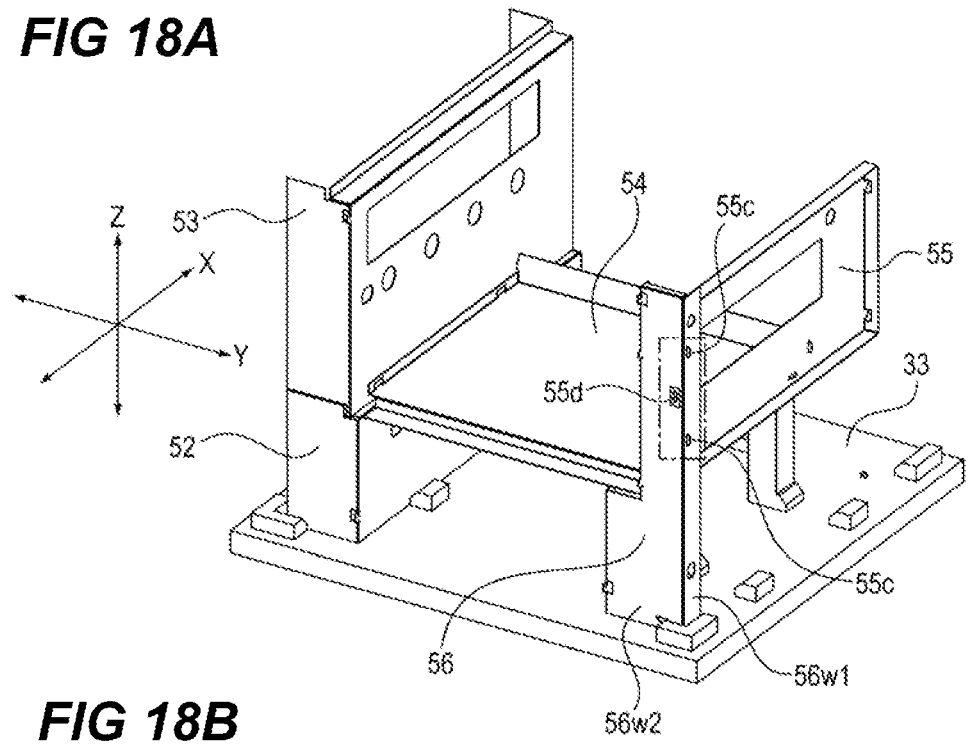
FIG. 18A is a perspective views of when a left column is assembled.
Figure 18B:
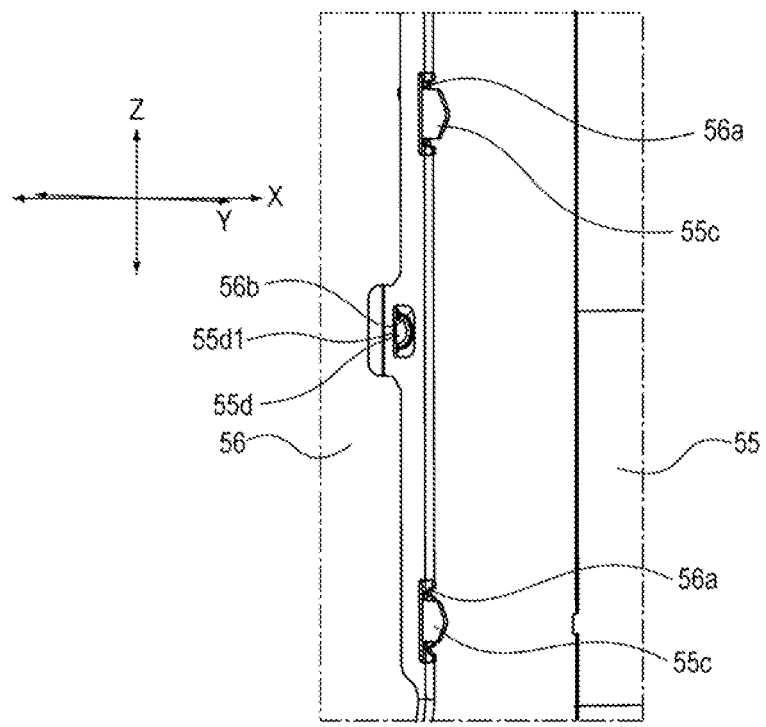
FIG. 18B is an enlarged side view of the left column.

Next, a left column 56 is assembled as illustrated in FIG. 18A and FIG. 18B. The left column 56 is disposed on the stand 33. Further, the front side plate 55 is inserted into the left column 56. The left column 56 is formed mainly from two flat surfaces, and has a flat portion 56$w$1 that extends parallel to the flat portion 55$w$1 of the front side plate 55, and a flat portion 56$w$2 that is bent substantially vertically from the flat portion 56$w$1 to the rear of the image forming apparatus A. A through-hole 56$a$ that penetrates in the arrow Y direction is provided in the bent part of the boundary between the flat portion 56$w$1 and the flat portion 56$w$2 of the left column 56. Furthermore, the flat portion 56$w$2 of the left column 56 has a through-hole 56$b$ that penetrates in the plate thickness direction (arrow X direction) thereof. The bent-up portion 55$w$2 of the front side plate 55 also has a protrusion 55$c$ that protrudes in the direction of insertion (arrow Y direction) into the left column 56, and a projection 55$d$ that protrudes in the plate thickness direction (arrow X direction).

The protrusion 55$c$ of the front side plate 55 is inserted into the through-hole 56$a$ formed in the left column 56. The position of the left column 56 relative to the front side plate 55 is accordingly determined. The projection 55$d$ of the front side plate 55 also engages with the through-hole 56$b$ of the left column 56. Thus, an edge 55$d$1 of the projection 55$d$ abuts against the inner wall of the through-hole 56$b$, restricting the movement of the front side plate 55 in the direction opposite to the direction of insertion into the left column 56.

Figure 19A:
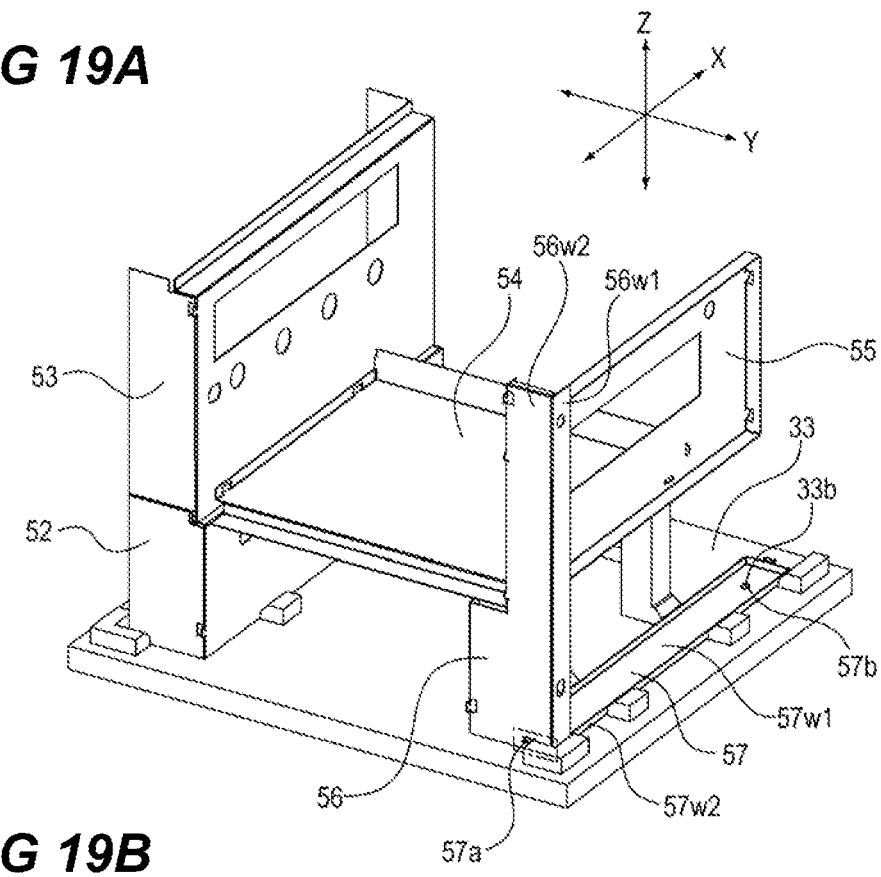
FIG. 19A is a perspective view of when a lower front stay is assembled and FIG. 19B is an enlarged side view of the lower front stay.
Figure 19B:
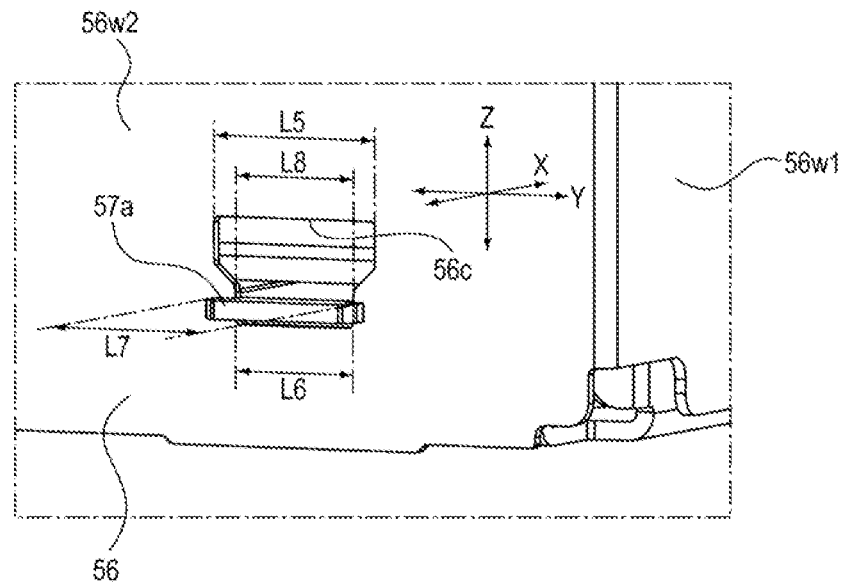

Next, a lower front stay 57 is assembled as illustrated in FIG. 19A and FIG. 19B. The lower front stay 57 is placed on the stand 33 and is assembled by being inserted into the left column 56. The lower front stay 57 has a flat portion 57$w$1, which is a flat surface placed on the stand 33, and a bent-up portion 57$w$2 obtained by bending, substantially vertically and upward from the flat portion 57$w$1, each of the two ends of the flat portion 57$w$1 in the arrow X direction and arrow Y direction. The bent-up portion 57$w$2 of the lower front stay 57 is provided with a protrusion 57$a$ that protrudes in the direction of insertion (arrow X direction) into the left column 56. A positioning hole 57$b$ that penetrates in the plate thickness direction (arrow Z direction) is formed in the flat portion 57$w$1 of the lower front stay 57. Furthermore, the flat portion 56$w$2 of the left column 56 has a through-hole 56$c$ that penetrates in the plate thickness direction (arrow X direction) thereof. Here, the width of the upper end of the through-hole 56$c$ is L5, and the width of the lower end is L6. Further, the width of the distal end of the protrusion 57$a$ is L7, and the width of the substrate portion is L8. Here, the relationships L5>L6, L8<L7, L5≈L7, and L6≈L8 hold true.

The protrusion 57$a$ of the lower front stay 57 is inserted into and engages with the through-hole 56$c$ formed in the flat portion 56$w$2 of the left column 56. At such time, the protrusion 57$a$ is inserted from the upper side of the through-hole 56$c$ and then moved to the lower end of the through-hole 56$c$ by the force of the assembly operator, or gravity. Here, when the protrusion 57$a$ is positioned at the lower end of the through-hole 56$c$, the relationship L7>L6 restricts the movement of the protrusion 57$a$ in the direction opposite to the direction of insertion into the through-hole 56$c$. When the lower front stay 57 is disposed on the stand 33, a positioning pin 33$b$ of the stand 33 is inserted into the positioning hole 57$b$ of the lower front stay 57. The position of the lower front stay 57 relative to the stand 33 is accordingly determined.

Figure 20:
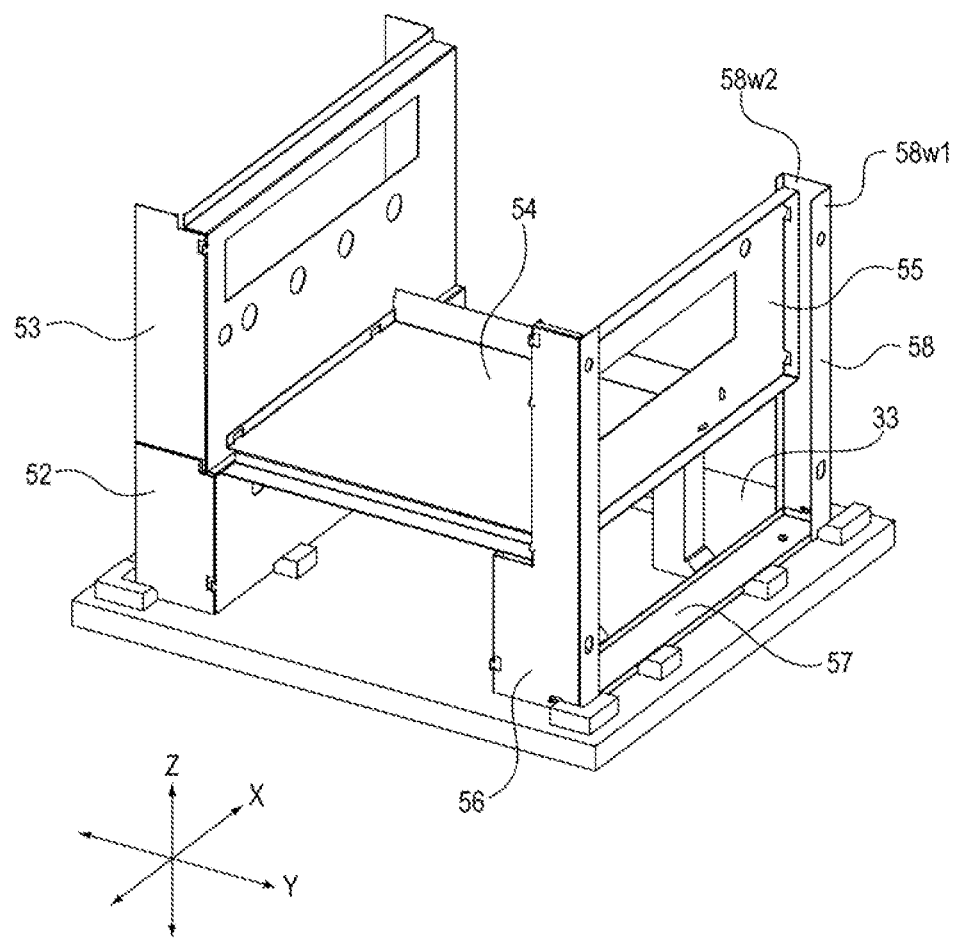
FIG. 20 is a perspective view of when a right column is assembled.

Next, a right column 58 is assembled as illustrated in FIG. 20. The right column 58 is disposed on the stand 33. The front side plate 55 is assembled by being inserted into the right column 58. The right column 58 has a flat portion 58$w$1 that extends parallel to the flat portion 55$w$1 of the front side plate 55, and a flat portion 58$w$2 that is bent substantially vertically from the flat portion 58$w$1 to the front of the image forming apparatus A. The assembly configuration of the right column 58 and the front side plate 55 is the same as the configuration of the left column 56 and the front side plate 55. In other words, a through-hole (not illustrated) that penetrates in the arrow Y direction is formed in the bent part of the boundary between the flat portion 58w1 and the flat portion 58w2 of the right column 58. The protrusion (not illustrated) that is formed in the bent-up portion 55w2 of the front side plate 55 and that protrudes in the direction of insertion (arrow Y direction) into the right column 58 is inserted into this through-hole. Furthermore, the flat portion 58w2 of the right column 58 has a through-hole (not illustrated) that penetrates in the plate thickness direction (arrow X direction) thereof. A projection (not illustrated) that is formed in the bent-up portion 55w2 of the front side plate 55 and that protrudes in the arrow X direction engages with this through-hole. Here, the configuration is obtained by assembling the left column 56 and right column 58 after the front side plate 55 is assembled on the center stay 54, but the order may be such that the front side plate 55 is assembled on the center stay 54 and left column 56 while the left column 56 is placed on the stand 33.

When assembled to this point, the frame 31 is self-standing. In other words, in the process of manufacturing the image forming apparatus A, the front side plate 55, which is the frame 31 on the front side, the right column 58, the left column 56, the lower front stay 57, the rear bottom plate 51 and the rear side plates 52 and 53, which are the frame 31 on the back side, and the center stay 54, which is the frame 31 that connects the front side frame and the rear side frame, are assembled so that the frame 31 becomes self-standing. That is, when the front side frame 31 is the first support, the frame 31 on the back side is the second support, and the frame 31 connecting the first and second supports is the third support, the first support, second support, and third support assembled together in the assembly process are configured to be self-standing.

With this configuration, joining can be performed, in the joining process described subsequently, without using a jig to hold the metal plates constituting the frame 31 one by one. It is thus possible to reduce the number of jigs used in forming the frame 31.

Note that, although this embodiment describes a configuration in which the frame 31 is self-standing at the point when the right column 58 has been assembled, the present invention is not limited to or by this configuration. That is, the frame 31 may also be configured to be self-standing at the point when the other metal plates (described subsequently) have been assembled. In other words, the foregoing advantageous effects can be obtained as long as the configuration enables the frame 31 to be free-standing at the point when the assembly process has ended and the joining process begins.

Figure 21A:
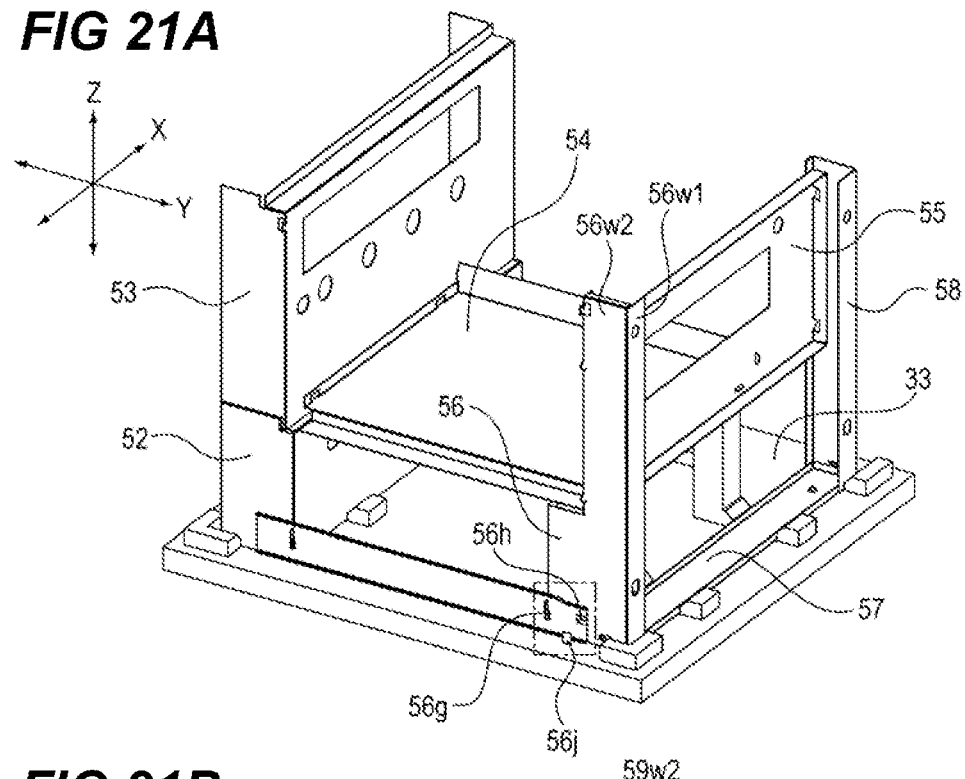
FIG. 21A is a perspective view of when a lower left stay is assembled and FIG. 21B is an enlarged side view of the lower left stay.
Figure 21B:
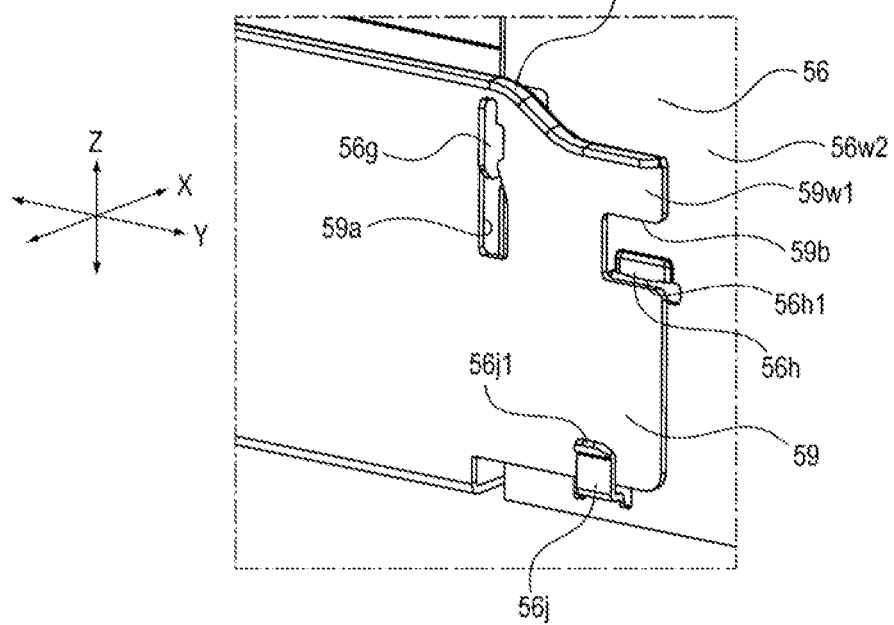

Next, a lower left stay 59 is assembled as illustrated in FIG. 21A and FIG. 21B. The lower left stay 59 has a flat portion 59w1 that extends parallel to the flat portion 56w2 of the left column 56, and a bent-up portion 59w2 that is bent in the plate thickness direction (arrow X direction) of the flat portion 59w1 at the top of the flat portion 59w1. The lower left stay 59 is assembled through mutual insertion into the rear side plate 52 and the left column 56 from the vertical direction. The assembly configuration of the lower left stay 59 and the left column 56 is similar to the assembly configuration of the lower left stay 59 and the rear side plate 52. Therefore, only the assembly configuration of the lower left stay 59 and the left column 56 will be described here.

The flat portion 56w2 of the left column 56 is provided with a protrusion 56g and a stepped bend 56j that protrude in the direction of insertion (arrow Z direction) into the lower left stay 59, and a projection 56h that protrudes in the plate thickness direction (arrow X direction) of the flat portion 56w2. The stepped bend 56j has a part that is bent in the plate thickness direction of the flat portion 56w2, and a part that is bent and extends from that part in the direction of insertion into the lower left stay 59. The distal end of the stepped bend 56j is an inclined portion 56j1 that slopes away from the flat portion 56w2 in the direction of insertion of the left column 56 into the lower left stay 59. Formed in the flat portion 59w1 of the lower left stay 59 are a through-hole 59a that penetrates in the plate thickness direction (arrow X direction) thereof, and a notch 59b that is cut out in the planar direction.

The protrusion 56g of the left column 56 is inserted into and engages with the through-hole 59a formed in the flat portion 59w1 of the lower left stay 59. Here, the width of the protrusion 56g in the arrow Y direction and the width of the through-hole 59a in the arrow Y direction are almost the same. Therefore, the position of the lower left stay 59 relative to the left column 56 in the arrow Y direction is determined by inserting the protrusion 56g into the through-hole 59a.

The stepped bend 56j of the left column 56 is inserted into and engages with the lower end of the flat portion 59w1 of the lower left stay 59. The flat portion 59w1 of the lower left stay 59 is thus sandwiched from the plate thickness direction (arrow X direction) by the stepped bend 56j and the flat portion 56w2 of the left column 56, thereby determining the position of the lower left stay 59 relative to the left column 56 in the arrow X direction.

The projection 56h of the left column 56 also engages with the notch 59b formed in the lower left stay 59. Thus, an edge 56h1 of the projection 56h abuts against the inner wall of the notch 59b, restricting the movement of the left column 56 in the direction opposite to the direction of insertion into the lower left stay 59.

Figure 22A:
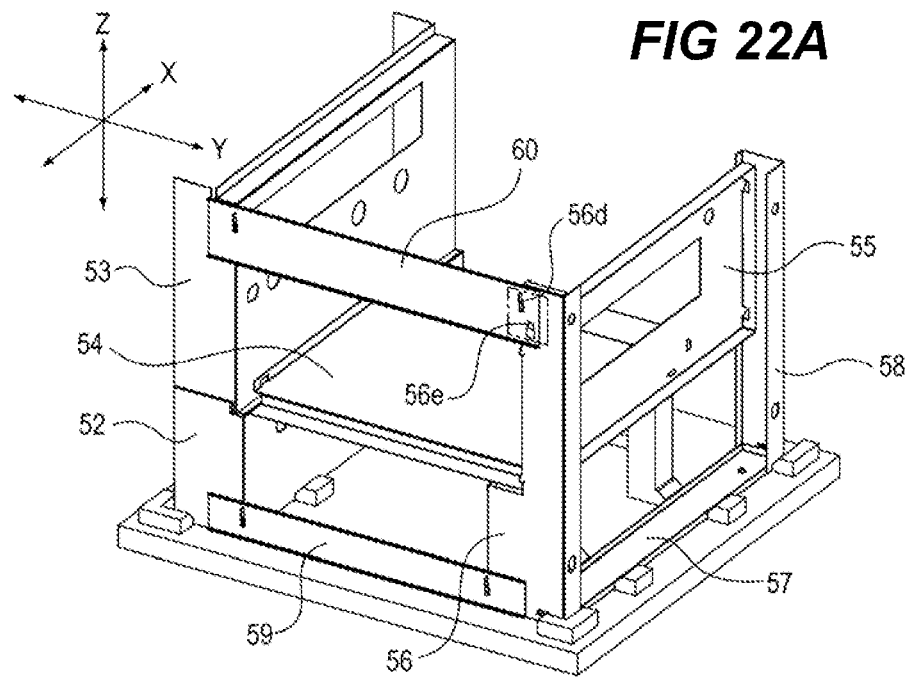
FIG. 22A is a perspective view of when an upper left stay is assembled and FIG. 22B is an enlarged perspective view of the upper left stay.
Figure 22B:
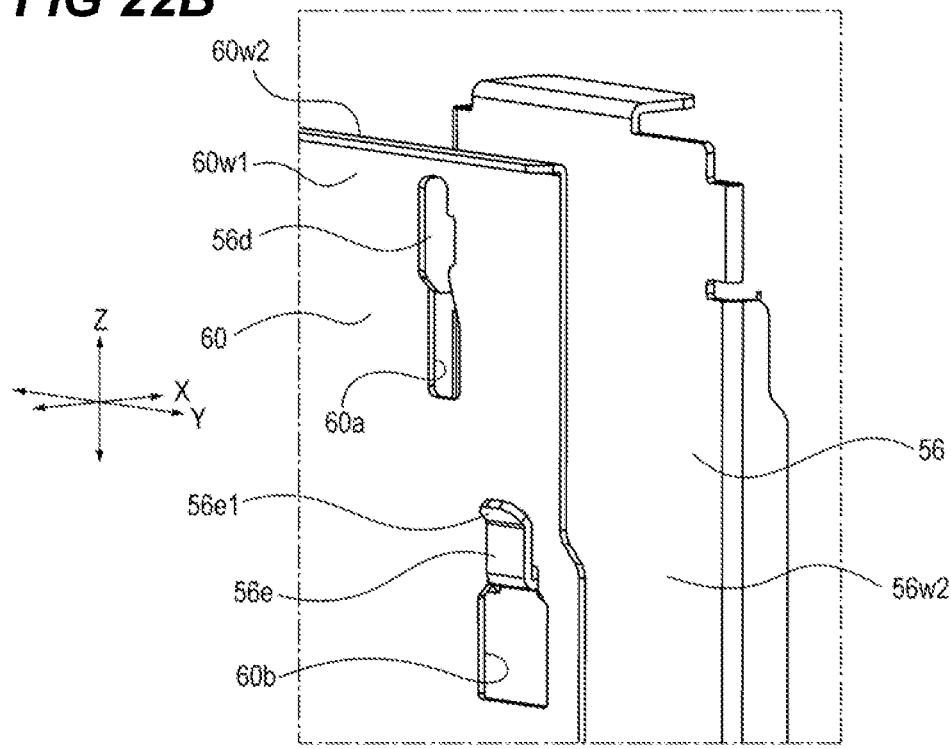

Next, an upper left stay 60 is assembled as illustrated in FIG. 22A and FIG. 22B. The lower left stay 59 is assembled through mutual insertion into the rear side plate 53 and the left column 56 from the vertical direction. The assembly configuration of the upper left stay 60 and the rear side plate 53 is similar to the assembly configuration of the upper left stay 60 and the left column 56. Therefore, only the assembly configuration of the upper left stay 60 and the left column 56 will be described here.

The flat portion 56w2 of the left column 56 is provided with a protrusion 56d that protrudes in the direction of insertion (arrow Z direction) into the upper left stay 60, and a stepped bend 56e. The stepped bend 56e has a part that is bent in the plate thickness direction (arrow X direction) of the flat portion 56w2 of the left column 56, and a part that is bent and extends from that part in the direction of insertion into the upper left stay 60. Further, the distal end of the stepped bend 56e is an inclined portion 56e1 that slopes away from the flat portion 56w2 in the direction of insertion of the left column 56 into the upper left stay 60.

The upper left stay 60 has a flat portion 60w1 that extends parallel to the flat portion 56w2 of the left column 56, and a bent-up portion 60w2 that is bent in the plate thickness direction (arrow X direction) of the flat portion 60w1 at the top of the flat portion 60w1. The flat portion 60w1 of the upper left stay 60 has through-holes 60a and 60b that penetrate in the plate thickness direction thereof (arrow X direction).

The protrusion 56d of the left column 56 is inserted into and engages with the through-hole 60a formed in the flat portion 60w1 of the upper left stay 60. Here, the width of the protrusion 56d in the arrow Y direction and the width of the through-hole 60a in the arrow Y direction are almost the same. Therefore, the position of the upper left stay 60 relative to the left column 56 in the arrow Y direction is determined by inserting the protrusion 56d into the through-hole 60a. The stepped bend 56e of the left column 56 is inserted into and engages with the through-hole 60b of the upper left stay 60. The flat portion 60w1 of the upper left stay 60 is thus sandwiched from the plate thickness direction (arrow X direction) by the stepped bend 56e and the flat portion 56w2 of the left column 56, thereby determining the position of the upper left stay 60 relative to the left column 56 in the arrow X direction.

Figure 23:
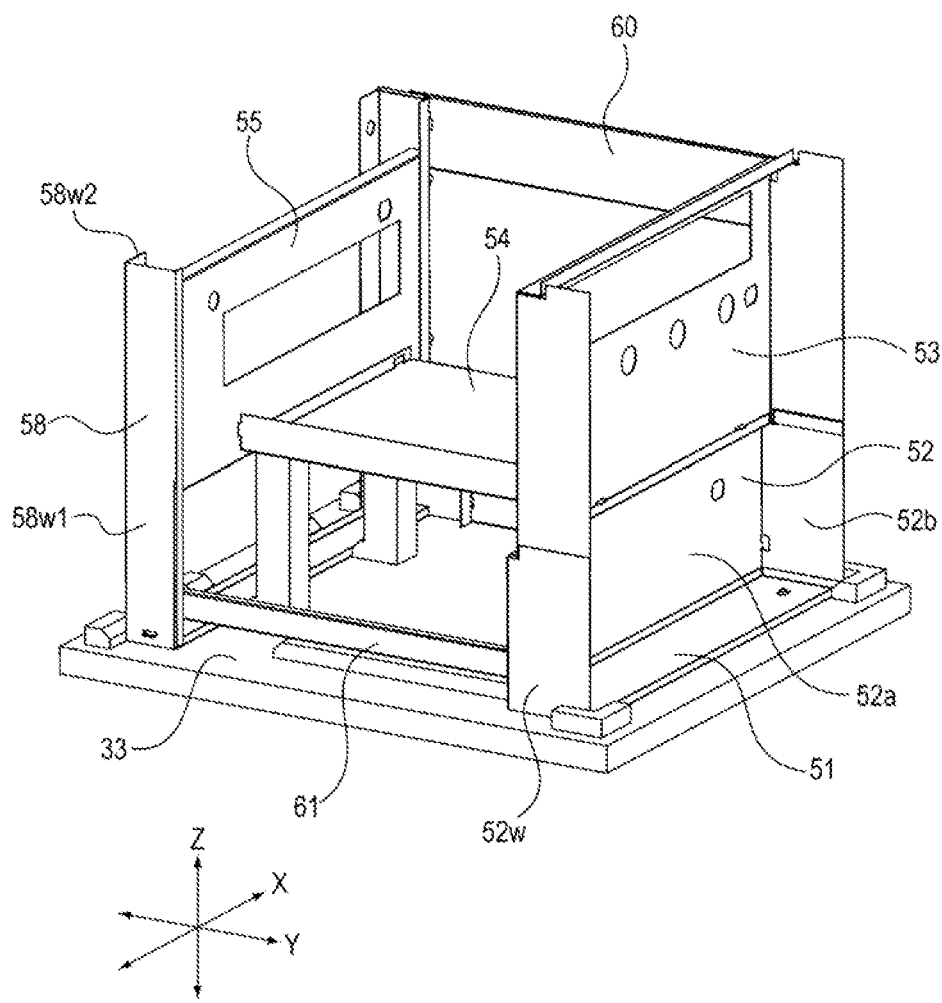
FIG. 23 is a perspective view of when a lower right stay is assembled.

Next, a lower right stay 61 is assembled as illustrated in FIG. 23. The lower right stay 61 is a member that connects the rear side plate 52 and the right column 58 facing each other, and is assembled by being inserted into the rear side plate 52 and the right column 58 from the front side where the right column 58 is located in the horizontal direction (arrow Y direction). The lower right stay 61 is a member that is connected to the right column 58 and the rear side plate 52 so that the interval between the right column 58 and the rear side plate 52 is a predetermined interval, and that guarantees the transportability of the sheet S. Due to the location close to the bottom right corner of the frame 31, the rigidity of the frame 31 is affected. Therefore, it is particularly desirable for the lower right stay 61 to be assembled with high positional accuracy. The assembly configuration of the lower right stay 61 will be described in detail hereinbelow.

Figure 24A:
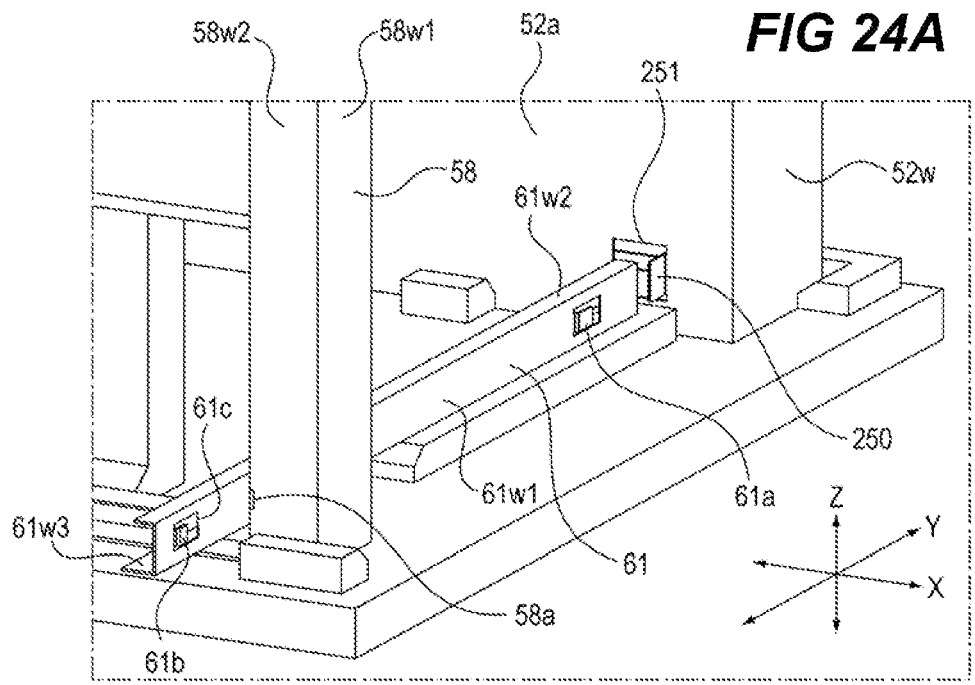
FIG. 24A and FIG. 24B are perspective views of the lower right stay, the rear side plate, and the right column.
Figure 24B:
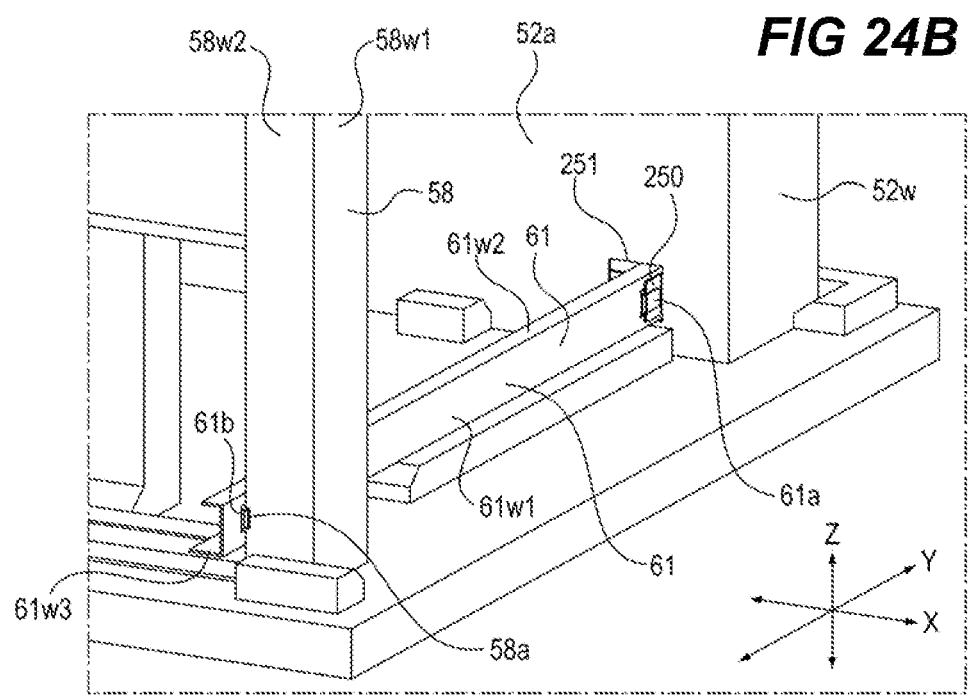
Figure 25A:
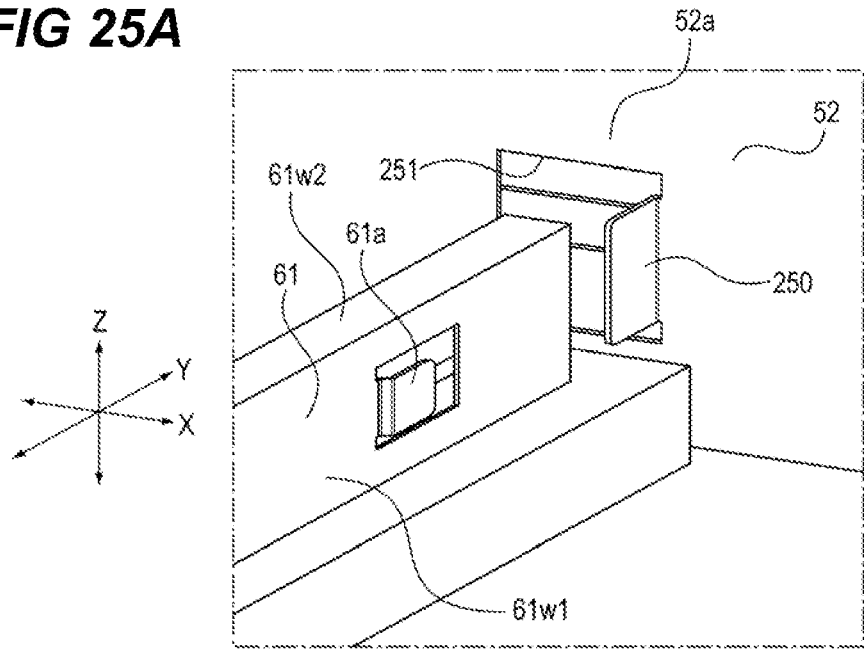
FIG. 25A and FIG. 25B are enlarged perspective views of the engagement between the lower right stay and the rear side plate.
Figure 25B:
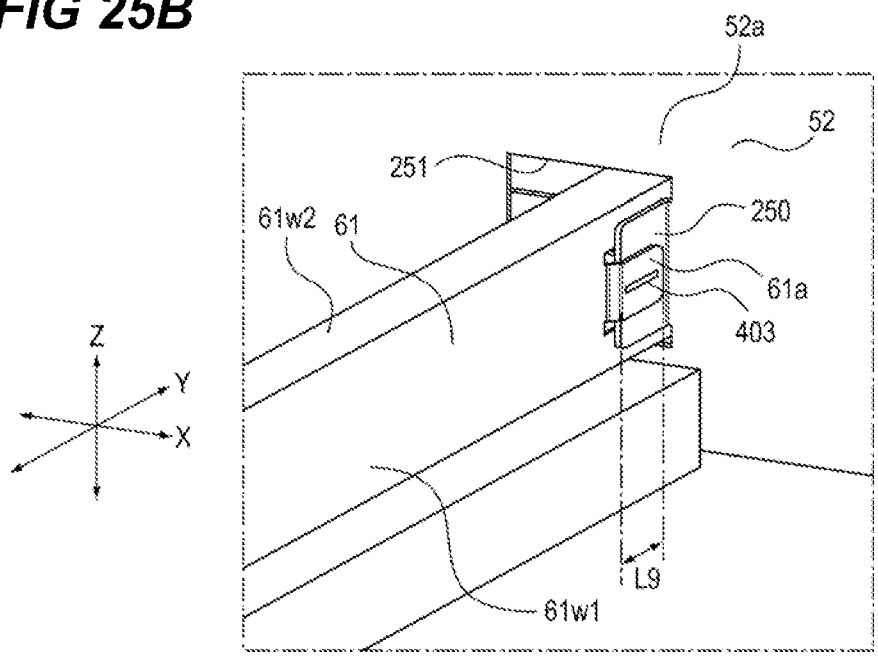
Figure 26A:
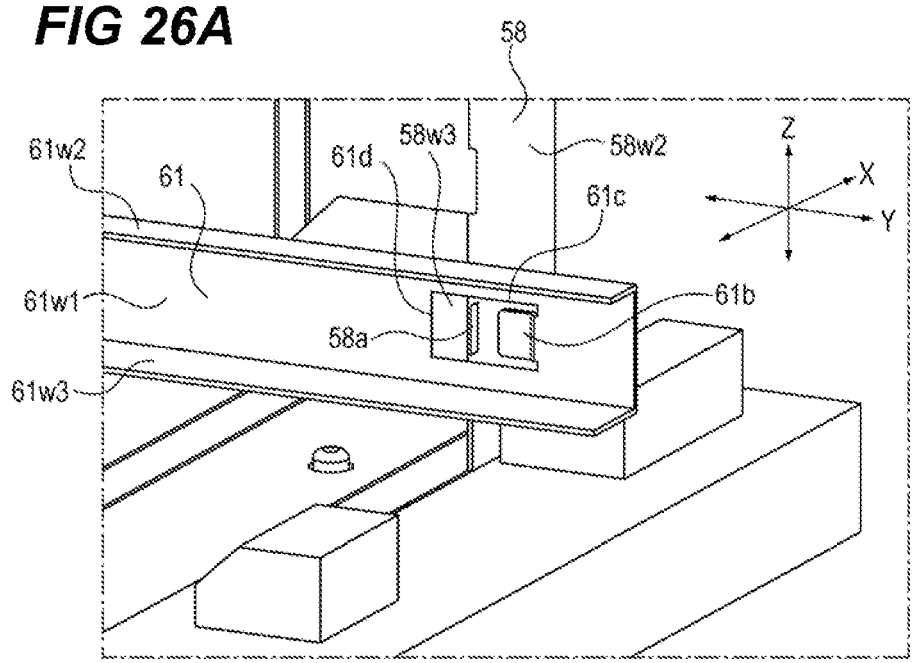
FIG. 26A and FIG. 26B are enlarged perspective views of the engagement between the lower right stay and the right column.
Figure 26B:
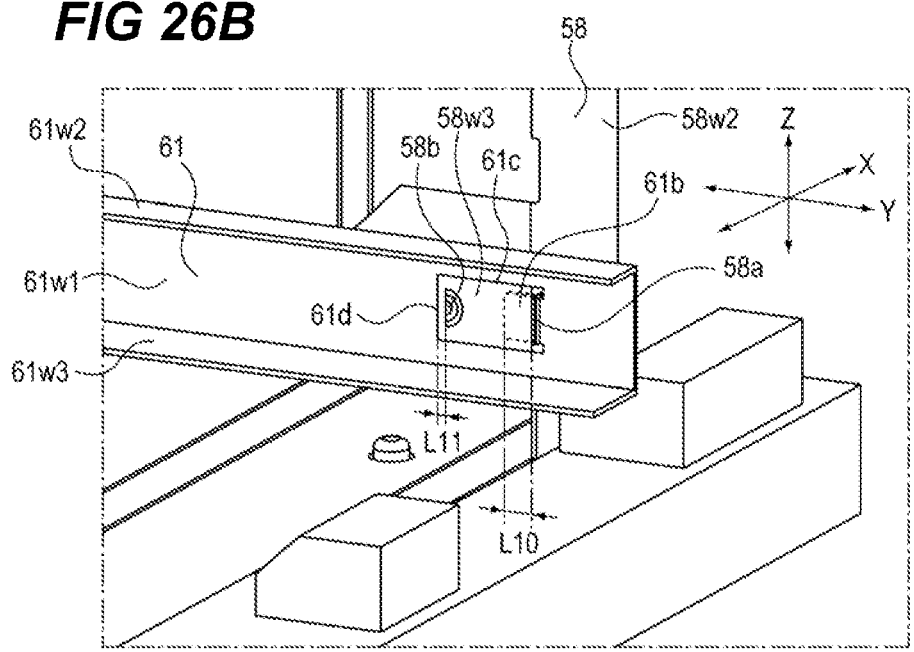

FIG. 24A and FIG. 24B are perspective views of the lower right stay 61, the rear side plate 52, and the right column 58. FIG. 25A and FIG. 25B are enlarged perspective views of the engagement between the lower right stay 61 and the rear side plate 52. FIG. 26A and FIG. 26B are enlarged perspective views of the engagement between the lower right stay 61 and the right column 58. Here, FIG. 24A, FIG. 25A, and FIG. 26A illustrate a state before the lower right stay 61 is assembled, and FIG. 24B, FIG. 25B, and FIG. 26B illustrate states where the lower right stay 61 has been assembled.

First, the assembly configuration of the lower right stay 61 and the rear side plate 52 will be described. As illustrated in FIG. 24A and FIG. 25A, the flat portion 52a of the rear side plate 52 is provided with a bend 250 that is bent up toward the front side in the arrow Y direction. The bend 250 is bent in the plate thickness direction of the flat portion 52a of the rear side plate 52, and is bent in the opposite direction to the bend 52w relative to the flat portrusion 52a. A through-hole 251 is formed around the bend 250 in the flat portion 52a of the rear side plate 52, the through-hole penetrating the flat portion 52a in the plate thickness direction (arrow Y direction). As mentioned earlier, the rear side plate 52 is formed from one metal plate, and the through-hole 251 is a hole formed during machining of the bend 250.

The lower right stay 61 is configured from three flat surfaces and has a U-shaped cross-section. The lower right stay 61 has a flat portion 61w1 that extends substantially parallel to the bend 52w of the rear side plate 52, and a flat portion 61w2 that is bent substantially vertically in the arrow X direction from the flat portion 61w1 at the top of the flat portion 61w1. The lower right stay 61 also has a flat portion 61w3 that is bent at the bottom of the flat portion 61w1 so as to face the flat portion 61w2. The flat portion 61w1 of the lower right stay 61 is provided with a stepped bend 61a that is inserted into and engages with the bend 250 of the rear side plate 52. The stepped bend 61a has a part that is bent in the plate thickness direction (arrow X direction) of the flat portion 61w1 of the lower right stay 61, and a part that is bent and extends from that part in the direction of insertion (arrow Y direction) into the rear side plate 52. The stepped bend 61a is formed by forming a through-hole around the stepped bend 61a when the flat portion 61w2 is processed, and by bending the stepped bend 61a relative to the flat portion 61w2.

When the lower right stay 61 is assembled, the whole of one end of the lower right stay 61 in the arrow Y direction is inserted into the through-hole 251 of the rear side plate 52, and the stepped bend 61a of the lower right stay 61 is inserted into and engages with the bend 250 of the rear side plate 52. As a result, the bend 250 of the rear side plate 52 is sandwiched between the stepped bend 61a and the flat portion 61w1 of the lower right stay 61 from the plate thickness direction (arrow X direction), thereby determining the position of the lower right stay 61 relative to the rear side plate 52 in the arrow X direction (the plate thickness direction of the flat portion 61w1).

The flat portion 61w2, which is the upper surface of the lower right stay 61, and the upper inner wall of the through-hole 251 of the rear side plate 52 face each other with a predetermined interval therebetween, and the weight of the lower right stay 61 causes the flat portion 61w3, which is the lower surface of the lower right stay 61, to make contact with the lower inner wall of the through-hole 251. The position of the lower right stay 61 relative to the rear side plate 52 in the vertical direction (arrow Z direction) is accordingly determined while maintaining a gap corresponding to the predetermined interval.

Next, the assembly configuration of the lower right stay 61 and the right column 58 will be described. As illustrated in FIG. 24A and FIG. 26A, the flat portion 58w2 of the right column 58 has an insertion hole 58a into which the stepped bend 61b of the lower right stay 61 is inserted. Further, the right column 58 has a flat portion 58w3 that extends in the arrow Y direction from around the insertion hole 58a in the flat portion 58w2 to the rear of the image forming apparatus A. The flat portion 58w3 is provided with a projection 58b of a substantially semicircular shape that protrudes in the plate thickness direction (arrow X direction). The projection 58b is formed by a drawing process and is disposed in a position adjacent to the insertion hole 58a in the direction of insertion (arrow Y direction) of the stepped bend 61b into the insertion hole 58a.

The flat portion 61w1 of the lower right stay 61 is also provided with a stepped bend 61b that is inserted into and engages with the insertion hole 58a of the right column 58. The stepped bend 61b has a part that is bent in the plate thickness direction (arrow X direction) of the flat portion 61w1, and a part that is bent and extends from that part in the direction of insertion (arrow Y direction) into the right column 58.

Furthermore, a through-hole 61c is formed around the stepped bend 61b in the flat portion 61w1 of the lower right stay 61, the through-hole penetrating the flat portion 61w1 in the thickness direction. The through-hole 61c is disposed in a position adjacent to the stepped bend 61b in the direction of insertion of the lower right stay 61 into the right column 58. As mentioned earlier, the lower right stay 61 is formed from one metal plate, and the through-hole 61c is a hole formed during machining of the stepped bend 61b.

When the lower right stay 61 is assembled, the stepped bend 61b of the lower right stay 61 is inserted into and engages with the insertion hole 58a of the right column 58, and the projection 58b of the right column 58 engages with the through-hole 61c of the lower right stay 61. Because the stepped bend 61b engages with the insertion hole 58a in this manner, the position of the lower right stay 61 relative to the right column 58 is determined in the arrow X direction, arrow Y direction, and arrow Z direction. Furthermore, the upper surface of the stepped bend 61b and the upper inner wall of the insertion hole 58a face each other with a predetermined interval therebetween, and the lower surface of the stepped bend 61b and the lower inner wall of the insertion hole 58a face each other with a predetermined interval therebetween. The position of the lower right stay 61 relative to the right column 58 in a direction frontward from the rear in the arrow Y direction is accordingly determined. This configuration determines the position of the lower right stay 61 with respect to the right column 58 in the arrow X direction, arrow Y direction, and vertical direction (arrow Z direction) while maintaining a gap corresponding to the predetermined interval.

Note that, in the process of inserting the stepped bend 61b into the insertion hole 58a, the lower right stay 61 rides up by an amount corresponding to the height of the distal end of the projection 58b. At such time, although a force is temporarily applied to the stepped bend 61b in the direction in which the stepped bend 61b opens, the height of the distal end of the projection 58b is set at a height within the range where the stepped bend 61b deforms in the elastic range.

Further, while the lower right stay 61 engages with the rear side plate 52 and the right column 58, the projection 58b abuts against the inner wall 61d of the through-hole 61c, which restricts the movement of the lower right stay 61 in the direction opposite to the direction of insertion into the rear side plate 52 and the right column 58. The direction of insertion of the lower right stay 61 into the rear side plate 52 and the right column 58 is the direction perpendicular to the plane of the flat portion 52a of the rear side plate 52, and is a frontward direction from the rear, in the arrow Y direction. The direction opposite to the direction of insertion of the lower right stay 61 into the rear side plate 52 and the right column 58 is the direction perpendicular to the flat surface of the flat portion 52a of the rear side plate 52, and is the direction frontward from the rear in the arrow Y direction. In other words, in order to remove the lower right stay 61 from the rear side plate 52 and the right column 58, it is necessary to apply two forces to the lower right stay 61, namely, a force in the plate thickness direction of the flat portion 61w1 of the lower right stay 61, and a force in the opposite direction to the direction of insertion of the lower right stay 61 into the rear side plate 52 and the right column 58.

Here, the length (distance) of each part of the lower right stay 61 in the direction of insertion (arrow Y direction) into the rear side plate 52 and the right column 58 is defined as follows. That is, the length of engagement of the stepped bend 61a illustrated in FIG. 25A and FIG. 25B relative to the bend 250 is L9, and the length of engagement in the direction of insertion of the stepped bend 61b illustrated in FIG. 26A into the insertion hole 58a is L10. The distance between the distal end of the projection 58b and the inner wall 61d of the through-hole 61c illustrated in FIG. 26B when the stepped bend 61a engages with the bend 250 and the stepped bend 61b engages with the insertion hole 58a is L11.

At such time, the relationship between L9, L10, and L11 is L9>L11 and L10>L11. As a result, even when the lower right stay 61 moves in the direction opposite to the direction of insertion into the rear side plate 52 and the right column 58, the state of engagement between the stepped bends 61a and 61b, the bend 250, and the insertion hole 58a is maintained at the point when the projection 58b abuts against the inner wall 61d of the through-hole 61c and movement is restricted. Therefore, the lower right stay 61 can be prevented from separating from the rear side plate 52 and the right column 58, thereby preventing deterioration of the positional accuracy of the lower right stay 61, and the rear side plate 52 and right column 58.

In this embodiment, the projection 58b is configured to abut against the inner wall 61d of the through-hole 61c formed during machining of the stepped bend 61b, but the projection 58b may also be configured to abut against the inner wall of another through-hole different from the through-hole 61c. Even in this case, the relationship should be L5>L7 above and L6>L7 above, where L7 is the distance between the distal end of the projection 58b and the inner wall of the other through-hole when the stepped bend 61a engages with the bend 250 and the stepped bend 61b engages the insertion hole 58a. Thus, the lower right stay 61 can be prevented from separating from the rear side plate 52 and the right column 58, thereby preventing deterioration of the positional accuracy of the lower right stay 61, and the rear side plate 52 and right column 58.

Also, by establishing the relationship L9>L10, when the lower right stay 61 is assembled, the engagement of the stepped bend 61a with the bend 250, which is a relatively long length of engagement, takes place first, and the engagement of the stepped bend 61b with the insertion hole 58a, which is a relatively short engagement length, takes place subsequently. By providing this difference in the length of engagement, the order in which the lower right stay 61 is assembled can be determined, thereby improving workability during assembly.

Note that the length of protrusion of one end of the lower right stay 61 in the arrow Y direction, toward the back side from the through-hole 251 in the rear side plate 52, is L12. In this case, the maximum length of engagement in the direction of insertion of the lower right stay 61 into the rear side plate 52 is L12. In other words, the relationship between L9 to L12 is L12>L9>L10>L11.

Next, a rear side plate 62 is assembled as illustrated in FIG. 27. The rear side plate 62 is assembled by being inserted into the rear side plate 53 from the arrow Z direction. The assembly configuration of the rear side plate 62 and the rear side plate 53 is the same as the assembly configuration of the rear side plate 52 and the rear side plate 53, with both assembly configurations involving engagement through mutual insertion. Thus, L8 is larger than L7. As a result, one end of the lower right stay 61 is prevented from falling out of the edge of the through-hole 251 in the rear side plate 52 at the point when the lower right stay 61 moves in the direction opposite to the direction of insertion into the rear side plate 52 and the right column 58, and the projection 58b abuts against the inner wall 61d of the through-hole 61c to restrict the movement. Therefore, the lower right stay 61 can be prevented from separating from the rear side plate 52 and the right column 58, thereby preventing deterioration of the positional accuracy of the lower right stay 61, and the rear side plate 52 and right column 58.

Figure 28A:
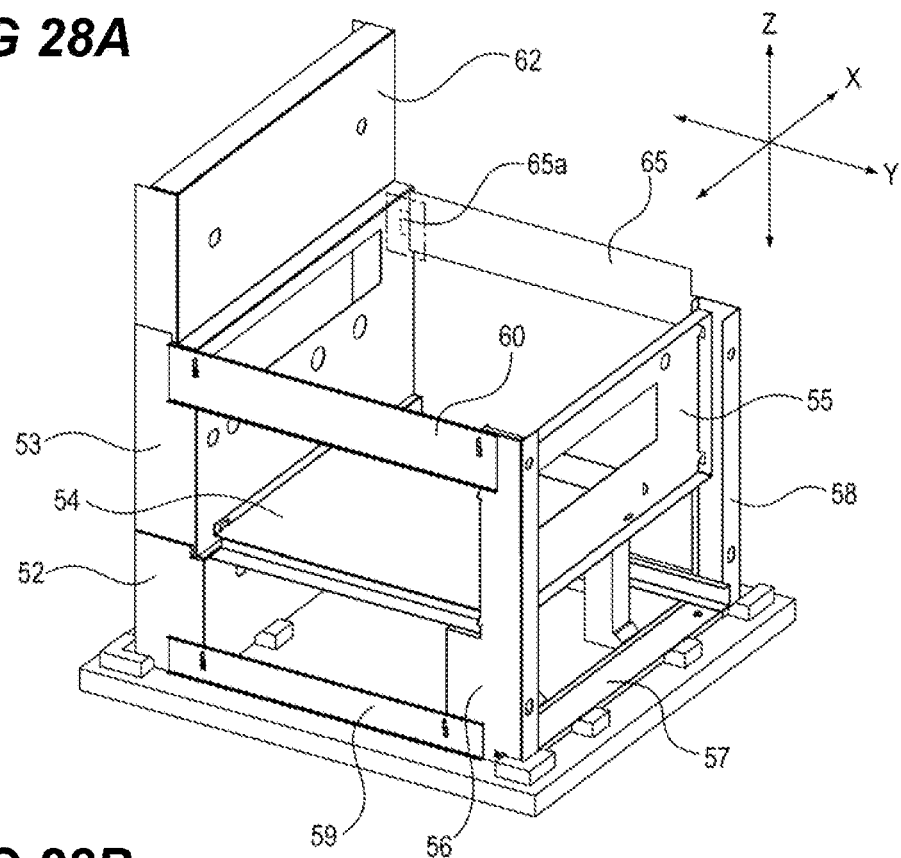
FIG. 28A is a perspective view of when a center right stay is assembled and FIG. 28B is enlarged side view of the center right stay.
Figure 28B:
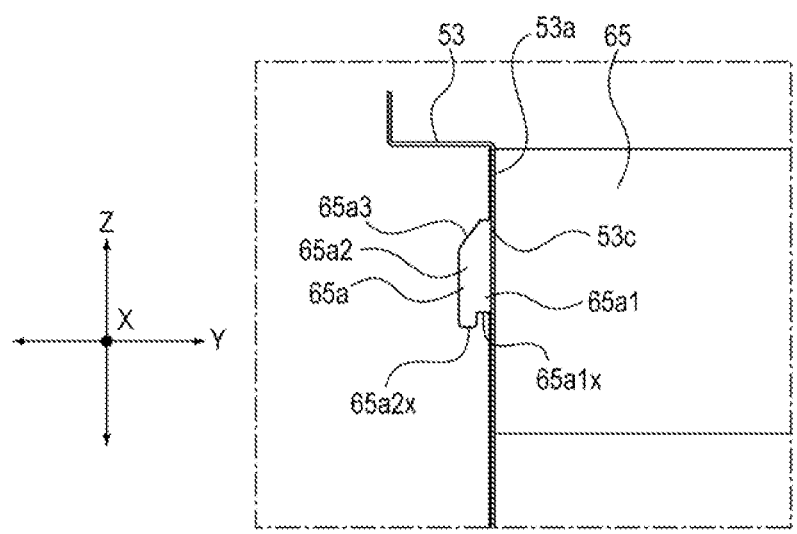

Next, a center right stay 65 is assembled as illustrated in FIG. 28A and FIG. 28B. The center right stay 65 is a plate-shaped member that is formed with one flat surface and that supports a fan that cools the end of the fixing portion 45 in the direction of the rotational axis. The center right stay 65 is assembled by being inserted into the rear side plate 53 and the right column 58. The assembly configuration of the center right stay 65 and the rear side plate 53 is similar to the assembly configuration of the center right stay 65 and the right column 58. Therefore, the assembly configuration of the center right stay 65 and the rear side plate 53 will mainly be described here.

FIG. 29A is an enlarged view of the engagement between the rear side plate 53 and the center right stay 65. FIG. 29B is a front elevation of the center right stay 65. As illustrated in FIG. 29A, the support portion 53a of the rear side plate 53 extends in the vertical direction and has a through-hole 53c that penetrates in the plate thickness direction (arrow Y direction).

Further, the center right stay 65 is provided with a protrusion 65a that protrudes in the direction of insertion (arrow Y direction) into the support portion 53a of the rear side plate 53 and that is inserted into the through-hole 53c in the rear side plate 53 from the arrow Y direction. The center right stay 65 is also provided with a protrusion 65b that protrudes in the direction of insertion (arrow Y direction) into the right column 58 and that is inserted from the arrow Y direction into a through-hole (not illustrated) that penetrates in the plate thickness direction (arrow Y direction) of the right column 58.

The protrusion 65a has a base portion 65a1 that fits into the through-hole 53c, and a hooking portion 65a2 that is provided further on the distal end side in the direction of insertion than the base portion 65a1, and that has its lower end 65a2x located vertically lower than the lower end 65a1x of the base portion 65a1. The protrusion 65a also has an inclined portion 65a3 that slopes down in height from the upper end of the base portion 65a1 toward the upper end of the hooking portion 65a2.

The protrusion 65b is the same shape as the protrusion 65a and is inserted into the through-hole (not illustrated) of the right column 58 in the same way as the protrusion 65a. That is, the protrusion 65b has a base portion 65b1 that fits into the through-hole (not illustrated) of the right column 58, and a hooking portion 65b2 that is provided further on the distal end side in the direction of insertion than the base portion 65b1, and that has its lower end 65b2x located vertically lower than the lower end 65b1x of the base portion 65b1. The protrusion 65b also an inclined portion 65b3 that slopes down in height from the upper end of the base portion 65b1 toward the upper end of the hooking portion 65b2. Note that the right column 58 is a member that extends in the vertical direction and that is located on the opposite side from the rear side plate 53 side in the horizontal direction, and a through-hole (not illustrated) in the right column 58 is also the same shape as the through-hole 53c in the rear side plate 53.

Here, the vertical width L13 of the base portion 65a1 of the protrusion 65a and the vertical width L14 of the through-hole 53c are substantially the same width. Furthermore, the plate thickness of the center right stay 65 and the width L17 of the through-hole 53c in the arrow X direction are substantially the same width. Therefore, the position of the center right stay 65 in the vertical direction (arrow Z direction) relative to the rear side plate 53, and the position of the center right stay 65 in the direction of insertion into the rear side plate 53 and in the direction (arrow X direction) perpendicular to the vertical direction are determined by the fitting of the base portion 65a1 of the protrusion 65a into the through-hole 53c. Here, in this embodiment, the width L13 of the through-hole 53c and the plate thickness of the protrusion 65a of the center right stay 65 are both 0.8 mm. These dimensions are nominal values, and even when the maximum tolerance between parts is 0.06 mm, the width L13 of the through-hole 53c is larger than the plate thickness of the protrusion 65a of the center right stay 65. As a result, even when the tolerance varies during the manufacturing process of the center right stay 65 and the rear side plate 53, the protrusion 65a of the center right stay 63 can be reliably inserted into the through-hole 53c of the rear side plate 53, thereby enabling the position of the center right stay 65 in the arrow X direction relative to the rear side plate 53 to be determined.

The lower end 65a2x of the hooking portion 65a2 protrudes about 2 mm lower than the lower end 65a1x of the base portion 65a1. However, because the upper end of the hooking portion 65a2 is lowered in position by the inclined portion 65a3, the vertical width L13 of the base portion 65a1 of the protrusion 65a and the vertical width L14 of the distal end of the hooking portion 65a2 have the relationship L13>L14. Furthermore, the relationship between the vertical width L13 of the base portion 65a1, the vertical width L14 of the distal end of the hooking portion 65a2, the maximum vertical width L15 of the hooking portion 65a2, and the vertical width L16 of the through-hole 53c is L13≥L15>L14≈L16. In other words, the inclined portion 65a3 makes the vertical width of the hooking portion 65a2 less than or equal to the vertical width of the base portion 65a1.

Figure 30A:
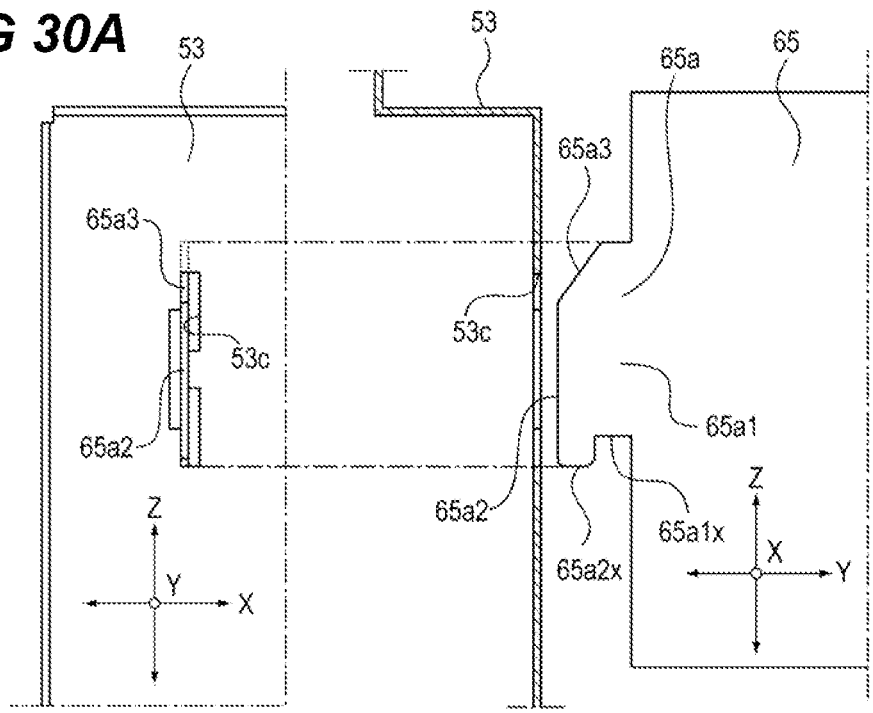
FIG. 30A and FIG. 30B are diagrams illustrating an aspect in which the center right stay is plugged into the rear side plate.
Figure 30B:
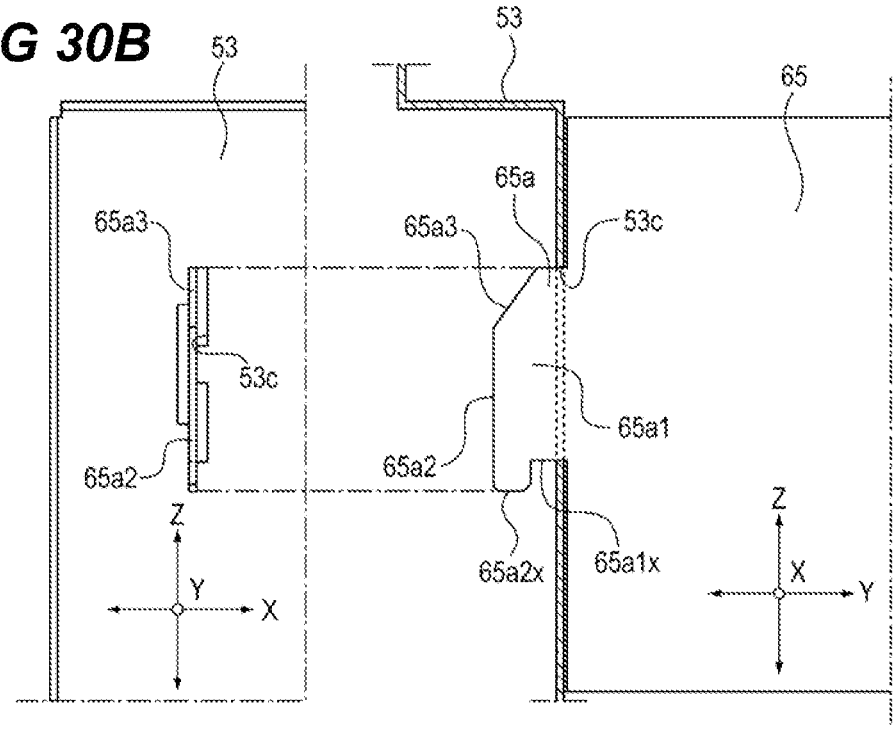

FIG. 30A and FIG. 30B are diagrams illustrating an aspect in which the protrusion 65a of the center right stay 65 is inserted into the through-hole 53c in the rear side plate 53, in the order of FIG. 30A, then FIG. 30B. As illustrated in FIG. 30A and FIG. 30B, when the protrusion 65a is inserted into the through-hole 53c, the hooking portion 65a2, which is the distal end of the protrusion 65a, is inserted first, and then the base portion 65a1 is inserted and the base portion 65a1 is fitted into the through-hole 53c. At such time, the protrusion 65a can be inserted into the through-hole 53c due to the relationship L13≥L15>L14≈L16 described above.

With the base portion 65a1 of the protrusion 65a fitted into the through-hole 53c, the lower end 65a2x of the hooking portion 65a2 is positioned opposite the part lower than the through-hole 53c in the support portion 53a of the rear side plate 53. In this embodiment, the lower end 65a2x of the hooking portion 65a2 protrudes 2 mm downward from the lower end 65a1x of the base portion 65a1 and is spaced 3 mm apart from the opposing portion of the center right stay opposite the support portion 53a of the rear side plate 53. Here, the thickness of the support portion 53a of the rear side plate 53 is about 1 mm, and the length of the base portion 65a1 of the protrusion 65a in the arrow Y direction is longer than the thickness of the support portion 53a of the rear side plate 53. As a result, even when the rear side plate 53 and the center right stay 65 are inclined relative to each other during assembly, the hooking portion 65a2 will hook onto the support portion 53a, and the center right stay 65 will be restricted from moving in the direction opposite to the direction of insertion of the rear side plate 53 into the support portion 53a. Therefore, the center right stay 65 can be prevented from separating from the rear side plate 53, and the center right stay 65 and the rear side plate 53 can be assembled with high positional accuracy. Furthermore, as described above, the assembly configuration of the center right stay 65 and the rear side plate 53 is similar to the assembly configuration of the center right stay 65 and the right column 58, thereby preventing the right stay 65 from separating from the right column 58 and improving the positional accuracy of the center right stay 65 and the right column 58.

Furthermore, because the hooking portion 65a2 of the protrusion 65a protrudes downward in the vertical direction, the hooking of the hooking portion 65a2 into the through-hole 53c is firmer due to the weight of the center right stay 65, making it difficult for the center right stay 65 and the rear side plate 53 to separate. That is, in a configuration where the upper end 65a2y of the hooking portion 65a2 is located vertically higher than the upper end 65a1y of the base portion 65a1 as illustrated in FIG. 31A, the weight of the center right stay 65 does not cause the hooking portion 65a2 to be firmly hooked into the through-hole 53c. The contact between the inclined portion 65a3 and the inner wall of the through-hole 53c also causes the protrusion 65a to be guided under the weight of the center right stay 65 along the shape of the inclined portion 65a3 in the direction opposite to the direction of insertion into the through-hole 53c. Therefore, a configuration in which the hooking portion 65a2 protrudes downward in the vertical direction is preferable.

Although the above advantageous effects can be obtained even when the upper end of the base portion 65a1 and the upper end of the hooking portion 65a2 in the protrusion 65a are stepped, the following advantageous effects are achieved by the provision of the inclined portion 65a3. That is, even when the insertion of the protrusion 65a into the through-hole 53c is lax, when the rear side plate 53 is pressed toward the center right stay 65 during the joining process described subsequently or the like, the center right stay 65 is guided by the inclined portion 65a3 so as to move to the desired position, and the protrusion 65a is inserted into the through-hole 53c. Therefore, providing the inclined portion 65a3 on the protrusion 65a can improve the positional accuracy of the center right stay 65 relative to the rear side plate 53.

Note that, in this embodiment, although the protrusion 65a and the protrusion 65b in the center right stay 65 are the same shape, the present invention is not limited to this configuration. In other words, the protrusion 65b may also be configured without the hooking portion 65b2 or the inclined portion 65b3, as illustrated in FIG. 31B. In this case, it is desirable to make the width L18 of the protrusion 65b in the direction of insertion (arrow Y direction) into the right column 58 longer than the amount of movement (amount of collapse) during assembly assumed for the center right stay 65 and the right column 58. For example, setting the width L18 to 10 mm makes it possible to prevent the center right stay 65 and the right column 58 from separating even when the center right stay 65 moves by a maximum of 5 mm and the right column 58 moves by a maximum of 5 mm.

Next, a right column 63 is assembled as illustrated in FIG. 32. The right column 63 has a flat portion 63w1 that extends parallel to the flat portion 55w1 of the front side plate 55, a flat portion 63w2 that is bent substantially vertically in the arrow Y direction from the flat portion 63w1, and a flat portion 63w3 that is bent substantially vertically from the flat portion 63w2 so as to face the flat portion 63w1. The right column 63 is assembled through mutual insertion into the right column 58.

Figure 33A:
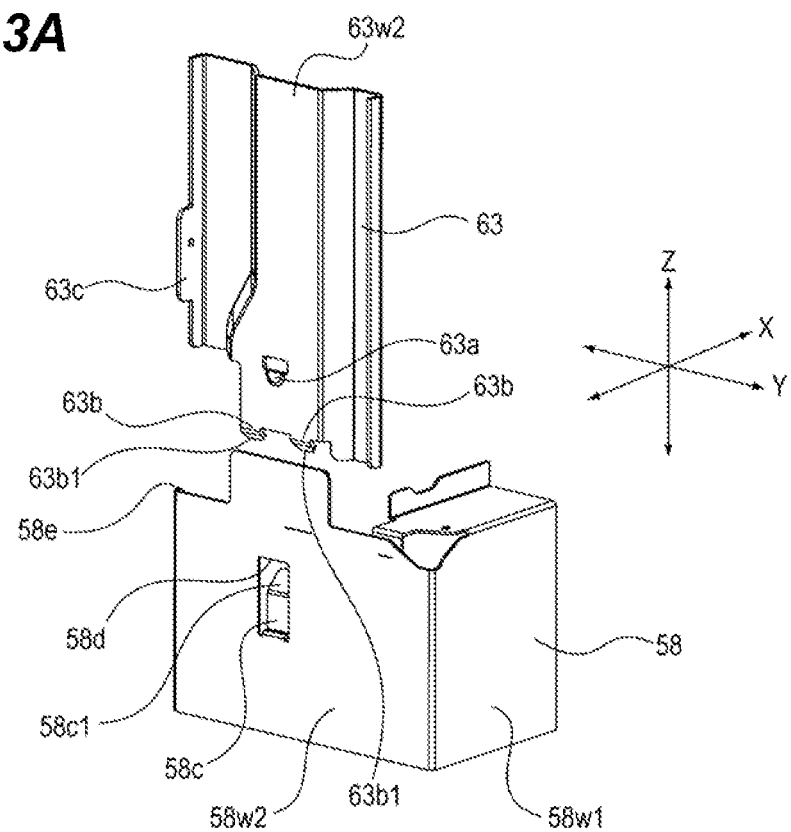
FIG. 33A and FIG. 33B are enlarged perspective views of the engagement between the right column and the right column.
Figure 33B:
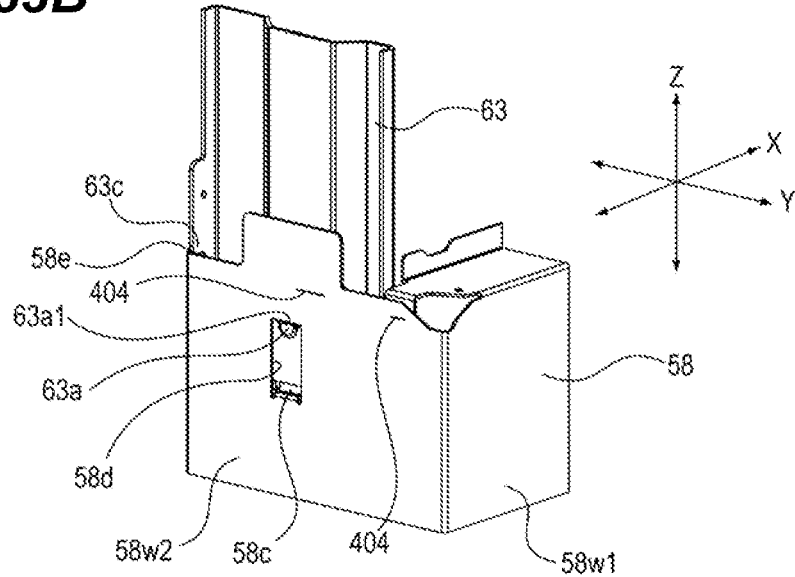
Figure 34A:
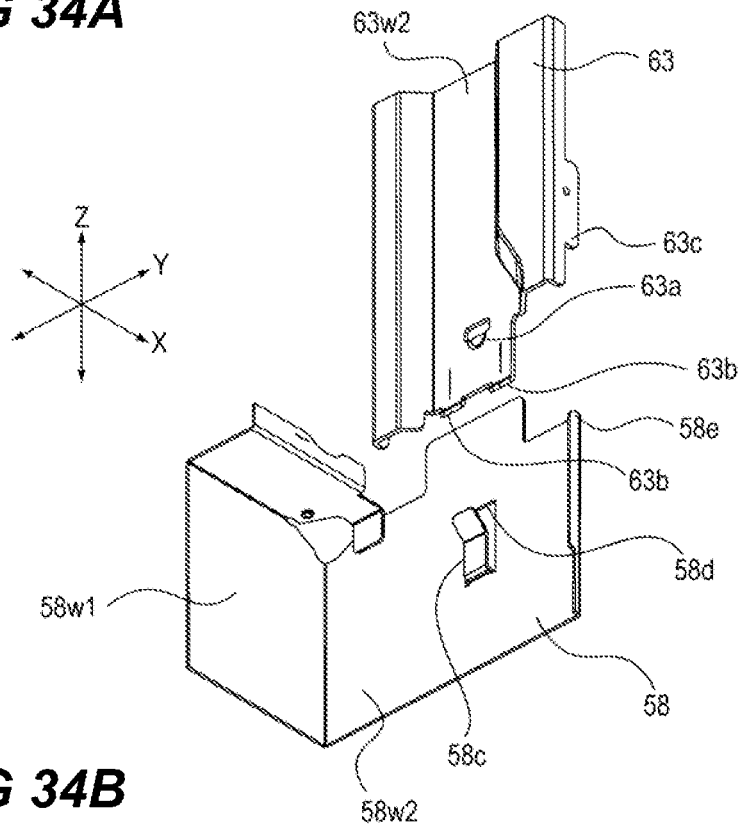
FIG. 34A and FIG. 34B are enlarged perspective views of the engagement between the right column and the right column.
Figure 34B:
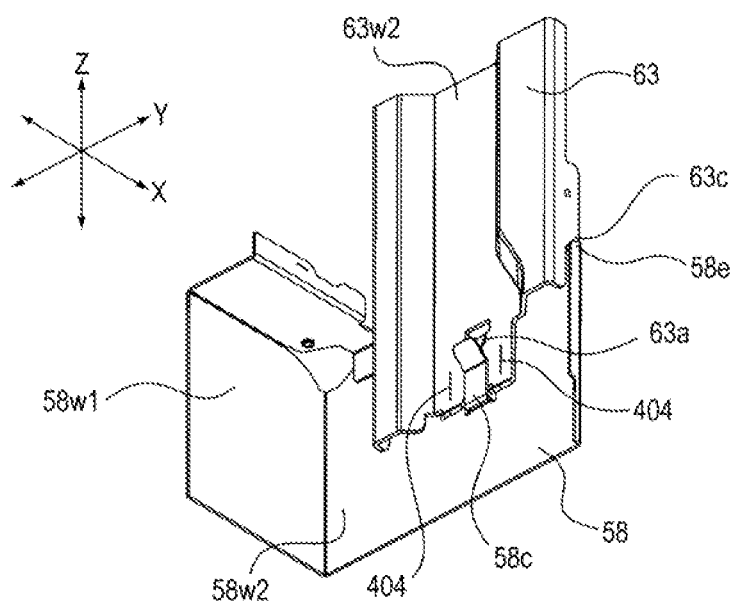

FIG. 33A to FIG. 34B are enlarged perspective views of the engagement between the right column 63 and the right column 58. Here, FIG. 33A and FIG. 34A illustrate the state before the right columns 63 and 58 are assembled, and FIG. 33B and FIG. 34B illustrate the state where the right columns 63 and 58 have been assembled. Furthermore, FIG. 33A and FIG. 33B are diagrams illustrating the right column 63 and the right column 58 from the inside of the image forming apparatus A, and FIG. 34A and FIG. 34B are diagrams illustrating the right column 63 and the right column 58 from the outside of the image forming apparatus A.

As illustrated in FIG. 33A and FIG. 34B, the flat portion 63w2 of the right column 63 is provided with a projection 63a that projects in the plate thickness direction (arrow X direction) of the flat portion 63w2 and two protrusions 63b that protrude in the direction of insertion (arrow Z direction) into the right column 58. Here, the protrusion 63b is provided below the projection 63a in the vertical direction (arrow Z direction). The projection 63a is formed by a drawing process, and the amount of protrusion from the surface of the flat portion 63w2 is about 0.3 mm to 2 mm. The distal end of the protrusion 63b is an inclined portion 63b1 that slopes away from the flat portion 63w2 in the direction of insertion of the right column 63 into the right column 58.

The flat portion 58w2 of the right column 58 has a stepped bend 58c that protrudes in the direction of insertion (arrow Z direction) of the right column 58 into the right column 63. Further, a through-hole 58d that penetrates in the plate thickness direction (arrow X direction) of the flat portion 58w2 is formed in the position adjacent to the stepped bend 58c in the direction of insertion of the right column 58 into the right column 63. As mentioned earlier, the right column 58 is formed from one metal plate, and the through-hole 58d is a hole formed during machining of the stepped bend 58c.

The stepped bend 58c has a part that is bent in the plate thickness direction of the flat portion 58w2, and a part that is bent and extends from that part in the direction of insertion into the right column 63. The distal end of the stepped bend 58c is an inclined portion 58c1 that slopes away from the flat portion 58w2 in the direction of insertion of the right column 58 into the right column 63.

When the right column 63 is assembled on the right column 58, the inclined portion 58c1 of the stepped bend 58c of the right column 58 abuts against the flat portion 63w2 of the right column 63, and the inclined portion 63b1 of the protrusion 63b of the right column 63 abuts against the flat portion 58w2 of the right column 58. As a result, the movement of the right column 63 and right column 58 in the arrow Z direction is guided, and the flat portion 63w2 and the flat portion 58w2 move in a predetermined positional relationship. Furthermore, the lower end of the stopper portion 63c of the right column 63 strikes an abutment portion 58e, which is the upper end of the flat portion 58w2 of the right column 58, restricting the movement of the right column 63 in the direction of insertion (arrow Z direction) into the right column 58.

When the right column 63 is assembled on the right column 58, the stepped bend 58c of the right column 58 is inserted into the flat portion 63w2 of the right column 63 and engages so as to hook onto the lower end of the flat portion 63w2. The flat portion 63w2 of the right column 63 is thus sandwiched from the plate thickness direction (arrow X direction) of the flat portion 63w2 by the stepped bend 58c and the flat portion 58w2 of the right column 58, thereby determining the position of the right column 63 in the arrow X direction relative to the right column 58.

Further, the projection 63a of the right column 63 engages with the through-hole 58d formed in the right column 58. As a result, the edge 63a1 of the projection 63a abuts against the inner wall of the through-hole 58d, restricting the movement of the right column 63 in the direction opposite to the direction of insertion into the right column 58. Here, the through-hole 58d is disposed in a position adjacent to the stepped bend 58c in the direction of insertion of the right column 58 into the right column 63. Therefore, the projection 63a and the stepped bend 58c, which engage with the through-hole 58d, are arranged in positions adjacent to each other in the above direction of insertion.

In this embodiment, the configuration is such that the edge 63a1 of the projection 63a abuts against the inner wall of the through-hole 58d formed during machining of the stepped bend 58c, but the configuration may be such that the edge 63a1 of the projection 63a abuts against the inner wall of another through-hole different from the through-hole 58d. As a result, the movement of the right column 63 in the direction opposite to the direction of insertion into the right column 58 is restricted.

Furthermore, in the plate thickness direction of the flat portion 63w2 and the direction (arrow Y direction) perpendicular to the direction of insertion into the right column 58, the two protrusions 63b of the right column 63 engage with the stepped bend 58c of the right column 58 so as to sandwich the stepped bend 58c. The position of the right column 63 in the foregoing direction perpendicular to the right column 58 is accordingly determined.

In the vicinity of the stepped bend 58c, which causes the flat portion 63w2 of the right column 63 to engage with the flat portion 58w2 of the right column 58, a projection 63a, which regulates the movement of the right column 63 in the direction opposite to the direction of insertion into the right column 58, is provided. As a result, the right column 63 moves in the direction opposite to the direction of insertion into the right column 58, thereby preventing separation of the right column 63 and the right column 58, and deterioration of the positional accuracy. Therefore, the right column 63 and the right column 58, which constitute the frame 31, can be assembled with high positional accuracy.

Figure 35A:
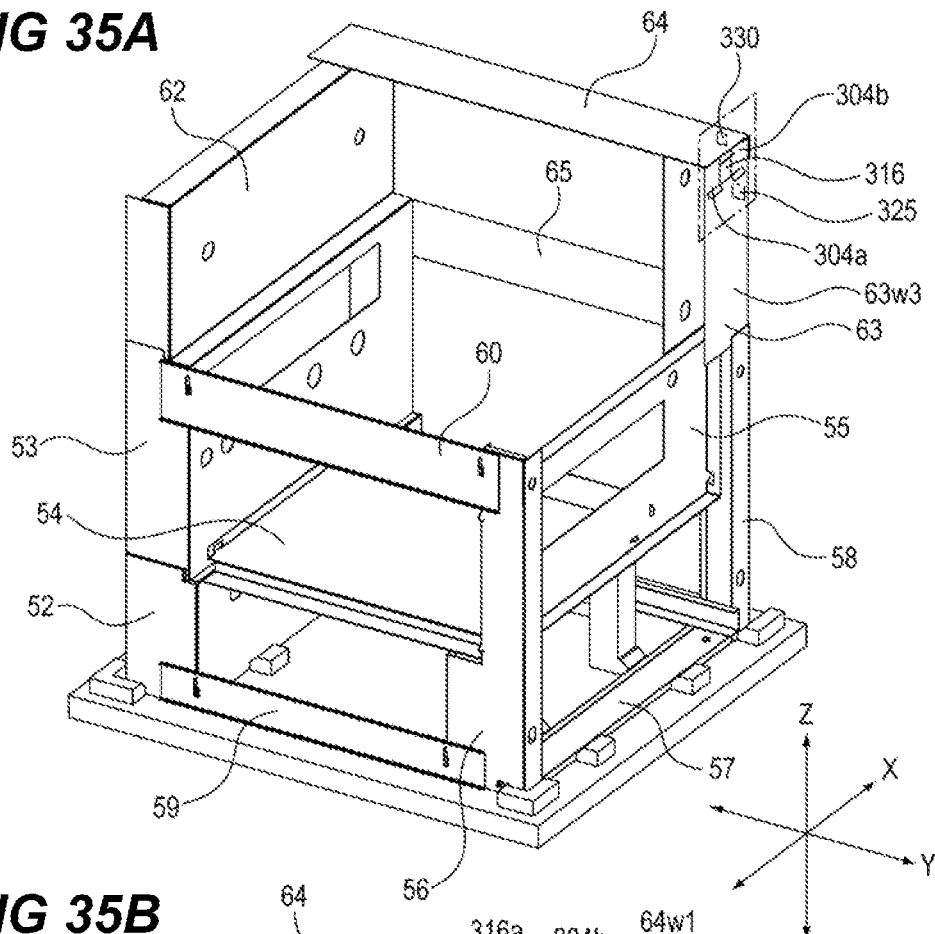
FIG. 35A is a perspective view of when an upper right stay is assembled and FIG. 35B is an enlarged view of the upper right stay.
Figure 35B:
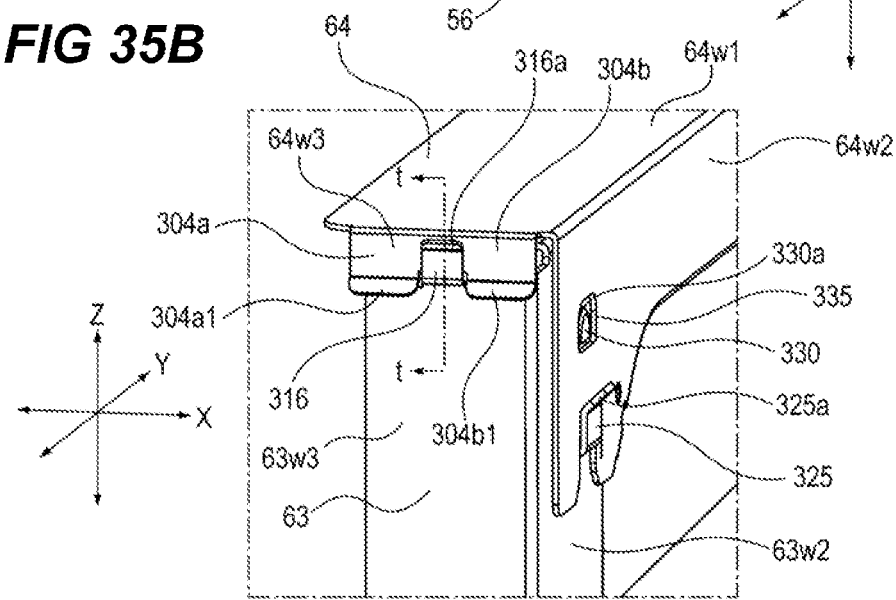

Next, an upper right stay 64 is assembled as illustrated in FIG. 35A and FIG. 35B. The upper right stay 64 has a flat portion 64w1 that extends horizontally, a flat portion 64w2 in which one end of the flat portion 64w1 in the arrow X direction is bent substantially vertically in the vertical direction, and a flat portion 64w3 in which one end in the arrow Y direction is bent substantially vertically in the vertical direction. The upper right stay 64 also has a flat portion (not illustrated) where the other end of the flat portion 64w1 in the arrow Y direction is bent substantially vertically in the vertical direction. The upper right stay 64 is assembled through mutual insertion into the rear side plate 62 and the right column 63. The assembly configuration of the upper right stay 64 and the rear side plate 62 is similar to the assembly configuration of the upper right stay 64 and the right column 63. Therefore, only the assembly configuration of the upper right stay 64 and the right column 63 will be described here.

The flat portion 64w3 of the upper right stay 64 is configured from three bends 304a, 304b, and 304c that are bent from the flat portion 64w1 toward the direction of insertion (arrow Z direction) into the right column 63. That is, when the flat portion 64w3 is divided into three parts in the arrow X direction, the bends 304a, 304b, and 304c are produced. The bend 304c is disposed in a position between the bends 304a and 304b in the arrow X direction, and the length of the bend 304c in the arrow Z direction is shorter than the length of the bends 304a and 304b in the arrow Z direction (see FIG. 36A and FIG. 36B). Further, the lengths of the bends 304a and 304b in the arrow Z direction are the same, and the distal ends of the bends 304a and 304b are inclined portions 304a1 and 304b1, which slope away from the flat portion 64w1 relative to the direction of insertion into the right column 63.

The flat portion 63w3 of the right column 63 is provided with a stepped bend 316 that protrudes in the direction of insertion (vertical direction, arrow Z direction) into the upper right stay 64 and that inserted into and engages with the upper right stay 64 so as to overlap the bend 304c of the upper right stay 64 in the plate thickness direction (arrow Y direction) of the flat portion 63w3. The flat portion 63w2 of the right column 63 is also provided with a stepped bend 325 that protrudes in the direction of insertion into the upper right stay 64 and that is inserted into and engages with the flat portion 64w2 so as to overlap the flat portion 64w2 of the upper right stay 64 in the plate thickness direction (arrow X direction) of the flat portion 63w2. The flat portion 63w2 of the right column 63 is also provided with a projection 330 that protrudes in the plate thickness direction (arrow X direction).

The stepped bend 316 has a part that is bent in the plate thickness direction (arrow Y direction) of the flat portion 63w3 of the right column 63, and a part that is bent and extends from that part in the direction of insertion (arrow Z direction) into the upper right stay 64. Furthermore, the distal end of the stepped bend 316 is formed by further bending from the part of the stepped bend 316 that is bent in the direction of insertion into the upper right stay 64, and becomes an inclined portion 316a that slopes away from the flat portion 63w3 in the direction of insertion into the upper right stay 64.

The stepped bend 325 has a part that is bent in the plate thickness direction (arrow X direction) of the flat portion 63w2 of the right column 63, and a part that is bent and extends from that part in the direction of insertion (arrow Z direction) into the upper right stay 64. The distal end of the stepped bend 325 is also formed by further bending from the part of the stepped bend 325 that is bent in the direction of insertion into the upper right stay 64, and becomes an inclined portion 325a that slopes away from the flat portion 63w2 in the direction of insertion into the upper right stay 64.

When the stepped bend 316 engages with the bend 304c of the upper right stay 64 and the bends 304a and 304b engage with the flat portion 63w3 of the right column 63, the stepped bend 316 and the bends 304a and 304b engage with each other in the direction of insertion of the right column 63 and upper right stay 64 and the direction (arrow X direction) perpendicular to the plate thickness direction. Specifically, the bend 304a engages with the flat portion 63w3 of the right column 63 in a position adjacent to the stepped bend 316 in the arrow X direction. The bend 304b also engages with the flat portion 63w3 of the right column 63 in the arrow X direction in a position opposite to the side where the bend 304a is disposed with respect to the stepped bend 316 and adjacent to the stepped bend 316.

The projection 330 of the right column 63 engages with the through-hole 335 that is formed in the flat portion 64w2 of the upper right stay 64 and that penetrates through the plate thickness direction (arrow X direction) of the flat portion 64w2. Thus, an edge 330a of the projection 330 abuts against the inner wall of the through-hole 335, restricting the movement of the upper right stay 64 in the direction opposite to the direction of insertion into the right column 63.

Figure 36A:
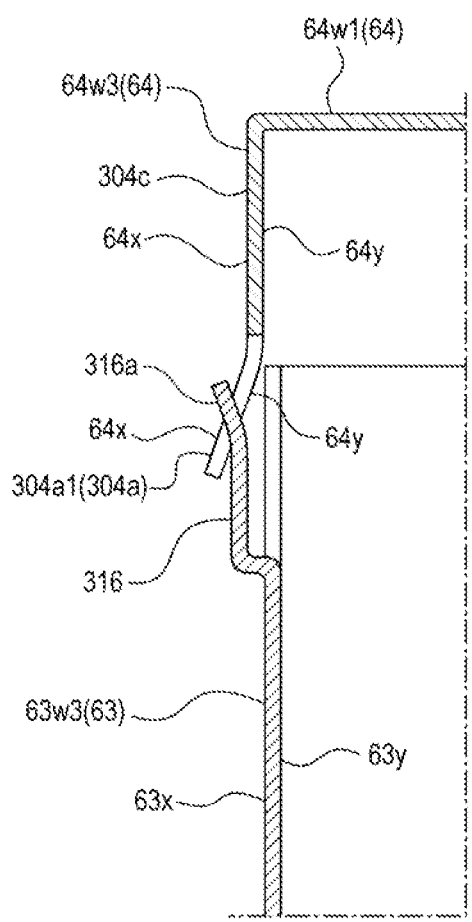
FIG. 36A and FIG. 36B are diagrams illustrating an aspect in which the upper right stay is assembled.
Figure 36B:
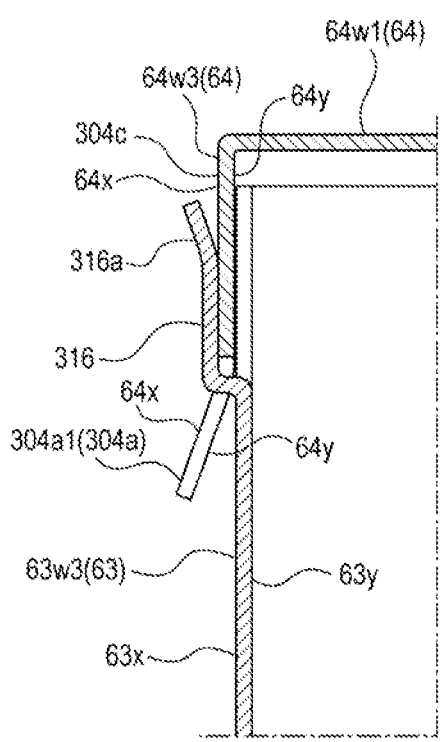

FIG. 36A and FIG. 36B are cross-sectional views of the right column 63 and the upper right stay 64 cut at the t-t cross-section illustrated in FIG. 35B, and illustrating an aspect in which the upper right stay 64 is assembled on the right column 63, in the order of FIG. 36A, then FIG. 36B. Note that, because the inclined portion 304a1 of the bend 304a and the inclined portion 304b1 of the bend 304b have the same function, only the function of the inclined portion 304a1 of the bend 304a will be described here.

As illustrated in FIG. 36A and FIG. 36B, when the bend 304a engages with the flat portion 63w3 of the right column 63, the inclined portion 304a1 of the bend 304a makes contact with the flat portion 63w3 and guides the upper right stay 64 to a position where a first surface 63x of the right column 63 of the flat portion 63w3 and a second surface 64y of the upper right stay 64 of the bend 304a face each other.

Furthermore, when the stepped bend 316 engages with the bend 304c of the upper right stay 64, the inclined portion 316a of the stepped bend 316 makes contact with the bend 304c and guides the right column 63 to the position where the first surface 64x of the upper right stay 64 of the bend 304c and the second surface 63y of the right column 63 of the stepped bend 316 face each other.

Due to this configuration, the flat portion 64w1 of the right column 63 and a closed portion 63w3 of the upper right stay 64 are assembled by firmly engaging with each other. In addition, because the flat portion 64w1 of the right column 63 and the closed portion 63w3 of the upper right stay 64 are assembled through engagement of a bend and a plate portion instead of by engagement by a through-hole and a protrusion, there is no need to provide an extra mating gap, and the positional accuracy between the metal plates can be improved. It is thus possible to achieve both ease of assembly and improved positional accuracy of the two metal plates constituting the frame.

Furthermore, when the upper right stay 64 is assembled, the inclined portion 316a of the stepped bend 316 and the inclined portions 304a1 and 304b1 of the bends 304a and 304b guide the upper right stay 64 and the right column 63. It is thus easier to assemble the upper right stay 64 so that the positional relationships between the first surface 64x and second surface 64y of the upper right stay 64, and between the first surface 63x and second surface 63y of the right column 63 are accurate. It is thus possible to prevent the upper right stay 64 and the right column 63 from being assembled with the wrong positional relationship.

As described hereinabove, each of the metal plates constituting the frame 31 is assembled. The frame 31 assembled in the assembly process as described above is configured to be self-standing. Therefore, by grasping the rear side plate 52, left column 56, right column 58, and the like, of the frame 31 and lifting the frame 31, the frame 31 can be removed from the stand 33.

<Process for Joining Frame>

Next, the process for joining the frame 31 assembled in the foregoing assembly process will be described.

Figure 37:
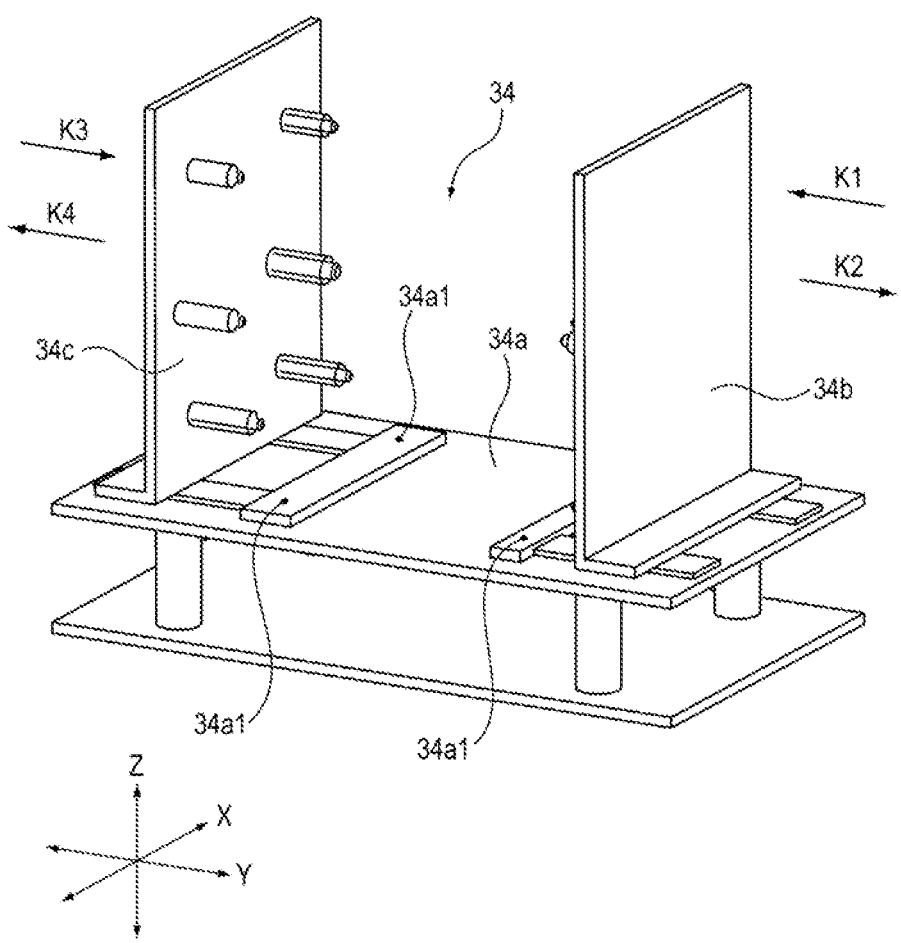
FIG. 37 is a perspective view of a jig that is used to join the frame.

FIG. 37 is a perspective view of a jig 34 that is used to join the frame 31. As illustrated in FIG. 37, the jig 34 has a base 34a, a front side support portion 34b, and a rear side support portion 34c. A positioning pin 34a1 is provided on the base 34a. The front side support portion 34b and the rear side support portion 34c are configured to slide and move with respect to the base 34a. The front side support portion 34b is capable of sliding and moving in the direction of arrows K1 and K2, and the rear side support portion 34c is capable of sliding and moving in the direction of arrows K3 and K4.

Figure 38:
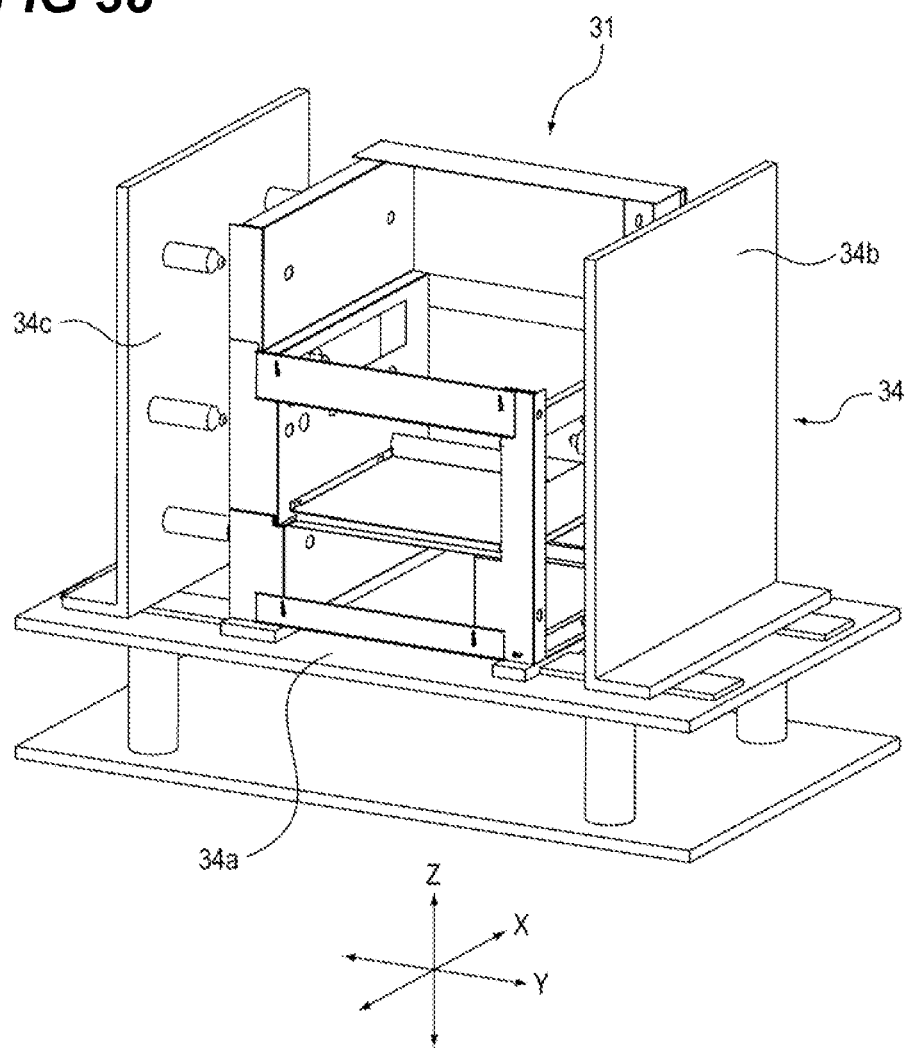
FIG. 38 is a perspective view of the frame and the jig.

FIG. 38 is a perspective view of the frame 31 and jig 34 assembled in the assembly process described above. As illustrated in FIG. 38, after the assembly process, the frame 31 is removed from the stand 33 and placed on the base 34a of the jig 34. At such time, the positioning pin 34a1 of the base 34a is inserted into the positioning hole 51a of the rear bottom plate 51 of the frame 31 and the positioning hole 57b of the lower front stay 57, thereby determining the position of the frame 31 relative to the base 34a.

Figure 39:
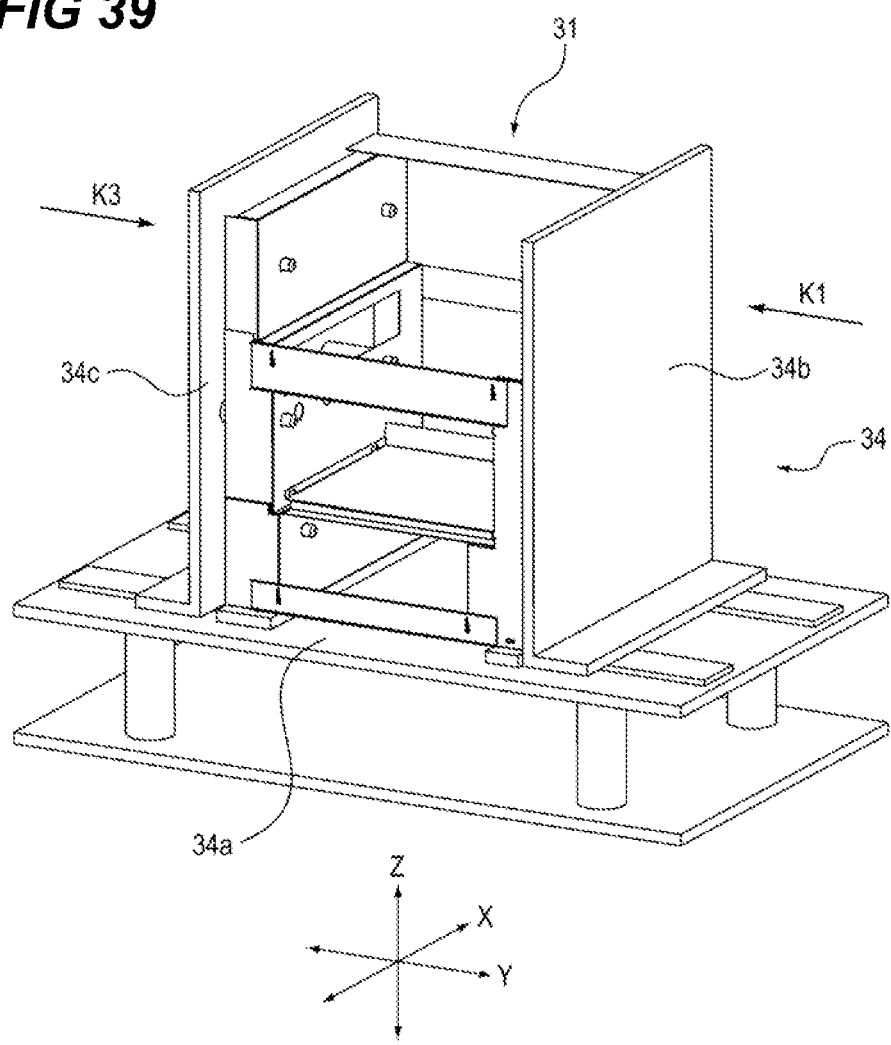
FIG. 39 is a perspective view of the frame and the jig.

As illustrated in FIG. 39, when joining the frame 31, the front side support portion 34b is moved by being slid in the arrow K1 direction and the rear side support portion 34c is moved by being slid in the arrow K3 direction by the operator performing the joining process. Further, the frame 31 is pressed, by a pressing device (not illustrated), from the sliding direction of the front side support portion 34b and the rear side support portion 34c, and a direction perpendicular to the vertical direction. As a result, the metal plates constituting the frame 31 are pressed against each other, eliminating unnecessary gaps between the metal plates, and completing the positioning. In other words, in the configuration of this embodiment, because the frame 31 is self-standing during the assembly process, joining can be performed with a small number of jigs, without having to use jigs to hold each of the metal plates constituting the frame 31 one by one.

Thereafter, each of the metal plates constituting the frame 31 is joined through fiber laser welding by the operator. Here, when welding is performed, when the interval between the welding parts of the two metal plates to be welded is too wide, the molten metal volume will be insufficient and the joining force after welding will be weak. For example, when one of the two metal plates collapses in the plate thickness direction and changes its posture, the interval between the two metal plates in the plate thickness direction may become wider. Hereinbelow, the configuration for suppressing such a reduction in the joining force will be described using the welding of the rear side plate 52 and the rear side plate 53 as an example.

As illustrated in FIG. 12A and FIG. 12B, the bend 52b of the rear side plate 52 and the bend 53b of the rear side plate 53 mutually restrict each other from falling in the plate thickness direction (arrow X direction) and changing posture due to the stepped bend 313 of the bend 52b abutting against the bend 53b and the protrusions 301a and 301b of the bend 53b abutting against the bend 52b. That is, in the bends 52b and 53b, the dimensions of the interval in the plate thickness direction are easily guaranteed in the vicinity of the stepped bend 313 and the protrusions 301a and 301b. Also, in moving away from such parts, the interval between such parts in the plate thickness direction tends to deviate from the originally set interval.

Therefore, in this embodiment, the welding of the bend 52b of the rear side plate 52 and the bend 53b of the rear side plate 53 is performed at three positions, namely, the stepped bend 313 of the bend 52b, and the protrusions 301a and 301b of the bend 53b. Welding portions 130a, 130b, and 130c are the positions where the bend 52b and bend 53b are welded. With this configuration, welding can be performed in the region where the interval in the plate thickness direction between the bend 52b and the bend 53b is guaranteed, and the joining force can be preventing from decreasing due to insufficient molten metal volume.

Note that, in this embodiment, although welding is performed in the foregoing three positions, the foregoing advantageous effects can be obtained by welding in at least one position among the stepped bend 313 of the bend 52b and the protrusions 301a and 301b of the bend 53b. In other words, the welding points may be suitably changed according to the strength required of the frame 31. However, in a configuration where welding is performed in the two positions of the protrusions 301a and 301b of the bend 53b, the stress is preferably distributed when force is applied to the frame 31, making it easier to reduce the risk of rupture. Also, by making the weld lengths of the welding portions 130a, 130b, and 130c the same length, the strength after welding can be made uniform, thereby reducing the risk of rupture due to a concentration of stress.

The same advantageous effects as above can also be obtained by using a configuration in which welding is performed in the vicinity of the stepped bend 313 of bend 52b and the protrusions 301a and 301b of bend 53b. For example, when an electrogalvanized steel plate with a thickness of 0.5 mm to 2.0 mm is used as the rear side plates 52 and 53, the interval of the welding part in the plate thickness direction must be 0.3 mm or less in order to guarantee the joining force after welding. The region where the interval in the plate thickness direction between the bend 52b and bend 53b is guaranteed to be 0.3 mm or less is a range of radius of 50 mm from the position where the stepped bend 313 abuts against the bend 53b, or the position where the protrusions 301a and 301b abut against the bend 52b. Therefore, as illustrated in FIG. 40, welding portions 400a and 400b are provided in a position adjacent to the stepped bend 313, which is within a radius of 50 mm from the above-mentioned abutment position. As a result, a lack of molten metal volume and a decrease in the joining force after welding can be prevented.

Figure 8A:
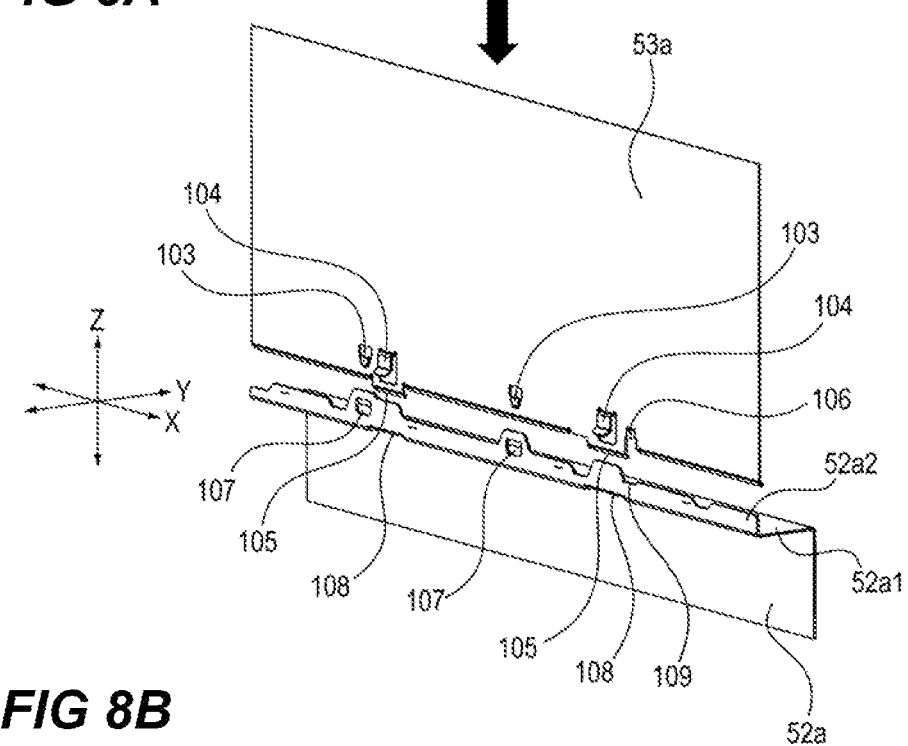
FIG. 8A and FIG. 8B are perspective views of a support portion of the rear side plate.
Figure 8B:
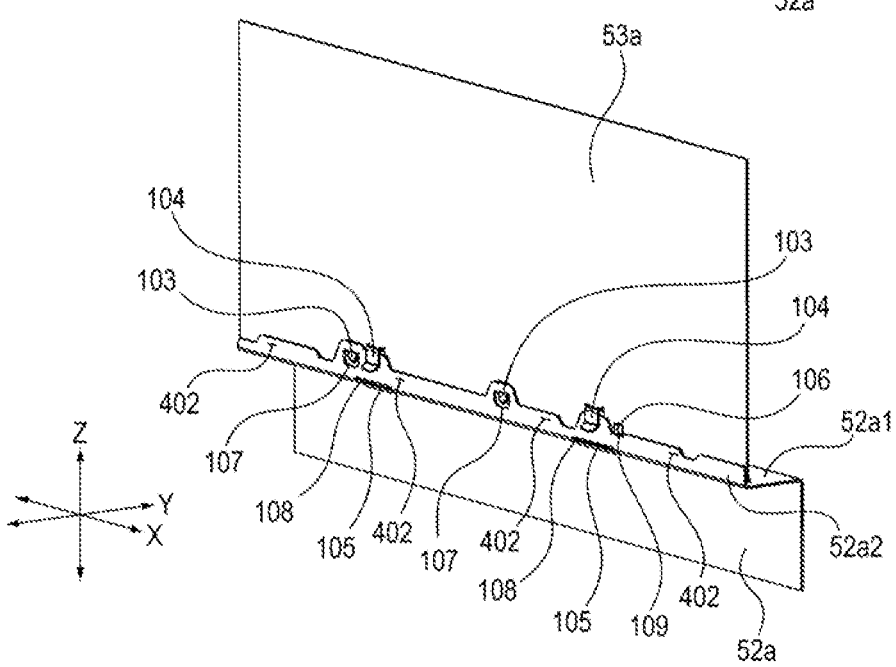
Figure 9A:
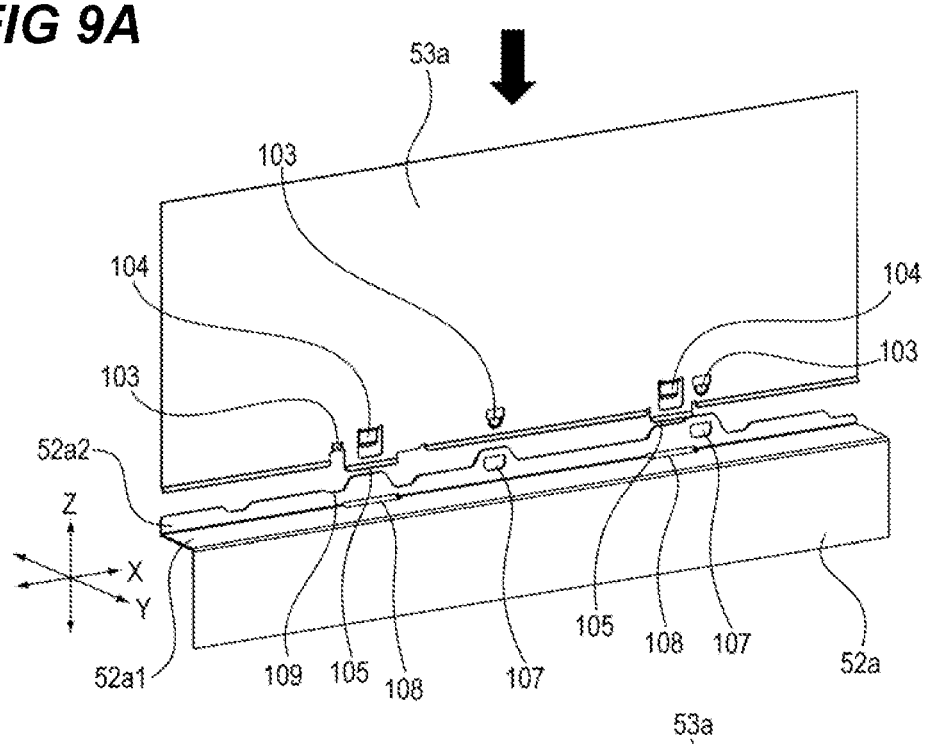
FIG. 9A and FIG. 9B are perspective views of the support portion of the rear side plate.
Figure 9B:
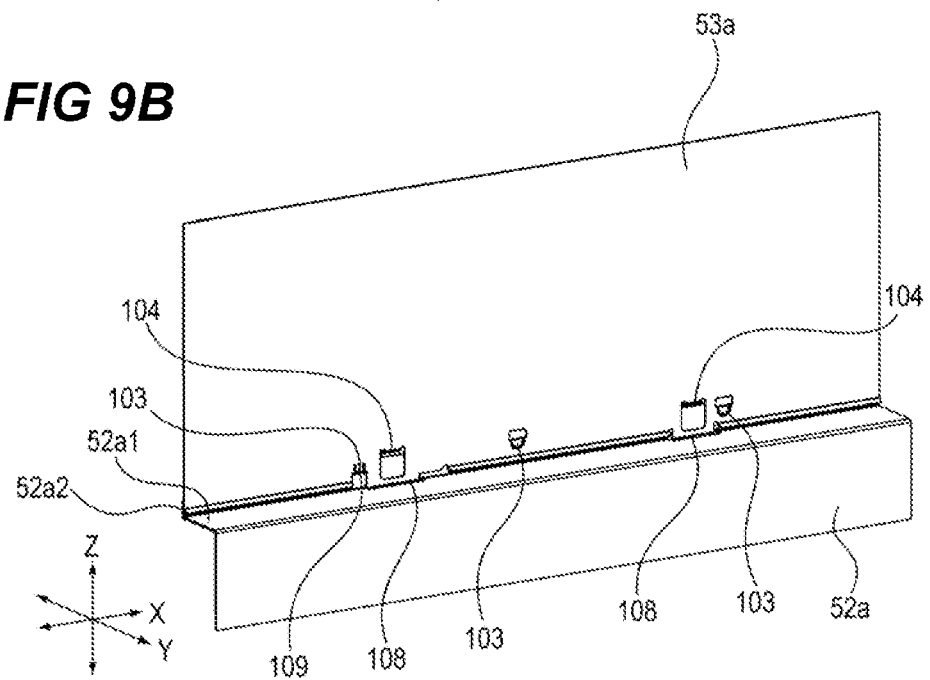
Figure 10A:
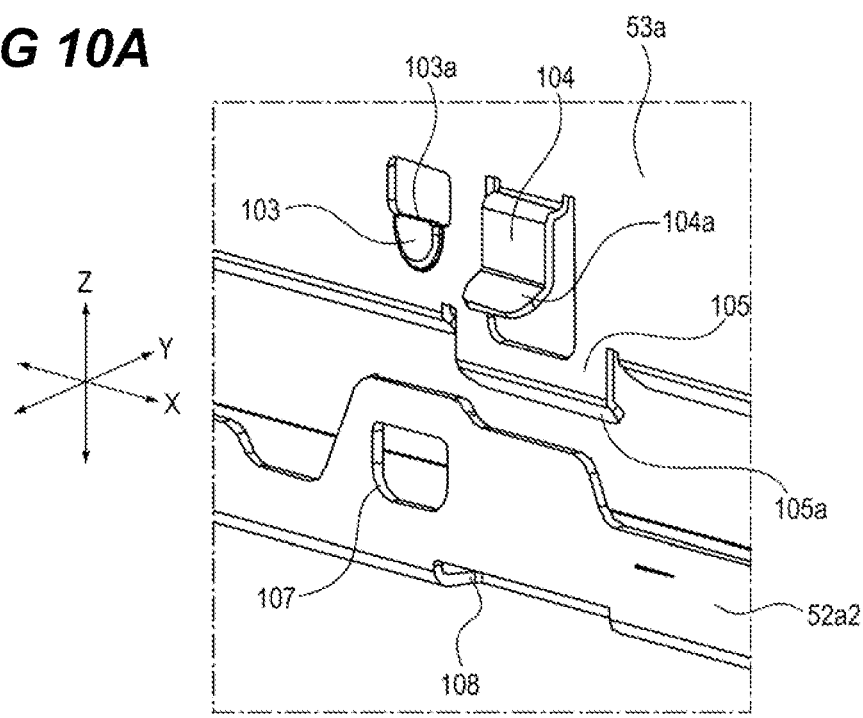
FIG. 10A and FIG. 10B are perspective views of the support portion of the rear side plate.
Figure 10B:
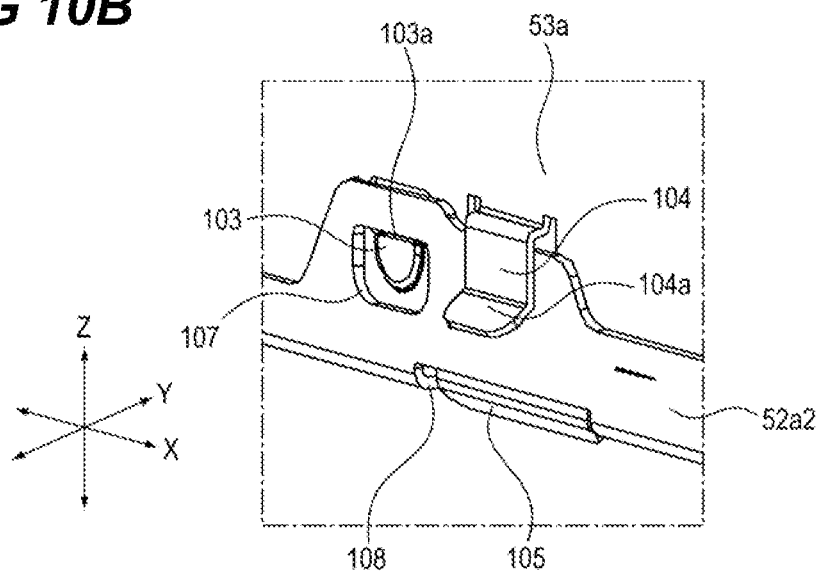
Figure 11A:
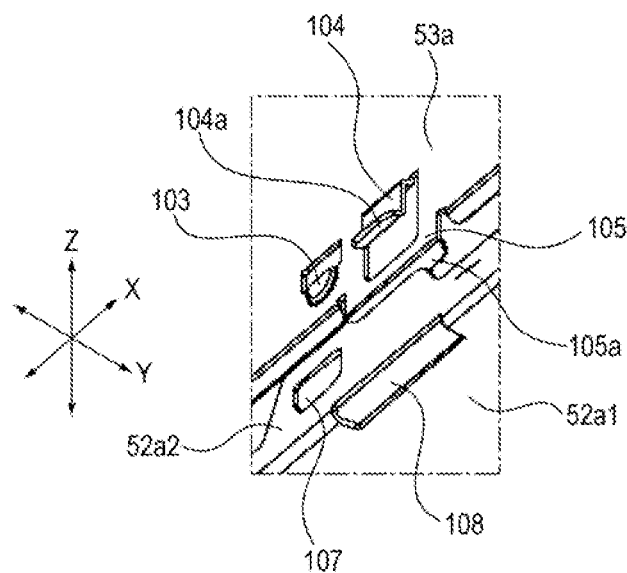
FIG. 11A and FIG. 11B are perspective views of the support portion of the rear side plate.
Figure 11B:
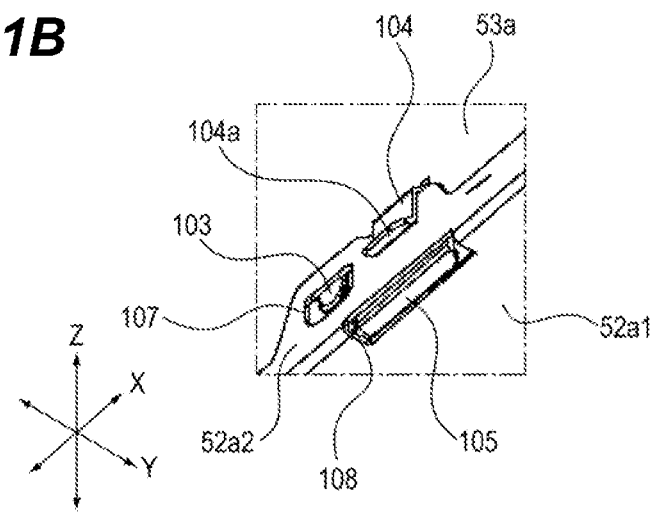

Next, the joint of another metal plate will be described in part. As illustrated in FIG. 6C, welding of the bent-up portion 51w2 of the rear bottom plate 51 and the flat portion 52a of the rear side plate 52 is performed at the welding portion 401, which is located within a radius of 50 mm from the abutment position between the stepped bend 52m of the flat portion 52a and the bent-up portion 51w2. As illustrated in FIG. 8A and FIG. 8B, the welding of the flat portion 52a of the rear side plate 52 and the support portion 53a of the rear side plate 53 is performed at the welding portion 402.

As illustrated in FIG. 25A and FIG. 25B, welding of the flat portion 61w1 of the lower right stay 61 and the flat portion 52a of the rear side plate 52 is performed at the welding portion 403, which is the position of the stepped bend 61a. As illustrated in FIG. 33A to FIG. 34B, the welding of the flat portion 58w2 of the right column 58 and the flat portion 63w2 of the right column 63 is performed at the welding portion 404. Here, the welding portion 404 includes welding parts in a position adjacent to the stepped bend 58c in the direction of insertion (arrow Z direction) of the right column 63 into the right column 58 and in a position adjacent to the stepped bend 58c in the direction of insertion and in a direction (arrow Y direction) perpendicular to the plate thickness direction (arrow X direction) of the flat portion 58w2 of the right column 58.

Note that although this embodiment describes a configuration in which the metal plates constituting the frame 31 are joined by welding, the present invention is not limited thereto, and may also be configured to be joined by screws. In this case, by using an automatic machine to perform screw fastening in the region where the above-mentioned interval between the two metal plates in the plate thickness direction is guaranteed, it is possible to stabilize the screw fastening torque and prevent a decrease in the joining force.

When the joining of the frame 31 is finished, the front side support portion 34b is moved by being slid by the operator in the arrow K2 direction, the rear side support portion 34c is moved by being slid in the arrow K4 direction, and the frame 31 is removed from the jig 34. The frame 31 is thus completed.

The present invention is not limited to or by the foregoing embodiments, rather, various modifications and variations can be made without departing from the spirit and scope of the present invention. Therefore, the following claims are attached to publicize the scope of the present invention.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

What is claimed is:

1. A method for manufacturing a metal frame of an image forming apparatus that is provided with a first support, a second support that is spaced apart from the first support and that supports an image forming unit together with the first support, and a connecting member that connects the first support and the second support, the method comprising:
    a first step of erecting the first support on a base portion, which is a first step of provisionally assembling the first support on a jig that has the base portion and a support portion erected on the base portion;
    a second step of achieving provisional assembly by placing the connecting member on the support portion of the jig and, through engagement between the first support and the connecting member, causing the connecting member to be supported by the first support and the support portion;
    a third step of engaging the connecting member and the second support; and
    a fixing step of fixing the first support and the connecting member and fixing the second support and the connecting member.

2. The method for manufacturing a metal frame of an image forming apparatus according to claim 1,
    wherein the first support has a bottom plate, and a rear side plate that is erected on the bottom plate, and
    wherein the first step includes a step of placing the bottom plate on the base portion of the jig, and a step of provisional assembly through engagement between the bottom plate and the rear side plate.

3. The method for manufacturing a metal frame of an image forming apparatus according to claim 2,
    wherein the rear side plate has a first rear side plate that engages with the bottom plate, and a second rear side plate that is engages with the first rear side plate on the upper side of the first rear side plate in a vertical direction, and
    wherein the first step includes a step of provisional assembly through engagement between the bottom plate and the first rear side plate, and a step of provisional assembly through engagement between the first rear side plate and the second rear side plate.

4. The method for manufacturing a metal frame of an image forming apparatus according to claim 1,
    wherein the second support has a front side plate that supports the image forming unit, and a column that supports the front side plate, and
    wherein the third step includes a step of provisional assembly through engagement between the connecting member and the front side plate, and a step of provisional assembly through engagement between the front side plate and the column.

5. The method for manufacturing a metal frame of an image forming apparatus according to claim 4,
    wherein the column includes a first column that supports one end of the front side plate in the plate thickness direction of the front side plate and a direction perpendicular to the vertical direction, and a second column that supports the other end of the front side plate in the perpendicular direction,
    wherein the second support has a lower front stay that connects the first column and the second column below the front side plate in the vertical direction, and
    wherein the third step includes: a step of provisional assembly through engagement between the connecting member and the front side plate, a step of provisional assembly through engagement between the front side plate and the first column, a step of provisional assembly by placing the lower front stay on the base portion of the jig so as to engage with the first column, and a step of provisional assembly through engagement between the lower front stay and the second column.

6. The method for manufacturing the image forming apparatus according to claim 1,
   wherein, in the fixing step, the first support, the second support, and the connecting member are each welded.

7. The method for manufacturing the image forming apparatus according to claim 1,
   wherein, in the fixing step, the first support, the second support, and the connecting member are each screw-fastened.

\* \* \* \* \*